(12) United States Patent
Hyun et al.

(10) Patent No.: US 12,238,875 B2
(45) Date of Patent: Feb. 25, 2025

(54) DISPLAY DEVICE

(71) Applicant: LG ELECTRONICS INC., Seoul (KR)

(72) Inventors: Jihwan Hyun, Seoul (KR); Kangwook Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/792,844

(22) Filed: Aug. 2, 2024

(65) Prior Publication Data

US 2024/0397641 A1 Nov. 28, 2024

Related U.S. Application Data

(63) Continuation of application No. 18/607,166, filed on Mar. 15, 2024.

(30) Foreign Application Priority Data

Mar. 21, 2023 (KR) .......................... 10-2023-0036473

(51) Int. Cl.
*H05K 5/00* (2006.01)
*H05K 5/02* (2006.01)

(52) U.S. Cl.
CPC ......... *H05K 5/0086* (2013.01); *H05K 5/0226* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 5,107,402 | A * | 4/1992 | Malgouires | F16M 11/2021 361/679.55 |
| 6,504,706 | B2 * | 1/2003 | Stewart | G06F 1/1679 345/169 |
| 6,654,235 | B2 * | 11/2003 | Imsand | G06F 1/1607 D14/335 |
| 6,873,521 | B2 * | 3/2005 | Landry | G06F 3/0338 348/794 |
| 7,002,793 | B2 * | 2/2006 | Imsand | G06F 1/16 361/679.04 |
| 7,804,679 | B2 * | 9/2010 | Pischl | G06F 1/1601 361/679.04 |
| D634,309 | S | 3/2011 | Bendien et al. | |
| 8,390,997 | B1 * | 3/2013 | Dominy | G06F 1/1637 361/679.28 |
| 10,389,398 | B1 * | 8/2019 | Garcia | A45C 3/02 |
| 10,613,590 | B1 * | 4/2020 | Lee | H05K 5/023 |
| 10,895,345 | B2 * | 1/2021 | Lederer | F16M 13/00 |

(Continued)

FOREIGN PATENT DOCUMENTS

| | | |
|---|---|---|
| KR | 10-2006-0097961 | 9/2006 |
| KR | 10-2007-0082793 | 8/2007 |
| KR | 10-2007-0089590 | 8/2007 |

*Primary Examiner* — Xanthia C Relford
(74) *Attorney, Agent, or Firm* — LEE, HONG, DEGERMAN, KANG & WAIMEY

(57) ABSTRACT

A display device is disclosed. The display device includes: a display module including a display panel; an arm having an upper arm that is coupled to a rear of the display module and a lower arm that is hinge-connected to the upper arm; a bottom case to which the lower arm is pivotally connected; and a top case hinge-connected to the bottom case.

22 Claims, 58 Drawing Sheets

(56) References Cited

U.S. PATENT DOCUMENTS

| | | |
|---|---|---|
| 2011/0092294 A1 | 4/2011 | Mercier |
| 2016/0066452 A1* | 3/2016 | Music .................... A45C 9/00 |
| | | 206/742 |
| 2022/0053899 A1 | 2/2022 | Valliere |

* cited by examiner

DISPLAY DEVICE

CROSS-REFERENCE TO RELATED APPLICATIONS

This application is a continuation of U.S. patent application Ser. No. 18/607,166, filed on Mar. 15, 2024, which claims the benefit of earlier filing date and right of priority to Korean Patent Application No. 10-2023-0036473, filed on Mar. 21, 2023, the contents of which are all hereby incorporated by reference herein in their entirety.

BACKGROUND

Technical Field

The present disclosure relates to a display device.

Description of the Related Art

With the development of information society, there has been a growing demand for various types of display devices. In order to meet such demand, various display devices, such as a liquid crystal display (LCD), a plasma display panel (PDP), an electro luminescent display (ELD), a vacuum fluorescent display (VFD), an organic light emitting diode (OLED), and the like, have been developed and used.

Among them, an LCD panel includes a TFT substrate and a color substrate that face each other with a liquid crystal layer interposed therebetween, so as to display an image using light provided from a backlight unit. Meanwhile, an OLED panel can display an image by depositing a self-luminescent organic layer on a substrate having a transparent electrode formed thereon.

Recently, a lot of research on a display device for outdoor uses has been carried out. In addition, various research has been conducted on a structure that can improve the storage and portability of display devices.

SUMMARY

It is an objective of the present disclosure to solve the above and other problems.

It is another objective of the present disclosure to provide a structure that can facilitate the storage and portability of a display device.

It is yet another objective of the present disclosure to provide a structure that can improve the durability and rigidity of a portable display device.

It is yet another objective of the present disclosure to provide a heat dissipation structure for a portable display device.

It is yet another objective of the present disclosure to provide a shock absorbing structure for a portable display device.

It is yet another objective of the present disclosure to provide a wiring structure for a portable display device.

According to an aspect of the subject matter described in this application, a display device includes: a display module including a display panel; an arm having an upper arm that is coupled to a rear of the display module and a lower arm that is hinge-connected to the upper arm; a bottom case to which the lower arm is pivotally connected; and a top case hinge-connected to the bottom case.

A display device according to the present disclosure has the following effects.

According to at least one of the embodiments of the present disclosure, it is possible to provide a structure capable of facilitating the storage and portability of a display device.

According to at least one of the embodiments of the present disclosure, it is possible to provide a structure capable of improving the durability and rigidity of a portable display device.

According to at least one of the embodiments of the present disclosure, it is possible to provide a heat dissipation structure for a portable display device.

According to at least one of the embodiments of the present disclosure, it is possible to provide a shock absorbing structure for a portable display device.

According to at least one of the embodiments of the present disclosure, it is possible to provide a wiring structure for a portable display device.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

DETAILED DESCRIPTION

Figure 1:
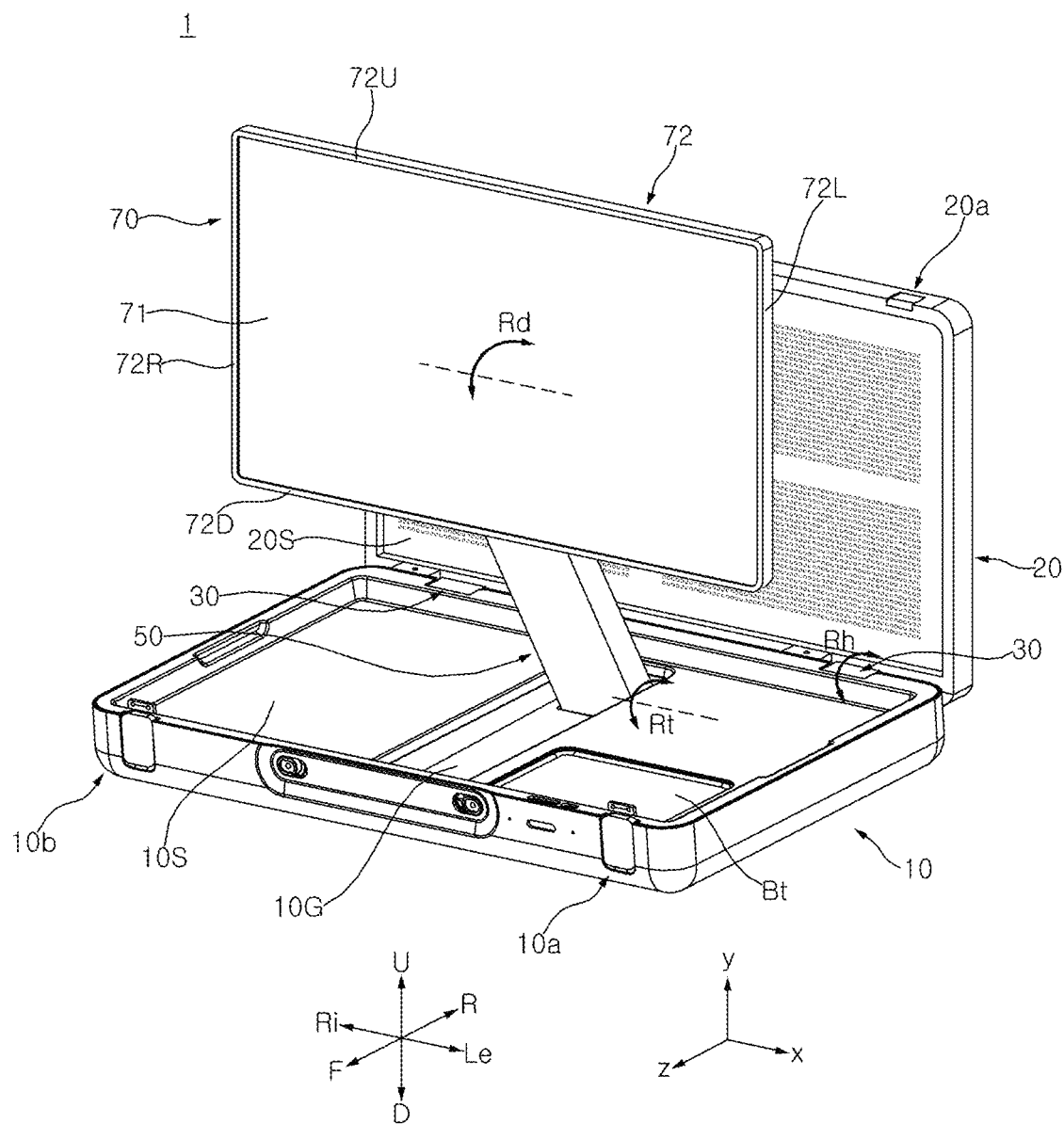
FIGS. 1 to 58 illustrate examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, a suffix such as "module" and "unit" may be used to refer to elements or components. Use of such a suffix herein is merely intended to facilitate description of the specification, and the suffix itself is not intended to give any special meaning or function.

In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

It will be understood that although the terms "first", "second", etc. may be used herein to describe various elements, these elements should not be limited by these terms. These terms are only used to distinguish one element from another.

It will be understood that when a component is referred to as being "connected to" or "coupled to" another component, it may be directly connected to or coupled to another component, or intervening components may be present. In contrast, when a component is referred to as being "directly connected to" or "directly coupled to" another component, there are no intervening components present.

As used herein, a singular representation is intended to include a plural representation unless the context clearly indicates otherwise.

It will be understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The directions "up (U)", "down (D)", "left (Le)", "right (Ri)", "front (F)", and "rear (R)" shown in the drawings are only for the convenience of description, and the technical concept disclosed in the specification is not limited by these directions.

A display panel described herein may be an LCD panel or an OLED panel, but a display panel applicable to the present disclosure is not limited thereto.

Figure 2:
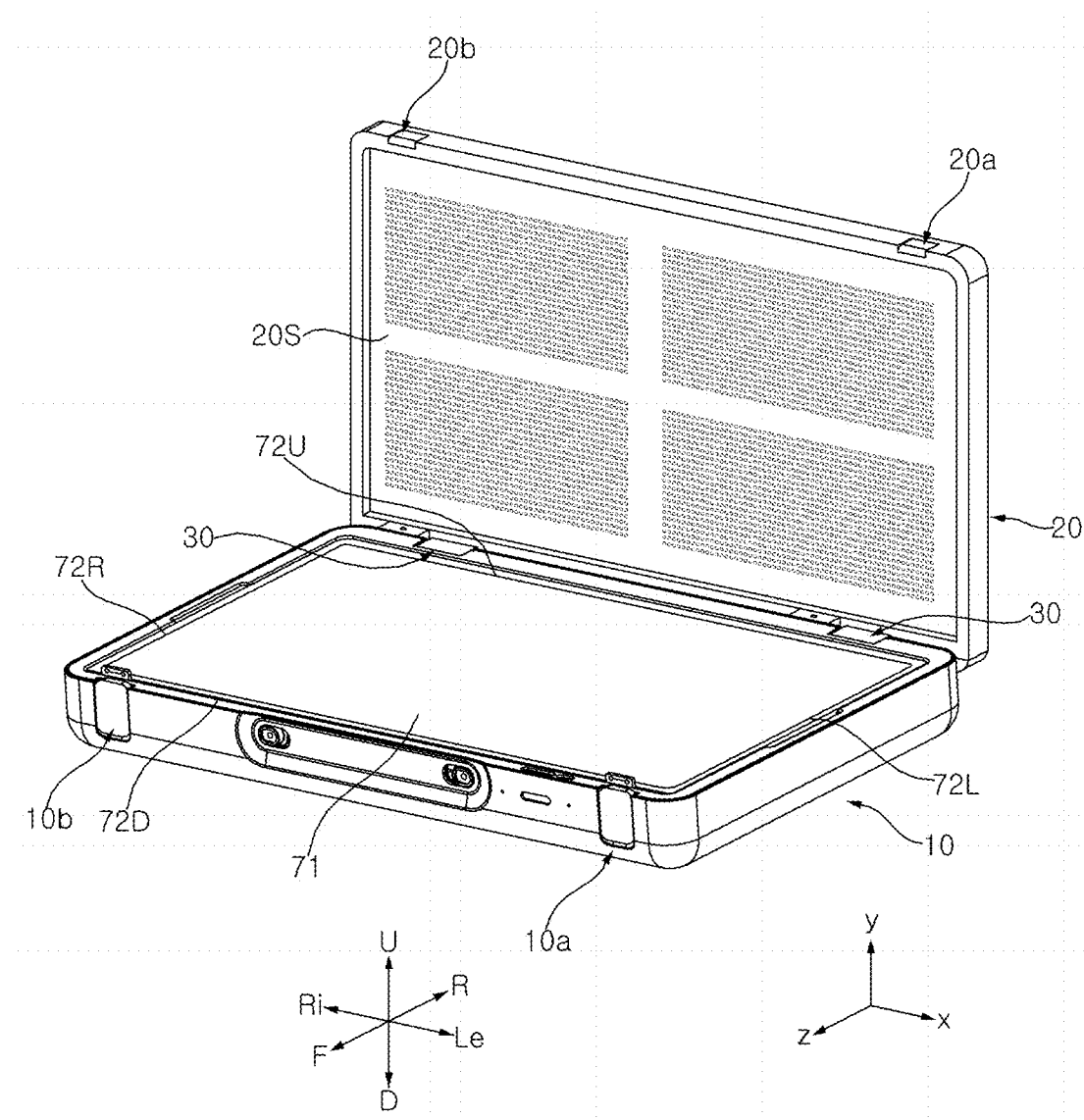

Referring to FIGS. 1 and 2, a display device 1 may include a base 10, a cover 20, a hinge 30, an arm 50, and a display 70.

The base 10 may have a generally flat box shape. A seating part 10S may be formed by being recessed downward from an upper surface of the base 10. The size of the seating part 10S may correspond to the size of the display 70. For example, the base 10 may include a plastic material. The base 10 may be referred to as a lower body 10, a lower case 10, a lower housing 10, a bottom box 10, a bottom cabinet 10, or a bottom case 10.

The cover 20 may have a generally flat box shape. The cover 20 may have an appearance similar to that of the base 10. A depressed part 20S may be formed on one surface of the cover 20, and may be opposite the seating part 10S with respect to the display 70. For example, the cover 20 may include a plastic material. The cover 20 may be referred to as an upper body 20, an upper case 20, an upper housing 20, a top box 20, a top cabinet 20, or a top case 20.

One side (or a first side) of the hinge 30 may be adjacent to or positioned on a first side of the base 10, may be coupled to the base 10, and may rotate on a central axis of the hinge 30. The other side (or a second side) of the hinge 30 may be adjacent to or positioned on a first side of the cover 20, may be coupled to the cover 20, and may rotate on the central axis of the hinge 30. The first side of the base 10 may be one long side of the base 10, and the first side of the cover 20 may be one long side of the cover 20 that is adjacent to the one long side of the base 10. For example, a plurality of hinges 30 may be spaced apart from each other along the one long sides. Two hinges 30 may be provided.

The arm 50 may extend in a direction intersecting the base 10. The arm 50 may have a generally square lumber shape. A groove 10G may be recessed downward from the seating part 10S, and may have a shape corresponding to the arm 50. One end (or a first end) of the arm 50 may be positioned on the groove 10G while being adjacent to one end of the groove 10G. The arm 50 may be coupled to the base 10 to be rotatable on a first axis that is adjacent to the one end of the arm 50 (see Rt of FIG. 1). The first axis may be parallel to a left-and-right direction. The other end (or a second end) of the arm 50 may be coupled to a central portion of a rear surface of the display 70. The display 70 may be coupled to the arm 50 to be rotatable on a second axis that is adjacent to the other end of the arm 50 (see Rd of FIG. 1). The second axis may be parallel to the first axis. The arm 50 may be referred to as a pole 50, a bar 50, or a lever 50.

The display 70 may include a display panel 71 and a side cover 72. The display panel 71 may define a front surface or side of the display 70, and may display an image. The side cover 72 may extend along the perimeter of the display panel 71, and may cover a side surface (i.e., the sides) of the display panel 71. A first part 72U may define an upper side of the side cover 72, and a second part 72D may define a lower side of the side cover 72. A third part 72L may define a left side of the side cover 72, and a fourth part 72R may define a right side of the side cover 72. The display 70 may be referred to as a display unit 70 or a display module 70.

For example, a user may pivot the arm 50 about the first axis. As the arm 50 pivots, the second end of the arm 50 may be raised in position. The user may rotate the display 70 about the second axis such that the display panel 71 faces forward. The user may adjust an angle of the arm 50 with respect to the base 10 and an angle of the display 70 with respect to the arm 50.

As another example, a user may pivot the arm 50 about the first axis. When the arm 50 reverse pivots, the second end of the arm 50 may be lowered in position. In addition, the arm 50 may be seated on the groove 10G. The user may rotate the display 70 about the second axis such that the display panel 71 faces upward.

Figure 3:
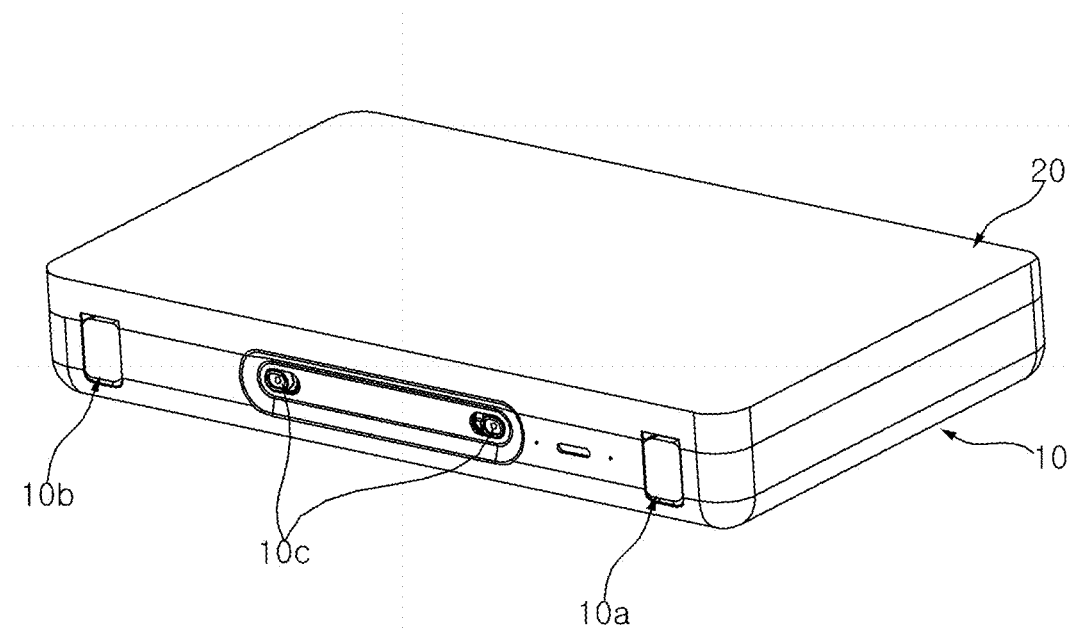

Referring to FIGS. 2 and 3, a user may pivot the cover 20 about the central axis of the hinge 30 such that the cover 20 is laid or placed on top of the base 10. The display panel 71 may be sandwiched between the base 10 and the cover 20.

A lock 10a, 10b of the base 10 may be provided on a second side of the base 10, which is opposite the first side of the base 10 that is adjacent to the hinge 30. The lock 10a, 10b may be referred to as a lock assembly 10a, 10b or a locking unit 10a, 10b. A recessed portion 20a, 20b of the cover 20 may be provided on a second side of the cover 20, which is opposite the first side of the cover 20 that is adjacent to the hinge 30. After laying the cover 20 on top of the base 10, the user may snap the lock 10a, 10b into the recessed portion 20a, 20b to make it locked in place. This allows the user to carry the display 70 with the display 70 being stored in the base 10 and the cover 20. In addition, a handle (not shown) designed to be held by a hand of the user may be mounted to a button 10c formed on one side of the base 10.

Figure 4:
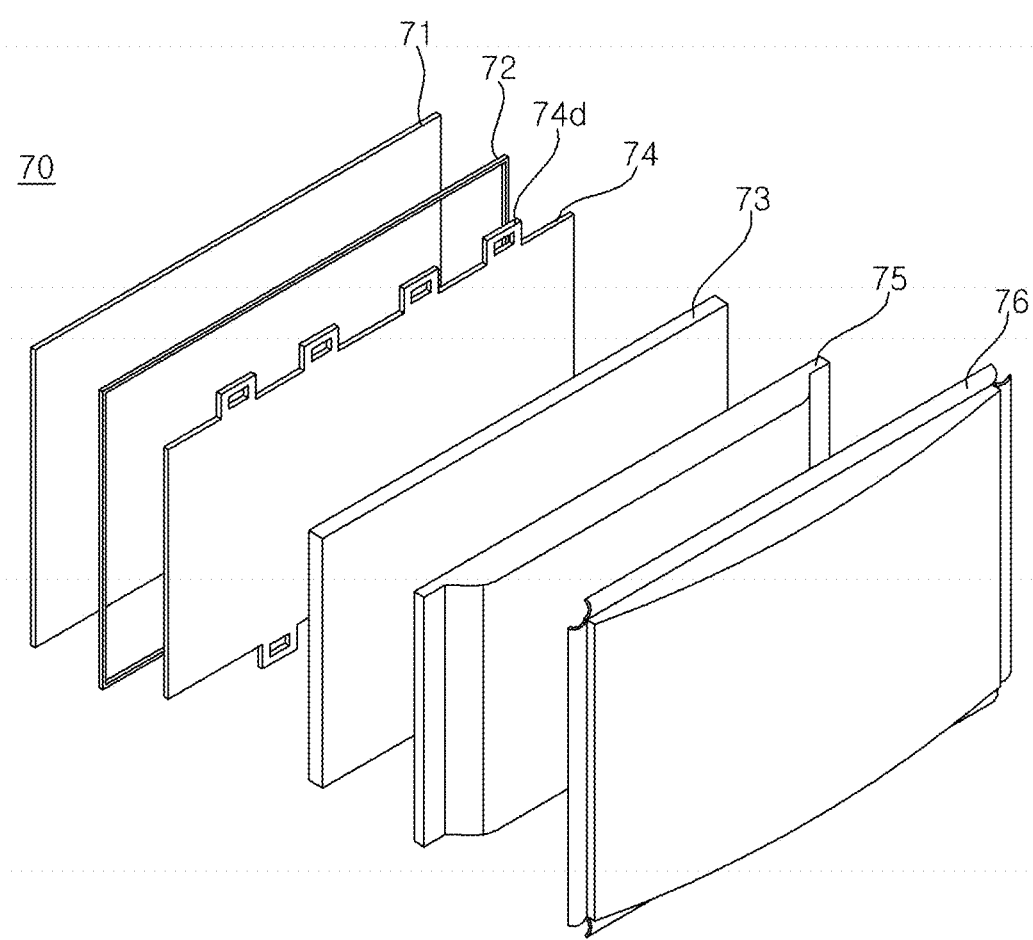

Referring to FIG. 4, the display 70 may include a display panel 71, a side cover 72, a backlight unit (73, 74), a frame 75, and a back cover 76.

The display panel 71 may define a front surface or side of the display 70, and may display an image. The display panel 71 may display an image by outputting red, green, or blue (RGB) for each pixel by a plurality of pixels in accordance with timing. The display panel 71 may be divided into an active area in which an image is displayed and a de-active area in which no image is displayed. The display panel 71 may include a front substrate and a rear substrate that are disposed opposite each other with a liquid crystal layer interposed therebetween. The display panel 71 may be referred to as an LCD panel.

The front substrate may include a plurality of pixels, each of which consists of red, green, and blue subpixels. The front substrate may output light corresponding to a color of red, green, or blue in response to a control signal.

The rear substrate may include switching elements. The rear substrate may switch a pixel electrode. For example, the pixel electrode may change the molecular arrangement of a liquid crystal layer in response to a control signal input from the outside. The liquid crystal layer may include liquid crystal molecules. The arrangement of liquid crystal molecules may be changed according to a voltage difference generated between the pixel electrode and a common electrode. The liquid crystal layer may transmit light provided from the backlight unit (73, 74) to the front substrate or block the light.

The side cover 72 may surround the perimeter of the display panel 71, and may cover a side surface of the display panel 71. The side cover 72 may be coupled to the display panel 71 or may support the display panel 71. The side cover 72 may be referred to as a guide panel 72, a side frame 72, or a middle cabinet 72.

The backlight unit (73, 74) may be disposed at the rear of the display panel 71. The backlight unit (73, 74) may include light sources. The backlight unit (73, 74) may be coupled to the frame 75 from the front of the frame 75. The backlight unit (73, 74) may be driven by a full driving scheme or a partial driving scheme such as local dimming, impulsive, etc. The backlight unit (73, 74) may include an optical sheet 74 and an optical layer 73.

The optical sheet 74 may allow light of the light source to be evenly transmitted to the display panel 71. The optical sheet 74 may consist of a plurality of layers. For example, the optical sheet 74 may include a prism sheet, a diffusion sheet, or the like. Meanwhile, a coupling portion 74d of the optical sheet 74 may be coupled to the frame 75 and/or the back cover 76.

The frame 75 may be disposed at the rear of the backlight unit (73, 74), and may support the components of the display unit 70. An edge of the frame 75 may be fixed to the side cover 72. For example, components such as the backlight unit (73, 74) and a printed circuit board (PCB) on which a plurality of electronic components are disposed may be coupled to the frame 75. For example, the frame 75 may include a metal material. The frame 75 may be referred to as a main frame 75, a module cover 75, or a cover bottom 75.

The back cover 76 may cover the rear of the frame 75. The back cover 76 may be coupled to the frame 75. For example, the back cover 76 may include a metal or plastic material.

Figure 5:
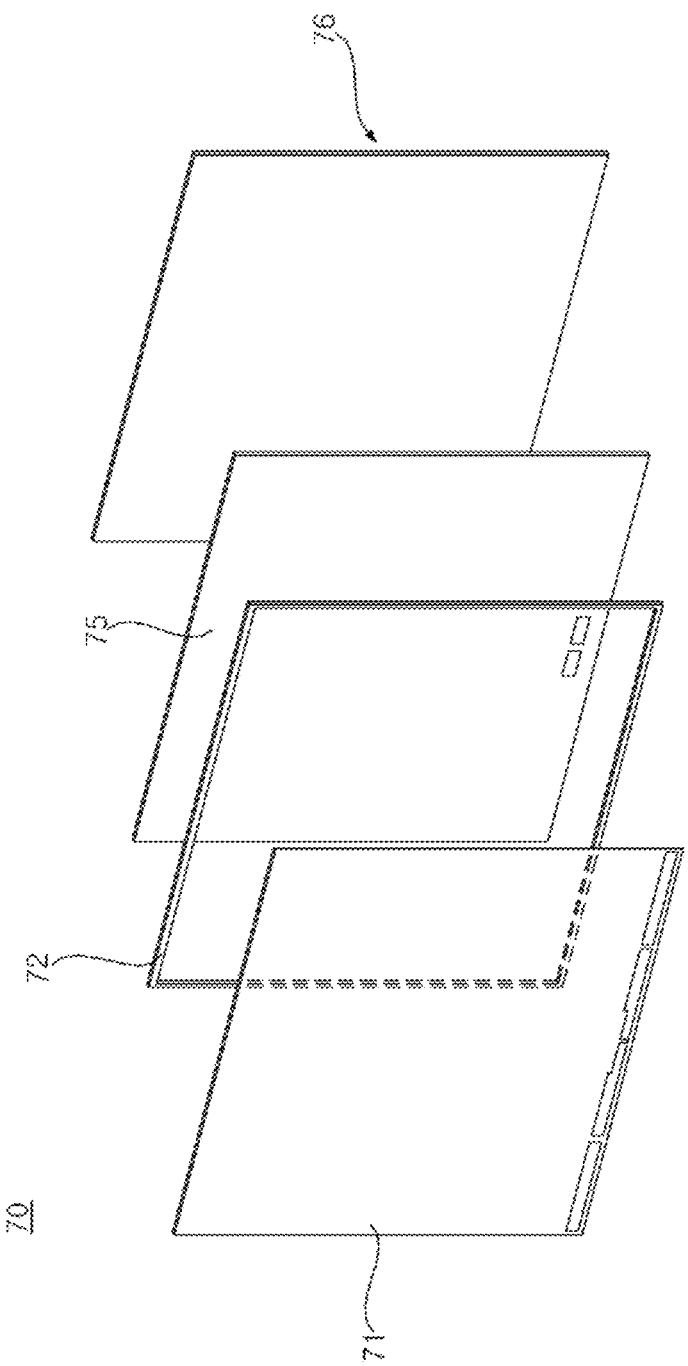

Referring to FIG. 5, the display 70 may include a display panel 71, a side cover 72, a frame 75, and a back cover 76.

The display panel 71 may define a front surface or side of the display 70, and may display an image. The display panel 71 may divide an image into a plurality of pixels to output the image while controlling color, brightness, and chroma of each pixel. The display panel 71 may be divided into an active area in which an image is displayed and a de-active area in which no image is displayed. The display panel 71 may generate light corresponding to a color of red, green, or blue in response to a control signal. The display panel 71 may be referred to as an OLED panel.

The side cover 72 may surround the perimeter of the display panel 71, and may cover a side surface of the display panel 71. The side cover 72 may be coupled to the display panel 71 or may support the display panel 71. The side cover 72 may be referred to as a guide panel 72, a side frame 72, or a middle cabinet 72.

The frame 75 may be disposed at the rear of the display panel 71, and the display panel 71 may be coupled to the frame 75. An edge of the frame 75 may be fixed to the side cover 72. Electronic components may be mounted on the frame 75. For example, the frame 75 may include a metal material. The frame 75 may be referred to as a main frame 75, a module cover 75, a cover bottom 75, or a panel frame 75.

The back cover 76 may cover the rear of the frame 75. The back cover 76 may be coupled to the frame 75. For example, the back cover 76 may include a metal or plastic material.

Figure 6:
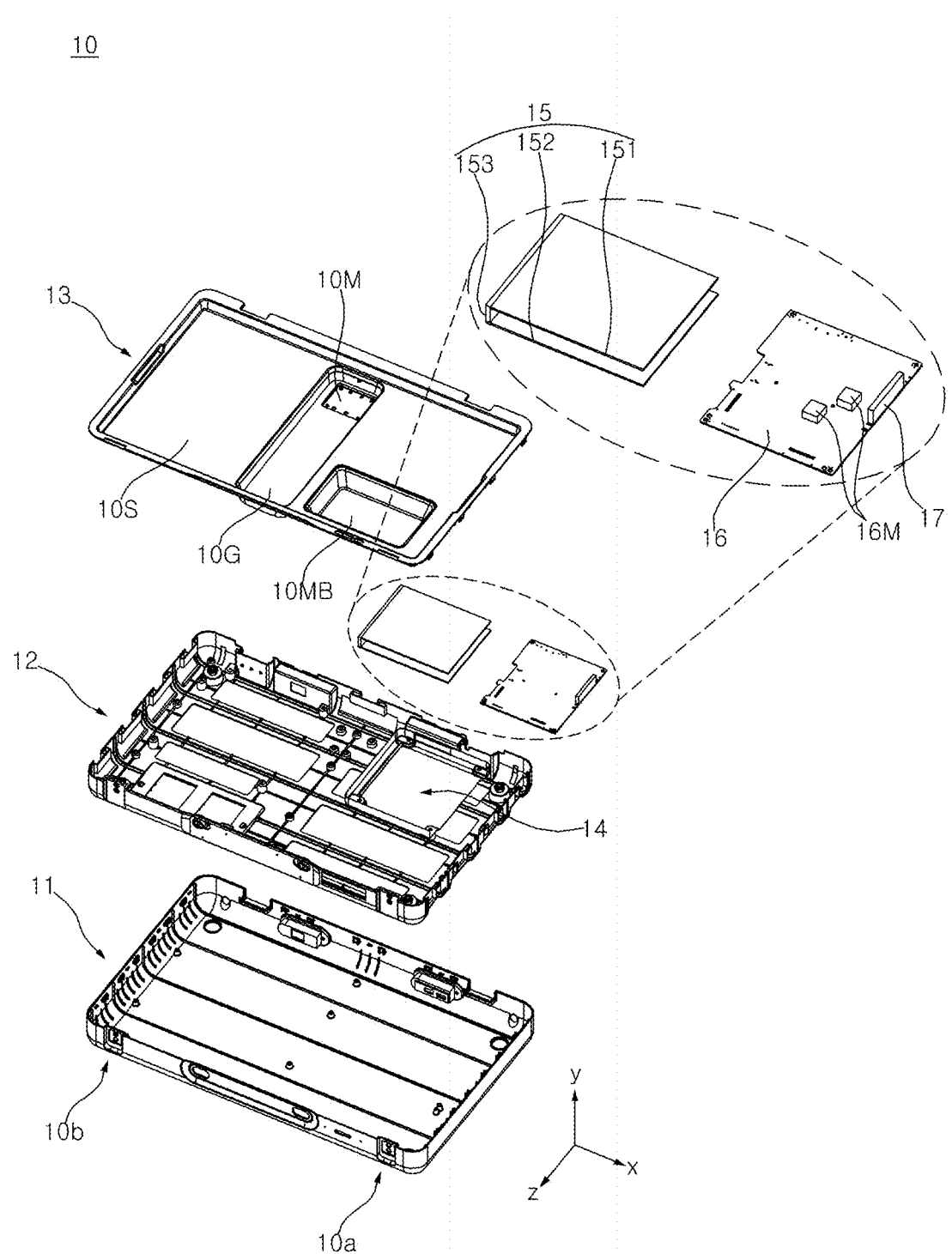

Referring to FIG. 6, the base 10 may include a bottom 11, a frame 12, a top 13, a jacket 15, and a substrate 16.

The bottom 11 may define a lower surface of the base 10, and may have a generally square tray shape. The bottom 11 may be referred to as an outer shell 11, an outer case 11, a bottom part 11, a housing 11, or a tray 11. The lock 10a, 10b may be provided on a side surface of the bottom 11.

The frame 12 may define a body structure of the base 10. The frame 12 may be disposed on the bottom 11, and may be coupled to the bottom 11.

The top 13 may define an upper surface of the base 10, and may have a generally plate shape. The top 13 may be opposite the bottom 11 with respect to the frame 12, and may cover the frame 12. The top 13 may be detachably coupled to the frame 12 and/or the bottom 11. The top 13 may be referred to as a top part 13, a cap 13, a top case 13, or a top plate 13.

The seating part 10S and the groove 10G may be formed on an upper surface of the top 13. A depressed portion 10M may be adjacent to one end of the groove 10G, and may be recessed downward from an upper surface of the groove 10G. One end of the arm 50 (see FIG. 1) may be pivotably coupled to the depressed portion 10M.

For example, a mounting portion 10 MB may be formed by being recessed downward from the upper surface of the top 13, and a battery Bt (see FIG. 1) may be detachably mounted to the mounting portion 10 MB. The battery Bt may provide power to the display 70 (see FIG. 1), and may be rechargeable. As another example, the battery Bt may be embedded between the frame 12 and the top 13.

The jacket 15 and the substrate 16 may be disposed between the frame 12 and the top 13, and may be coupled to the frame 12. At least one element 16M may be mounted on the substrate 16. The element 16M may be an electronic component that generates heat when operated. The element 16M may be referred to as a heating element 16M. For example, the element 16M may be an IC chip or a System On Chip (SOC).

Figure 7:
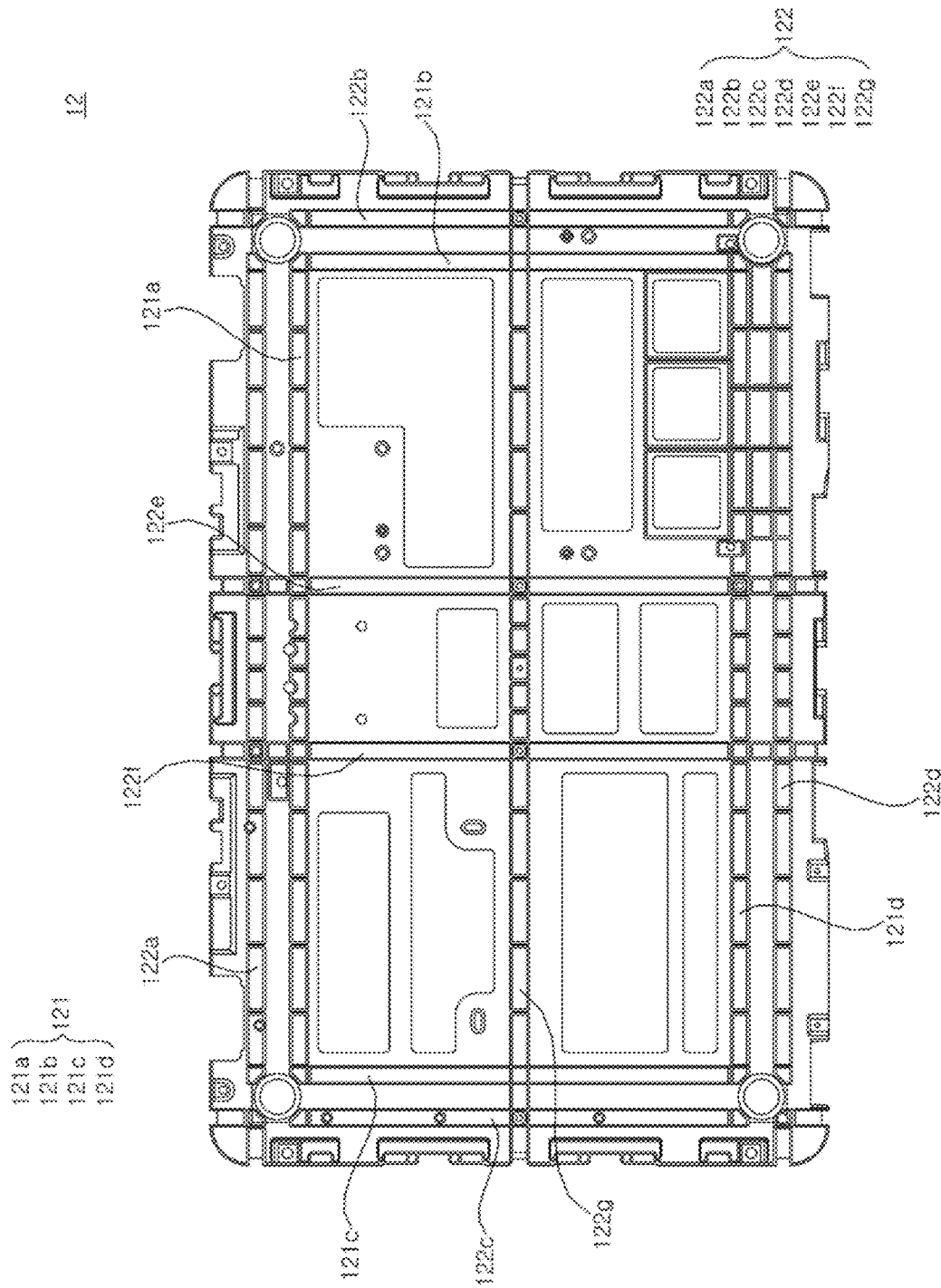

Referring to FIG. 7, the frame 12 may be made of a high strength and ultra-light material. For example, the frame 12 may be formed by magnesium die casting. The frame 12 may include a first beam part 121 and a second beam part 122. The frame 12 may be referred to as a bottom frame 12, a box frame 12, a bottom box frame 12, or a bottom case frame 12.

The first beam part 121 may define an inner beam 121. The inner beam 121 may include a first part 121a, a second part 121b, a third part 121c, and a fourth part 121d. The first part 121a and the fourth part 121d may face each other. The second part 121b and the third part 121c may face each other. The first part 121a may connect one end (or a first end) of the second part 121b and one end (or a first end) of the third part 121c, and the fourth part 121d may connect the other end (or a second end) of the second part 121b and the other end (or a second end) of the third part 121c. For example, the first part 121a, the second part 121b, the third part 121c, and/or the fourth part 121d may have the same cross-sectional shape.

The second beam part 122 may define an outer beam (122a, 122b, 122c, 122d) and a cross beam (122e, 122f, 122g). The outer beam (122a, 122b, 122c, 122d) may include a first part 122a, a second part 122b, a third part 122c, and a fourth part 122d. The first part 122a and the fourth part 122d may face each other. The second part 122b and the third part 122c may face each other. The first part 122a may connect one end (or a first end) of the second part 122b and one end (or a first end) of the third part 122c, and the fourth part 122d may connect the other end (or a second end) of the second part 122b and the other end (or a second end) of the third part 122c. For example, the first part 122a, the second part 122b, the third part 122c, and/or the fourth part 122d may have the same cross-sectional shape.

The cross beam (122e, 122f, 122g) may include vertical parts 122e and 122f and a horizontal part 122g. The horizontal part 122g may be parallel to the first part 121a and/or the fourth part 121d of the inner beam 121 between the first part 121a and the fourth part 121d. The horizontal part 122g may intersect the second part 121b and the third part 121c of the inner beam 121, and may intersect the second part 122b and the third part 122c of the outer beam (122a, 122b, 122c, 122d).

The vertical parts 122e and 122f may include a first vertical part 122e and a second vertical part 122f. The first vertical part 122e may be positioned between the second part 121b and the third part 121c of the inner beam 121, and may intersect the first part 121a and/or the fourth part 121d of the inner beam 121. The first vertical part 122e may intersect the first part 122a and/or the fourth part 122d of the outer beam (122a, 122b, 122c, 122d). The second vertical part 122f may be positioned between the second part 121b and the third part 121c of the inner beam 121, and may intersect the first part 121a and/or the fourth part 121d of the inner beam 121. The second vertical part 122f may intersect the first part 122a and/or the fourth part 122d of the outer beam (122a, 122b, 122c, 122d).

Figure 8:
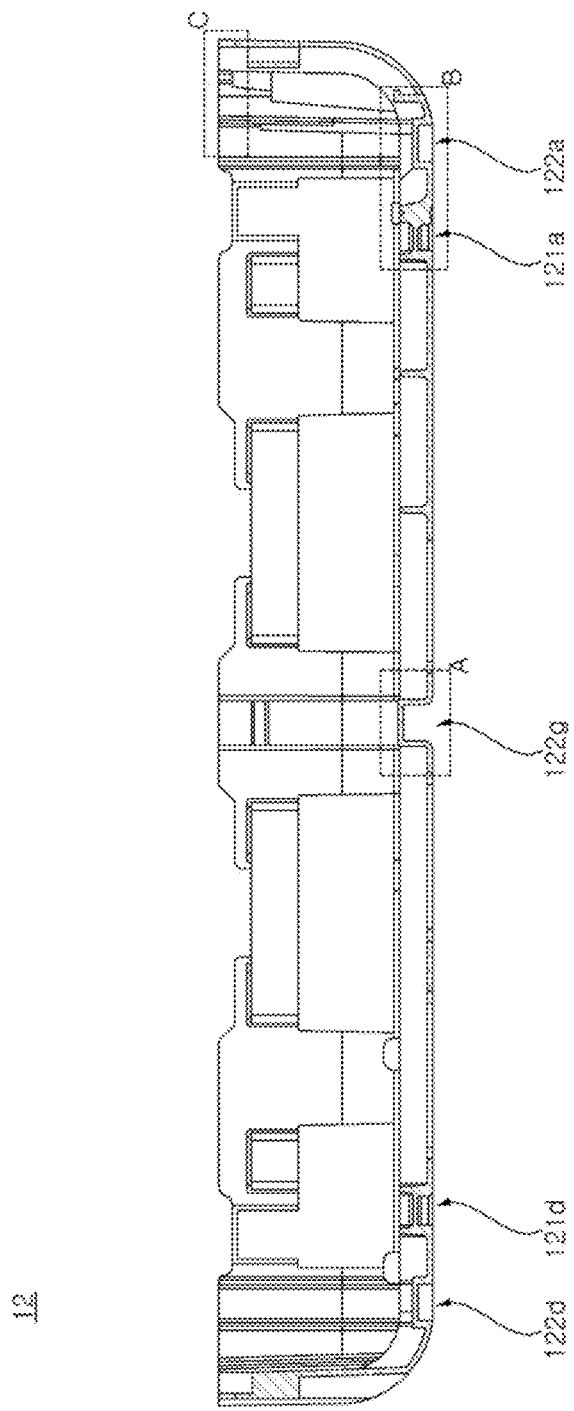
Figure 9:
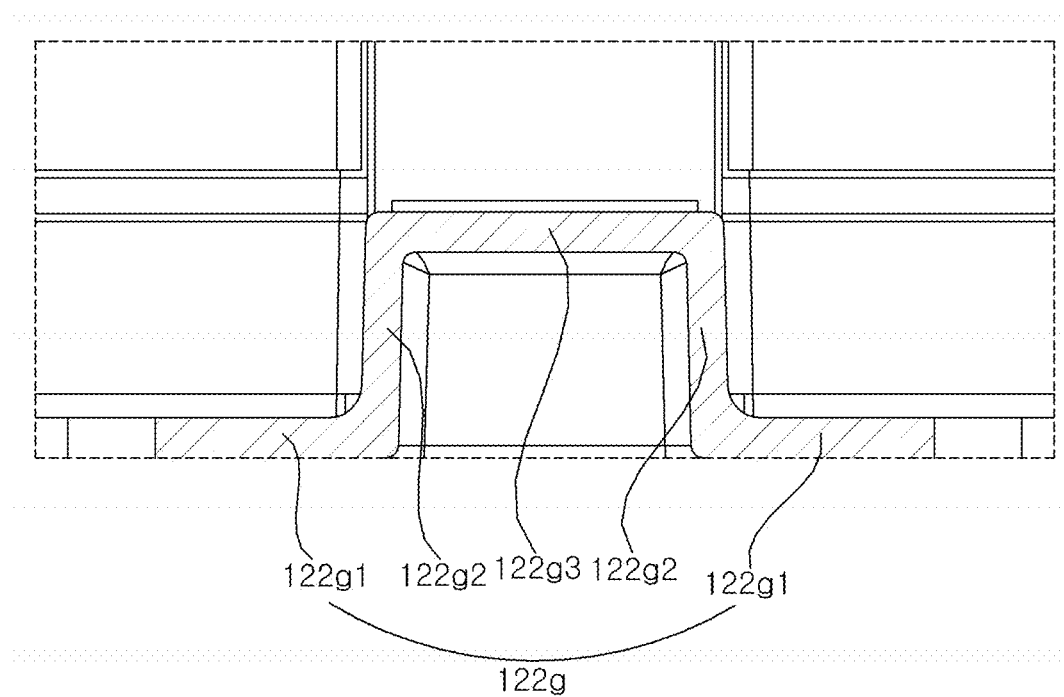

Referring to FIGS. 8 and 9, the horizontal part 122g of the cross beam (122e, 122f, 122g) may include a bottom part 122g1, a side part 122g2, and a top part 122g3. The bottom part 122g1 may define a bottom surface of the horizontal part 122g of the cross beam (122e, 122f, 122g).

The side part 122g2 may be bent and extend from the bottom part 122g1. The top part 122g3 may be bent and extend from the side part 122g2. For example, the bottom part 122g1, the top part 122g3, and the side part 122g2 may form a generally U-shape.

Accordingly, the rigidity of the frame 12 can be increased.

Figure 10:
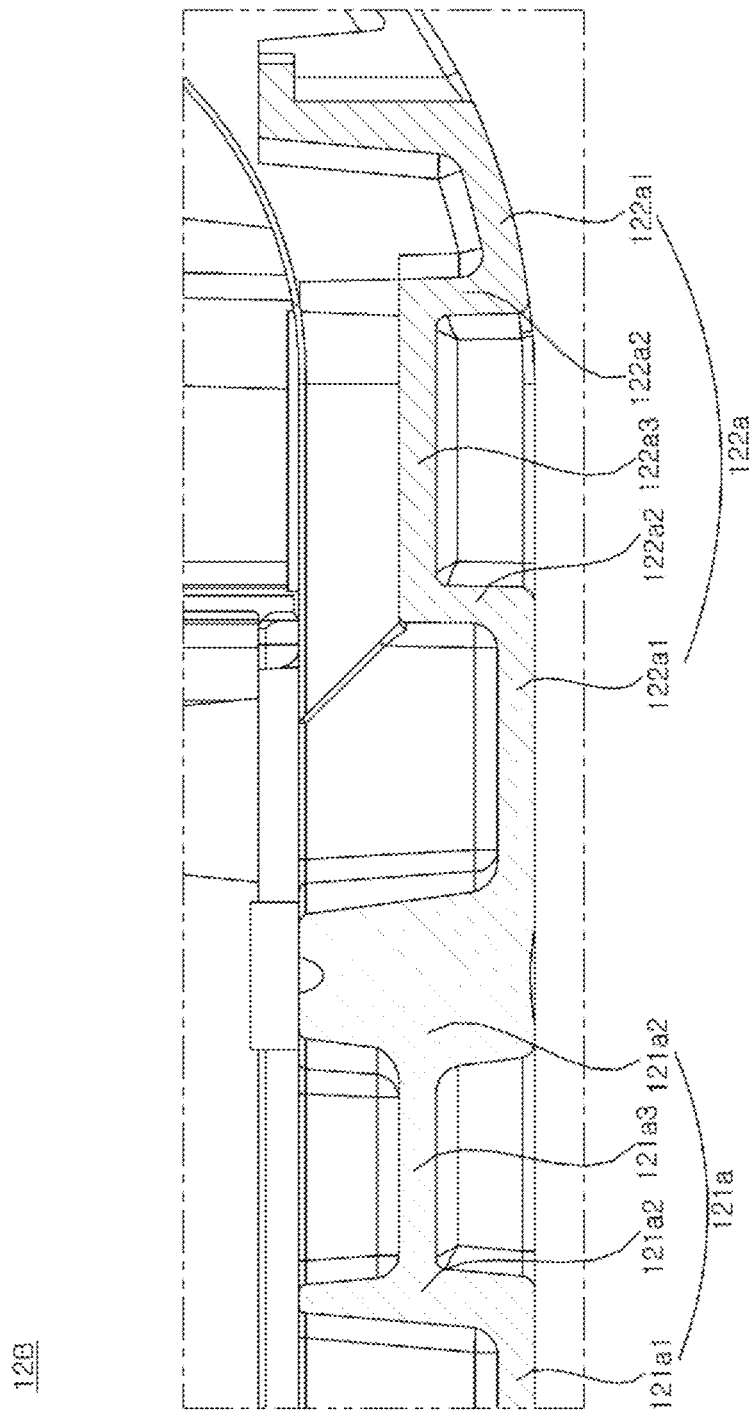
Figure 11:
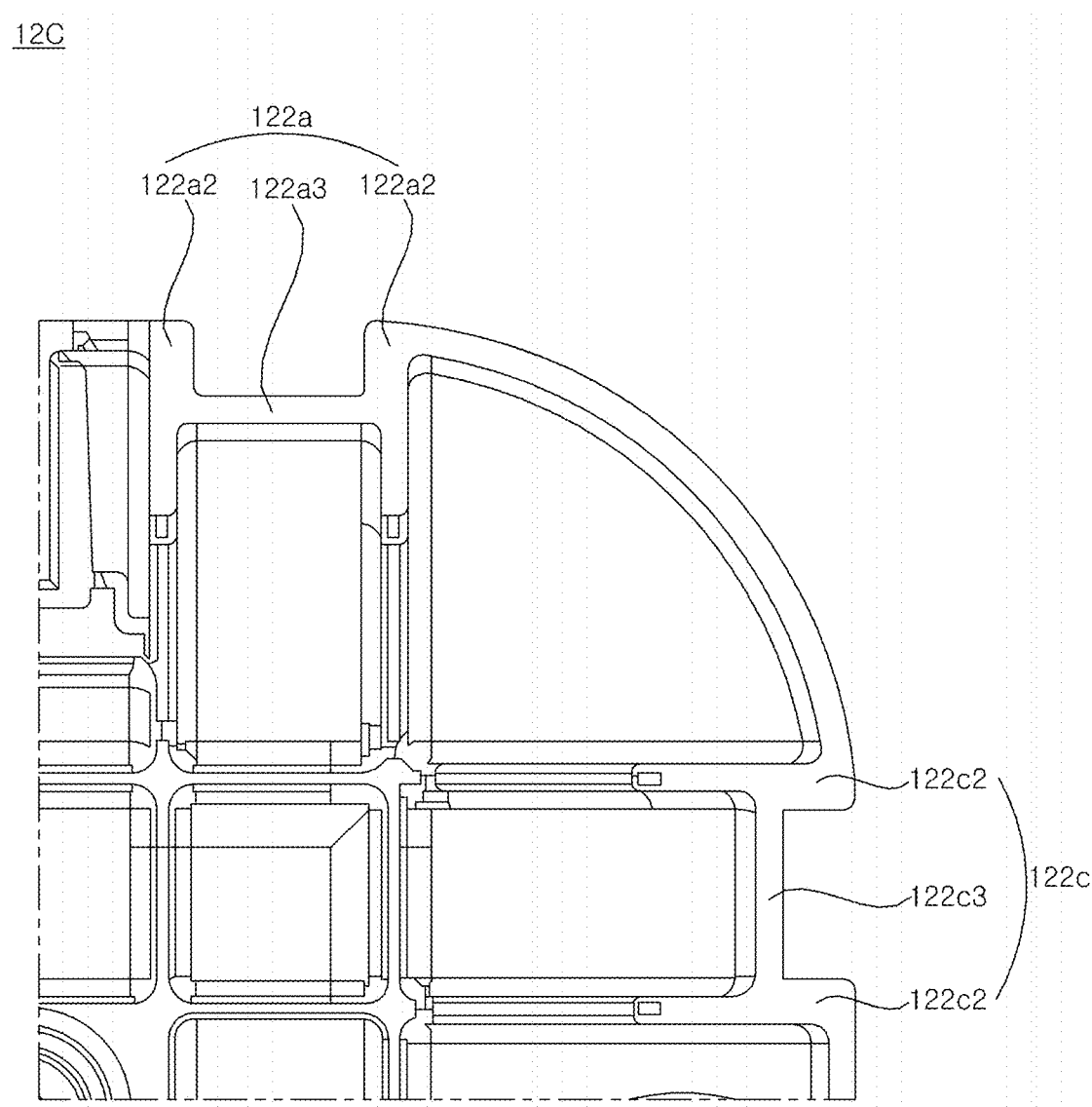

Referring to FIGS. 10 and 11 together with FIGS. 7 and 8, the first part 121a of the inner beam 121 may include a bottom part 121a1, a side part 121a2, and a top part 121a3. The bottom part 121al may define a bottom surface of the first part 121a of the inner beam 121.

The side part 121a2 may be bent and extend from the bottom part 121al. The top part 121a3 may be bent and extend from the side part 121a2. For example, the top part 121a3 and the side part 121a2 may form a generally H-shape.

The first part 122a of the outer beam (122a, 122b, 122c, 122d) of the second beam part 122 may include a bottom part 122a1, a side part 122a2, and a top part 122a3. The bottom part 122al may define a bottom surface of the first part 122a of the outer beam (122a, 122b, 122c, 122d).

The side part 122a2 may be bent and extend from the bottom part 122a1. The top part 122a3 may be bent and extend from the side part 122a2. For example, the bottom part 122a1, the top part 122a3, and the side part 122a2 may form a generally U-shape.

Accordingly, the rigidity of the frame 12 can be increased.

Referring to FIG. 11 and FIG. 7, the first part 122a of the outer beam (122a, 122b, 122c, 122d) may intersect the third part 122c of the outer beam (122a, 122b, 122c, 122d). For example, the first part 122a may have a generally H-shaped cross section, and the third part 122c may have a generally H-shaped cross section. Accordingly, the corner rigidity of the frame 12 can be increased.

The first part 122a of the outer beam (122a, 122b, 122c, 122d) may intersect the second part 122b of the outer beam (122a, 122b, 122c, 122d). For example, the first part 122a may have a generally H-shaped cross section, and the second part 122b may have a generally H-shaped cross section. Accordingly, the corner rigidity of the frame 12 can be increased.

The fourth part 122d of the outer beam (122a, 122b, 122c, 122d) may intersect the third part 122c of the outer beam (122a, 122b, 122c, 122d). For example, the fourth part 122d may have a generally H-shaped cross section, and the third part 122c may have a generally H-shaped cross section. Accordingly, the corner rigidity of the frame 12 can be increased.

The fourth part 122d of the outer beam (122a, 122b, 122c, 122d) may intersect the second part 122b of the outer beam (122a, 122b, 122c, 122d). For example, the fourth part 122d may have a generally H-shaped cross section, and the second part 122b may have a generally H-shaped cross section. Accordingly, the corner rigidity of the frame 12 can be increased.

Figure 12:
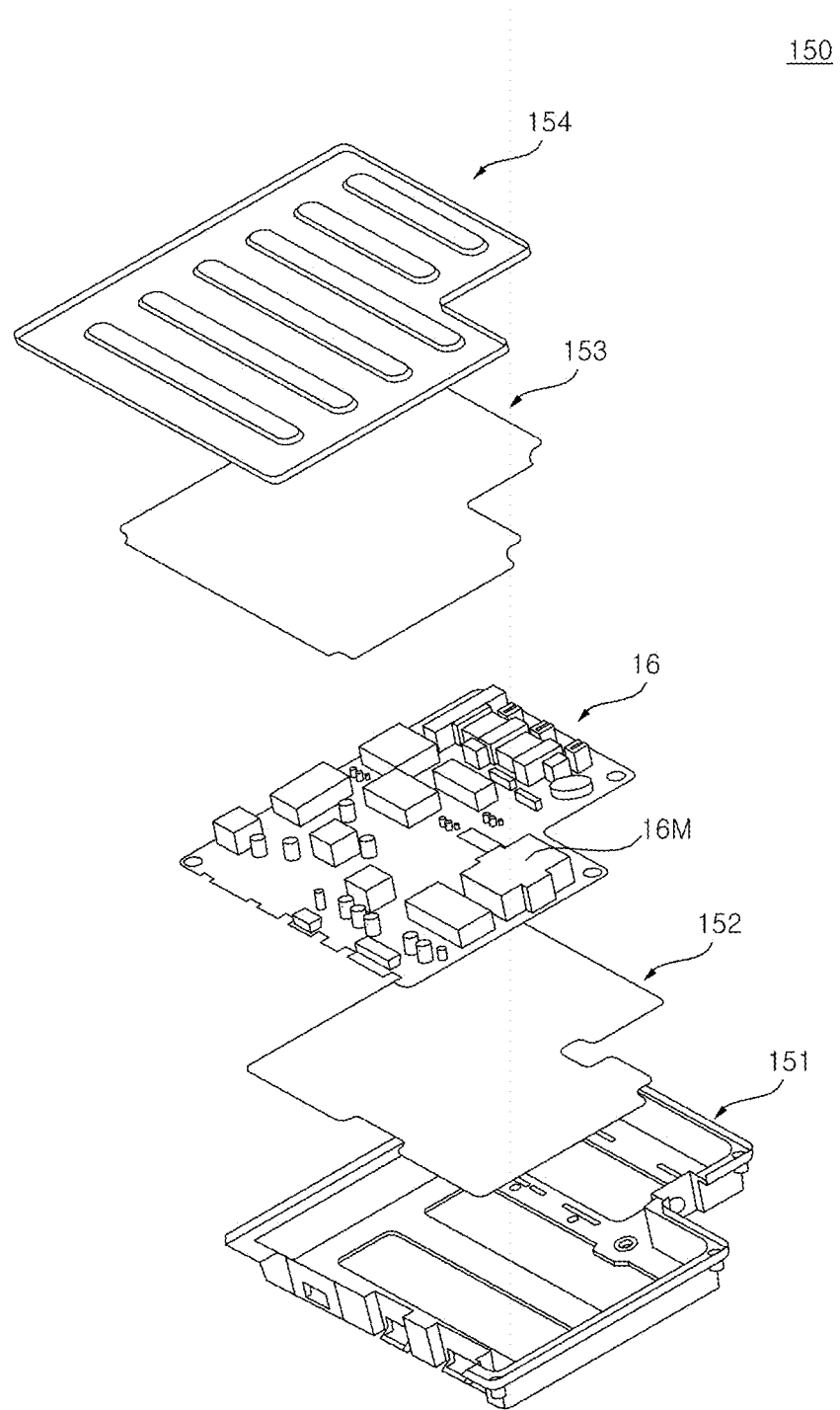

Referring to FIG. 12, a housing 150 may include a lower case 151 and an upper cover 154. The lower case 151 may have the shape of a tub with an accommodation space therein. For example, the lower case 151 may be an injection molded product of a flame-retardant material. The lower case 151 may be made of a material with enhanced chemical resistance. The lower case 151 may have an opening for weight reduction. A lower plate 152 may be disposed at the bottom of the lower case 151. The lower plate 152 may include a metal. The lower plate 152 may cover the opening of the lower case 151.

At least one electrical element 16M may be mounted on a substrate 16. For example, the substrate 16 may be a power supply unit (PSU) or a motherboard. The substrate 16 may be disposed on the lower plate 152.

An upper plate 153 may be disposed on the substrate 16. The upper plate 153 may include a metal. The upper plate 153 may face the lower plate 152.

The upper cover 154 may cover the upper plate 153, and may close the lower case 151. The upper cover 154 may include a metal. For example, the upper cover 154 may be aluminum. The upper cover 154 may be coupled to the lower case 151.

Accordingly, the chemical resistance of the substrate 16 on which electrical elements 16M are mounted can be increased.

Figure 13:
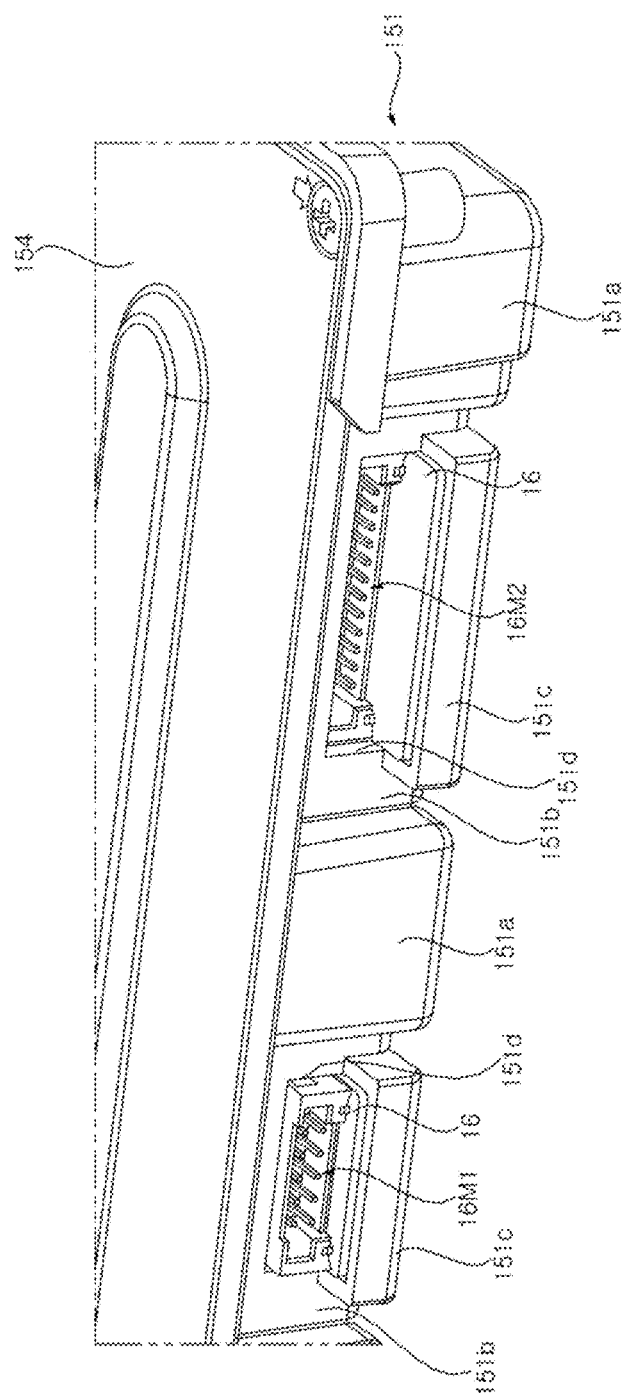
Figure 14:
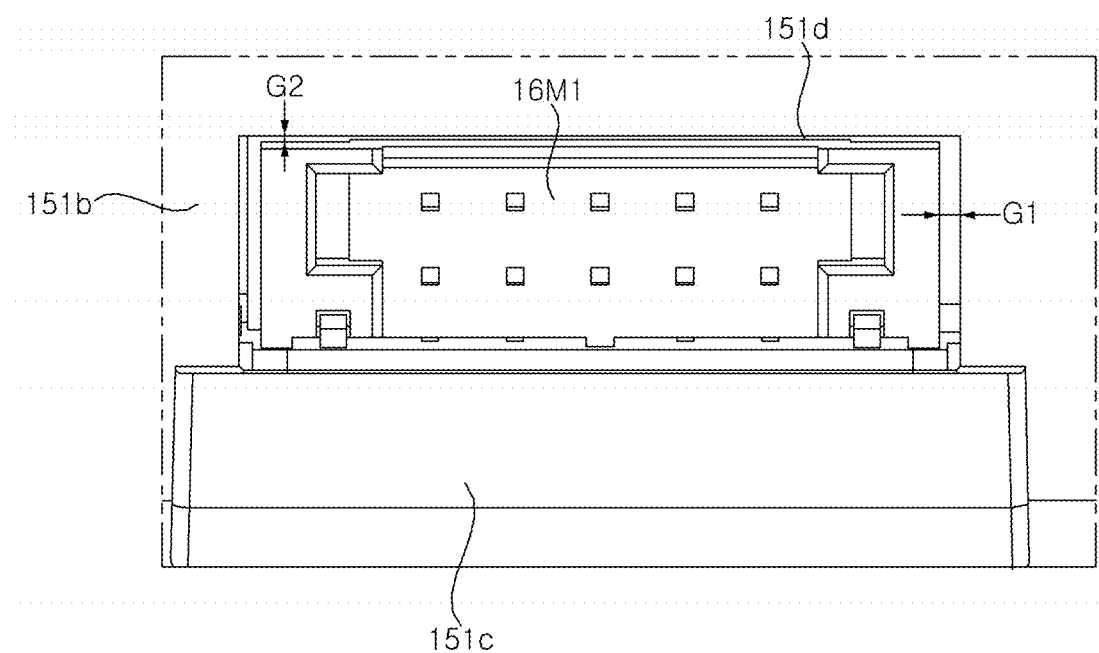

Referring to FIGS. 13 and 14, the housing 150 may include a docking opening 151d. The docking opening 151d may be formed in a side surface of the housing 150. A recessed side wall 151b may be formed around the docking opening 151d. The recessed side wall 151b may be recessed while forming a step inwardly from an outer side wall 151a of the housing 150.

A connector 16M1, 16M2 mounted on the substrate 16 may be exposed to the outside through the docking opening 151d. An under cover 151c may be provided under the docking opening 151d. The under cover 151c may support the connector 16M1, 16M2 exposed to the docking opening 151d and/or the substrate 16 under the connector 16M1, 16M2. The under cover 151c may protrude from the recessed side wall 151b. An outer surface of the under cover 151c may correspond to an outer surface of the outer side wall 151a.

Gaps G1 and G2 may be formed between the docking opening 151d and the connector 16M1, 16M2. The gaps G1 and G2 may include a first gap G1 and a second gap G2. The first gap G1 may be formed between the connector 16M1, 16M2 and a left or right inner surface of the docking opening 151d. The second gap G2 may be formed between the connector 16M1, 16M2 and an upper inner surface of the docking opening 151d.

Thus, it is possible to not only increase the chemical resistance but also prevent an external impact from being applied to major components.

Figure 15:
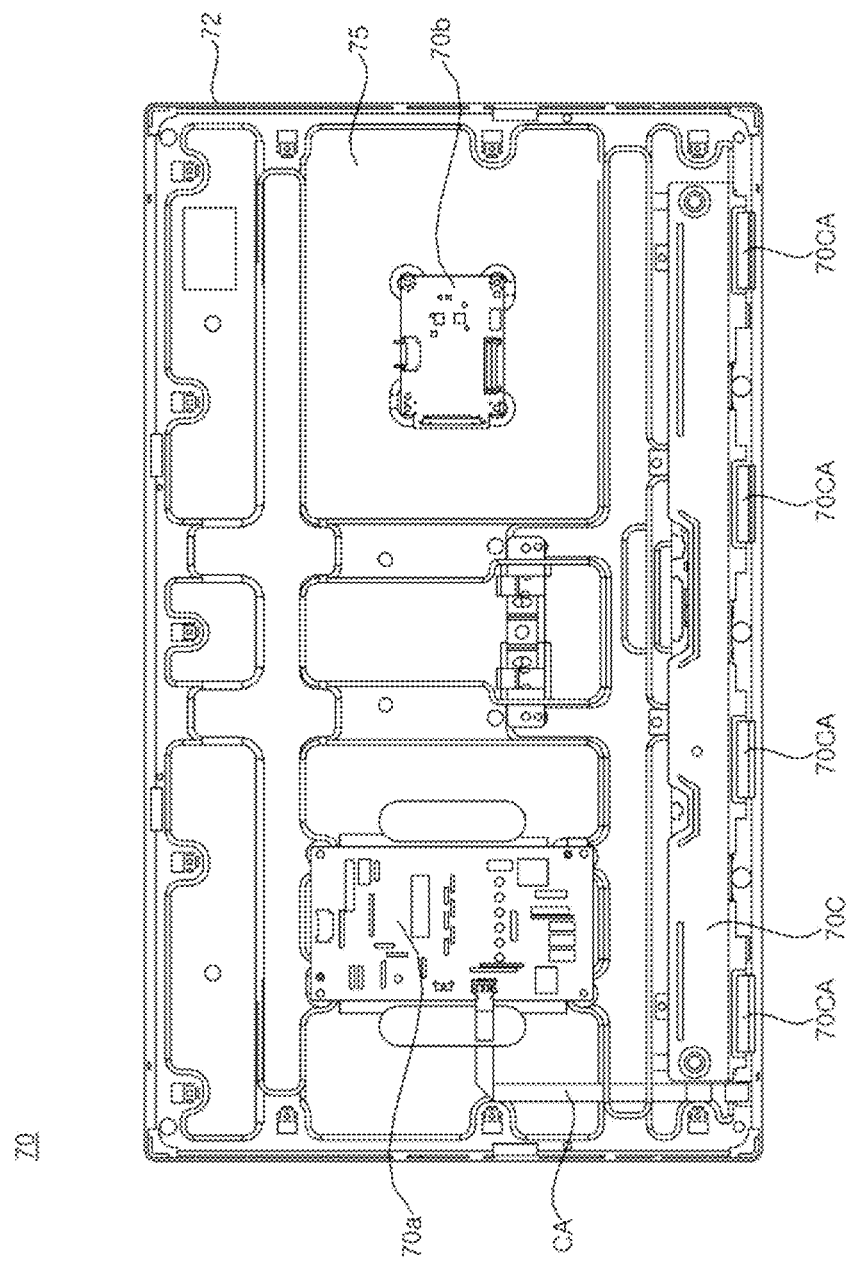
Figure 16:
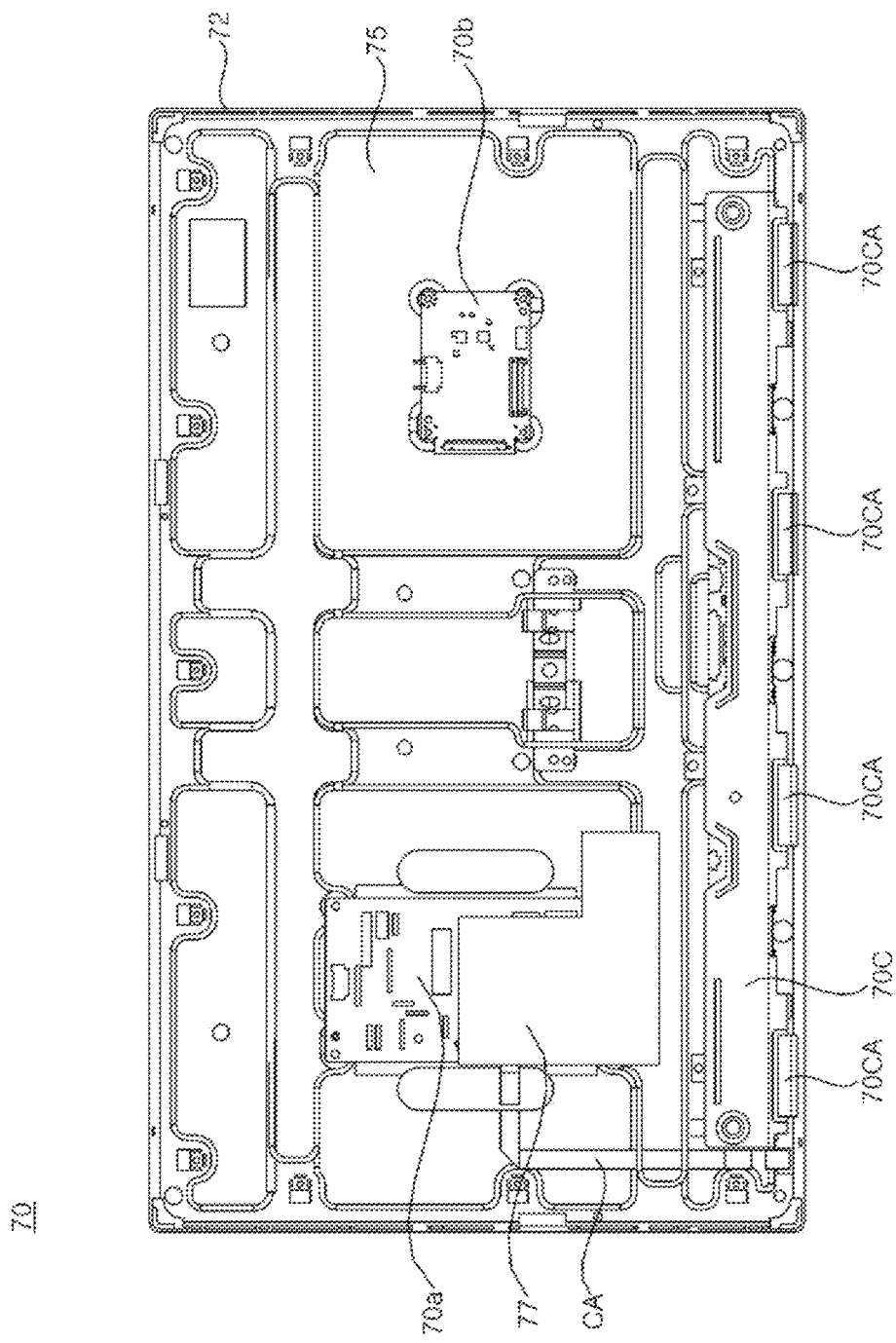

Referring to FIGS. 15 and 16, a control board (70a, 70b, 70c) may be mounted or fixed to a rear surface of the frame 75 of the display 70. For example, the control board (70a, 70b, 70c) may be a power board 70a, a sub board 70b, or a source PCB 70c. Electrical elements may be mounted on the control board (70a, 70b, 70c), and heat may be generated as the electrical elements are operated.

A flexible cable CA may provide an electrical connection between the power board 70a and the display panel 71. The power board 70a may control power and/or signals provided to the light source of the display 70. The power board 70a may be referred to as a light source drive board 70a. The sub board 70b may process image information provided to the display panel 71 (see FIG. 1). The source PCB 70c may be mounted or fixed to the rear surface of the frame 75 while being adjacent to a lower side of the frame 75. A COF 70CA may provide an electrical connection between the source PCB 70c and the display panel 71.

A shield member 77 may cover the control board (70a, 70b, 70c). The shield member 77 may be referred to as a first shield member 77, a display shield member 77, a heat dissipation sheet 77, or a heat distribution sheet 77. For example, the shield member 77 may be a graphite sheet. The shield member 77 may cover the power board 70a. The shield member 77 may overlap at least a portion of the power board 70a.

Figure 17:
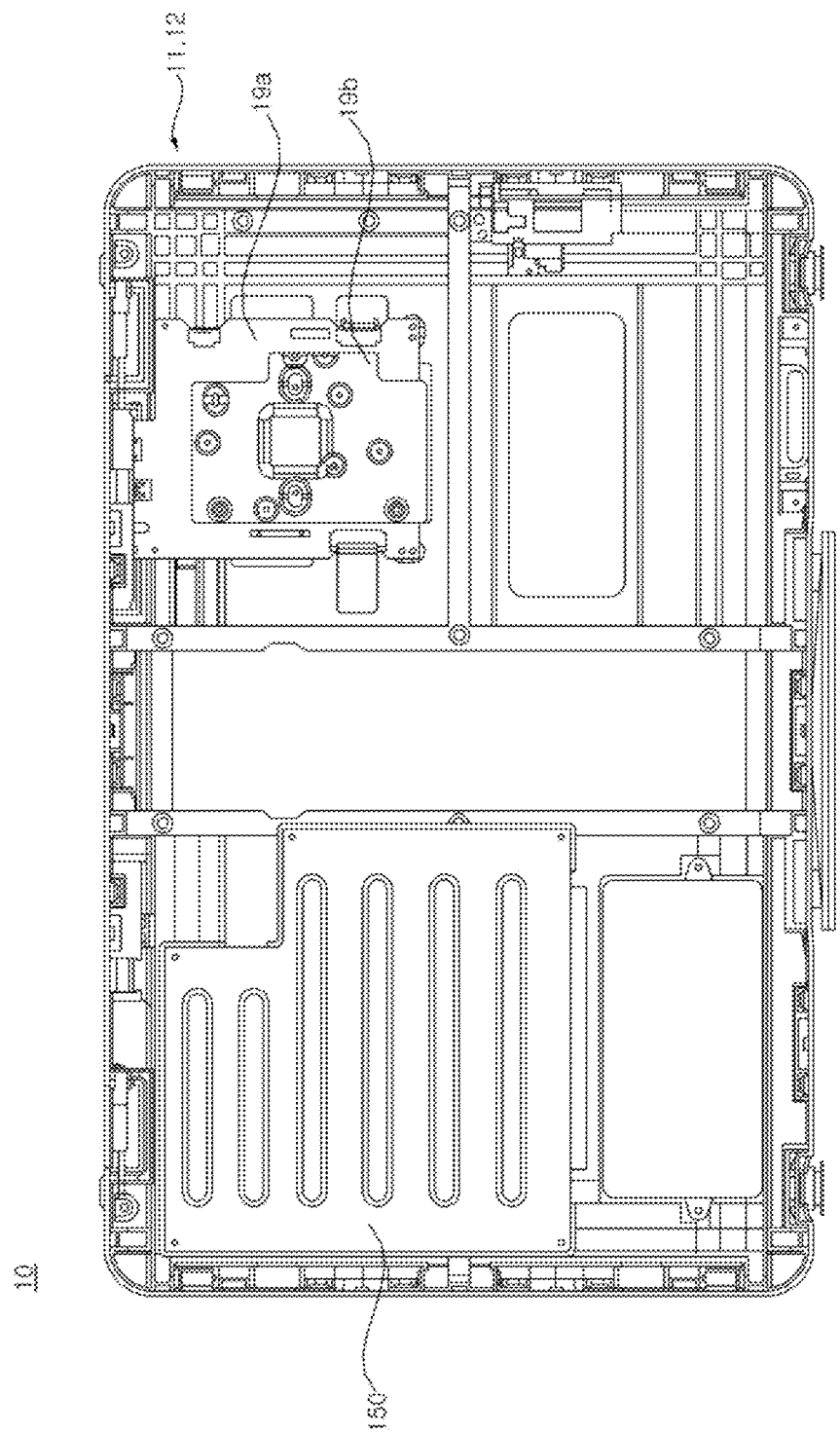
Figure 18:
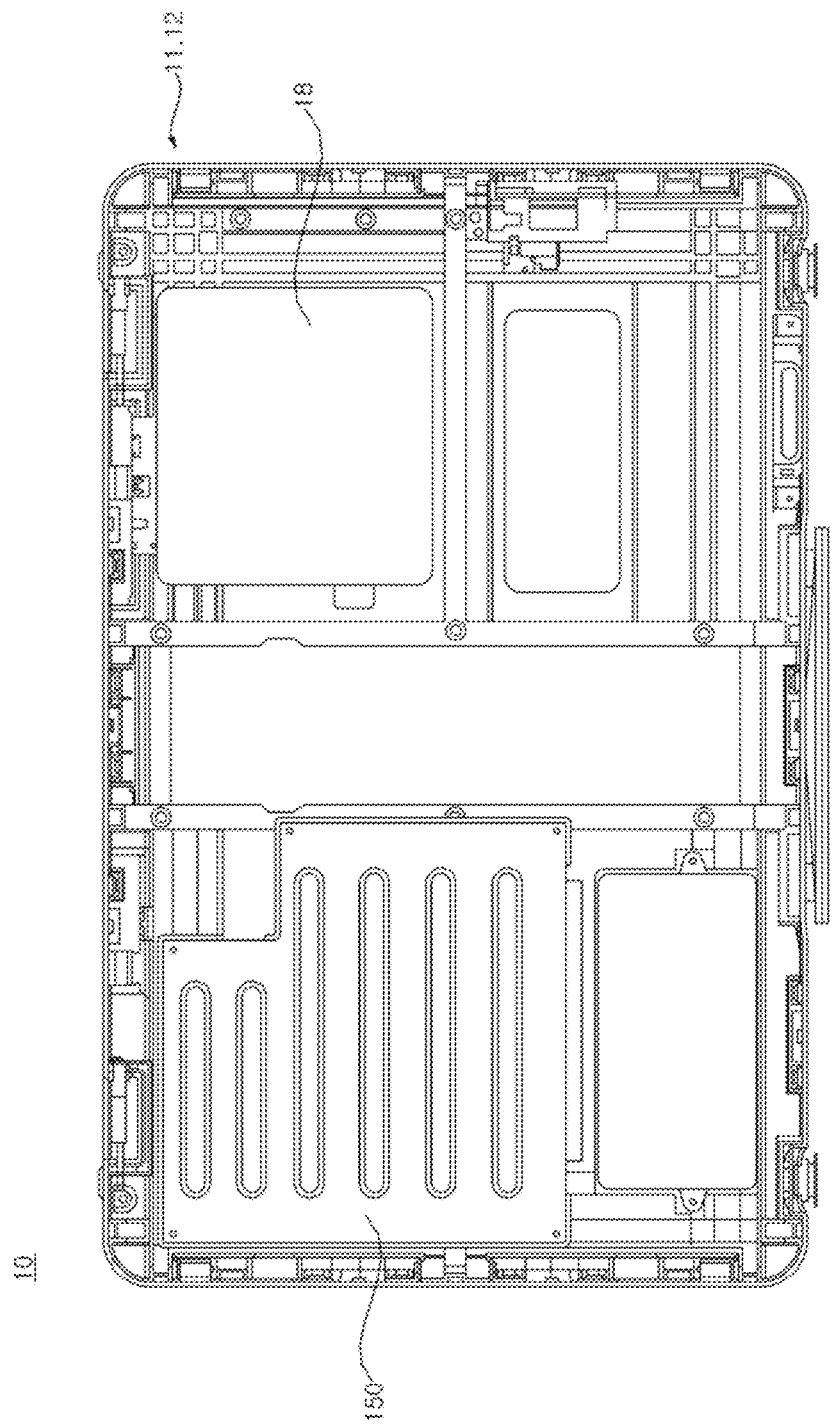

Referring to FIGS. 17 and 18, the housing 150 in which the power supply unit 16 (see FIG. 6) is embedded may be mounted on or coupled to the frame 12 of the base 10. A main board 19a may be adjacent to the housing 150 embedded with the power supply unit 16, and may be mounted on or coupled to the frame 12 of the base 10. The power supply unit 16 may supply power required for the display device 1 (see FIG. 1). The main board 19a may process image information displayed via the display panel 71 and/or voice information provided through a speaker assembly. The power supply unit 16 and/or the main board 19a may generate heat when driven.

A shield plate 19b may cover a portion of the main board 19a, and may be mounted on or fixed to the frame 12. The shield plate 19b may prevent physical and electrical damage to the main board 19a.

A shield member 18 may cover the main board 19a. The shield member 18 may be referred to as a second shield member 18, a base shield member 18, a heat dissipation sheet 18, or a heat distribution sheet 18. The shield member 18 may overlap all or at least part of the main board 19a. For example, the shield member 18 may be a graphite sheet.

Figure 19:
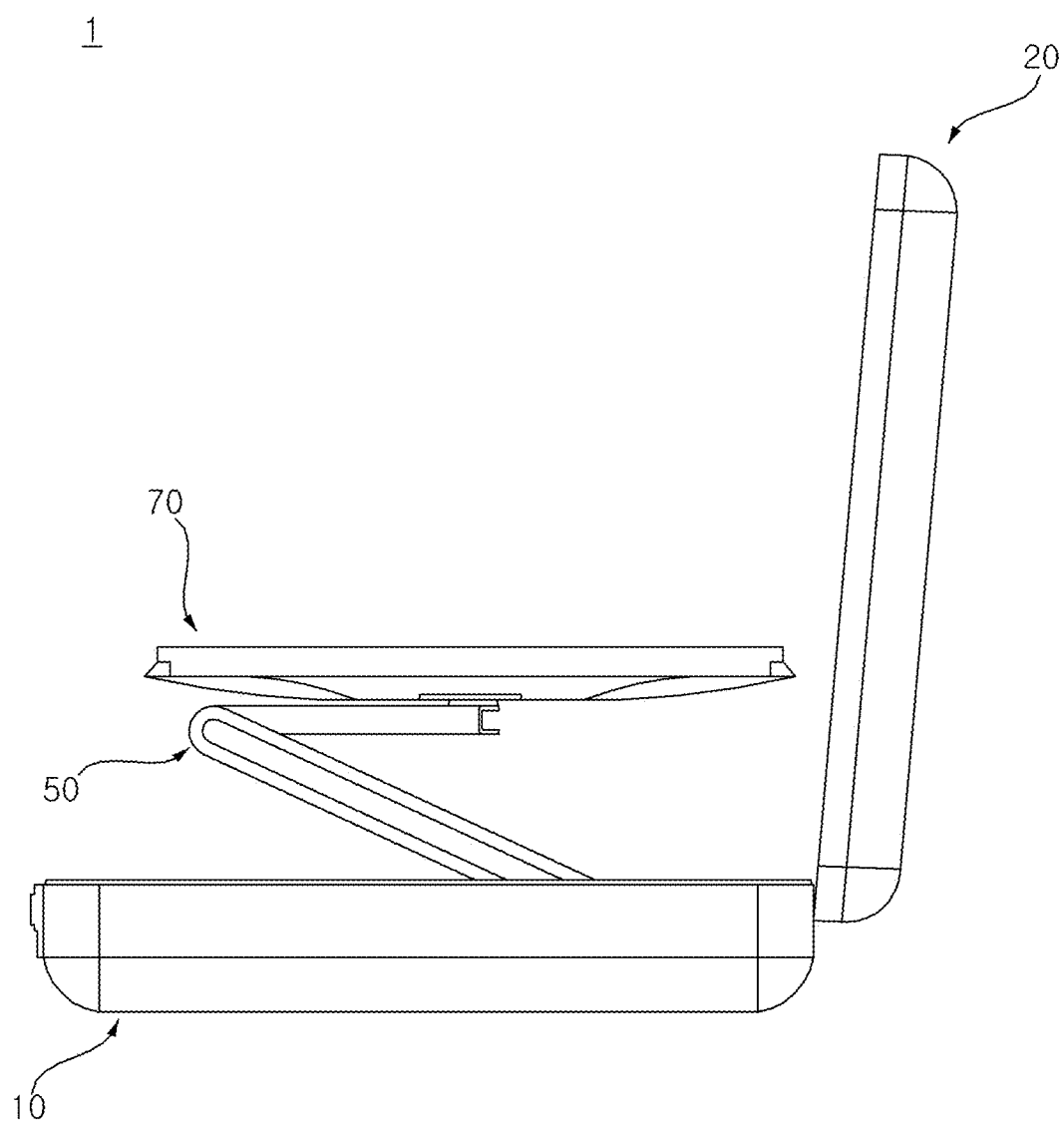
Figure 20:
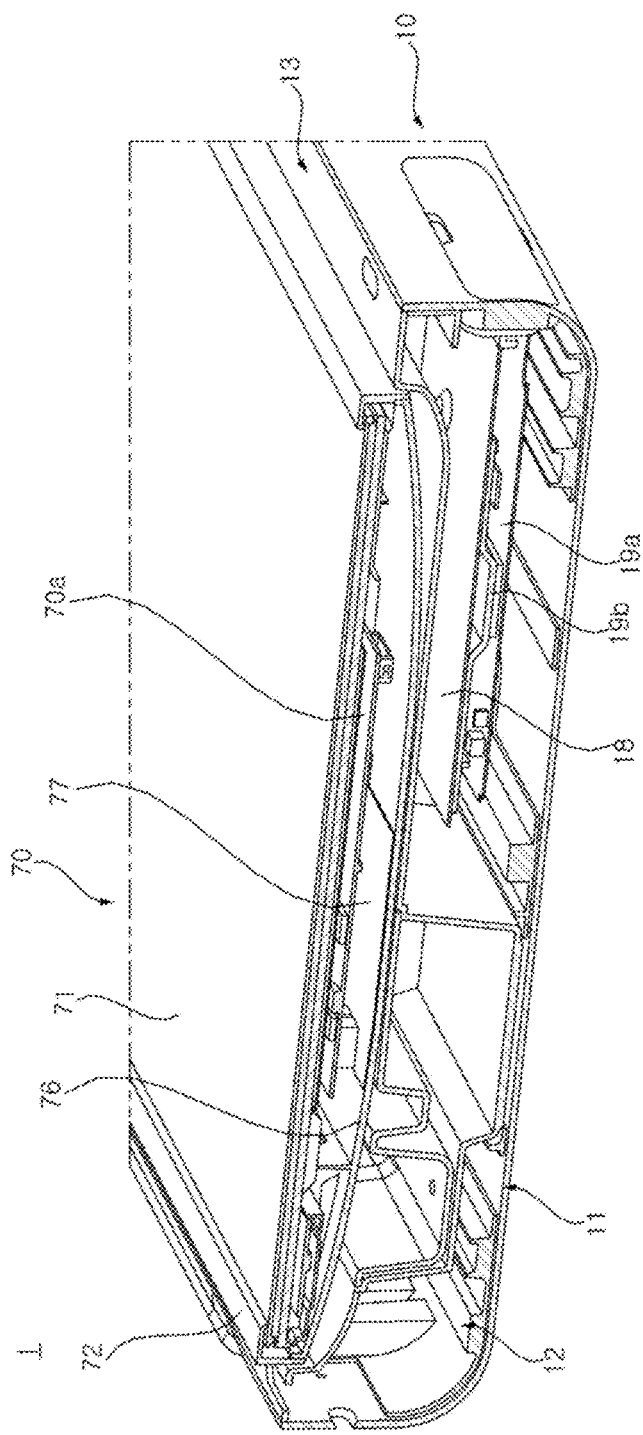

Referring to FIGS. 19 and 20, as the cover 20 is opened and closed from the base 10 with respect to the hinge 30 (see FIG. 1), the display 70 may be stored in the base 10. The display 70 may be moved to an outside of the base 10 or be placed on the base 10 by the arm 50. When the display 70 is stored on the base 10, the display 70 and the base 10 may be arranged in parallel to face each other.

The side cover 72 may cover the side surface of the display panel 71, and the back cover 76 may be disposed at the rear of the display panel 71 so as to be coupled to the side cover 72. A control board 70a may be positioned between the display panel 71 and the back cover 76. For example, the control board 70a may be a light source drive board 70a, and high heat may be generated when the control board 70a is driven. Heat generated from the control board 70a may be discharged to the outside through the back cover 76.

The main board 19a that is mounted on the frame 12 of the base 10 may be positioned between the frame 12 and the top 13. A lot of heat may be generated when the main board 19a is driven, and the heat may be discharged to the outside through the top 13.

The first shield member 77 may be positioned between the control board 90a and the back cover 76. The first shield member 77 may be fixed or bonded to the back cover 76. For example, the first shield member 77 may be a graphite sheet. The second shield member 18 may be positioned between the main board 19a and the top 13.

Referring further to FIG. 15 and FIG. 17, FIG. 15 shows the rear surface of the display 70 that faces the base 10, and FIG. 17 shows the front surface of the base 10 that faces the display 70.

The housing 150 in which the power supply unit 16 (see FIG. 6) is embedded may generate high heat. The light source drive board 70a may generate high heat. When the display 70 is stored on the base 10, the housing 150 embedded with the power supply unit 16 may not overlap the light source drive board 70a. Accordingly, heat generated from the housing 150 and heat generated from the light source drive board 70a can be evenly distributed in the display device 1.

When the display 70 is stored on the base 10, the light source drive board 70a may overlap at least a portion of the main board 19a. Heat generated from the light source drive board 70a and heat generated from the main board 19a may be accumulated while being emitted toward each other.

Heat generated from the light source drive board 70a may be distributed horizontally by the first shield member 77 to be dissipated. Heat generated from the main board 19a may be distributed horizontally by the second shield member 18 to be dissipated. For example, the first shield member 77 may partially or at least partially overlap the second shield member 18. As another example, the first shield member 77 may be aligned so as not to overlap the second shield member 18. As another example, the first shield member 77 may be adjacent to the second shield member 18 while forming a boundary. Accordingly, the heat generated from the main board 19a and the heat generated from the light source drive board 70a can be distributed without accumulation.

Thus, even when the display 70 is stored on the base 10, heat generated by the operation of the display 70 can be evenly distributed and dissipated.

Figure 21:
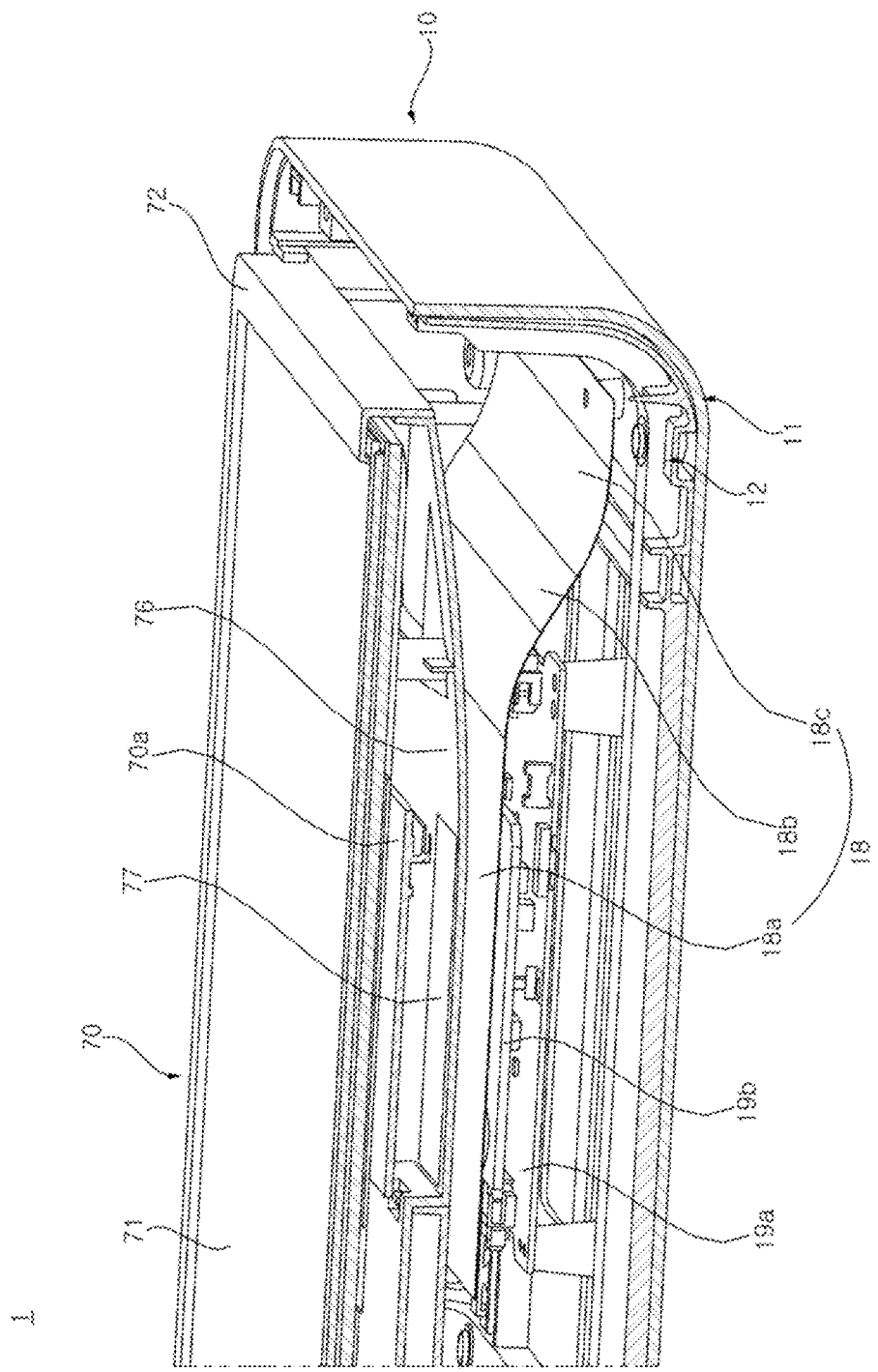

Referring to FIG. 21, the second shield member 18 may include a first sheet part 18a, a second sheet part 18b, and a third sheet part 18c.

The first sheet part 18a may be positioned between the main board 19a and the light source drive board 70a, and may cover the main board 19a. The second sheet part 18b may extend from the first sheet part 18a. The second sheet part 18b may form a slope descending from the first sheet part 18a.

The second sheet part 18b may extend in a curved manner from the first sheet part 18a toward the bottom of the frame 12 of the base 10. The third sheet part 18c may be positioned above the bottom of the frame 12 of the base 10, and may cover the bottom of the frame 12.

The first sheet part 18a may have a negative slope toward the second sheet part 18b. The slope of the first sheet part 18a may be less than the slope of the second sheet part 18b.

Thus, moisture or water, which may be formed on the second shield member 18 that is configured to cover the main board 19a in response to on/off of the main board 19a, can be discharged while passing through the first sheet part 18a, the second sheet part 18b, and the third sheet part 18c.

Figure 22:
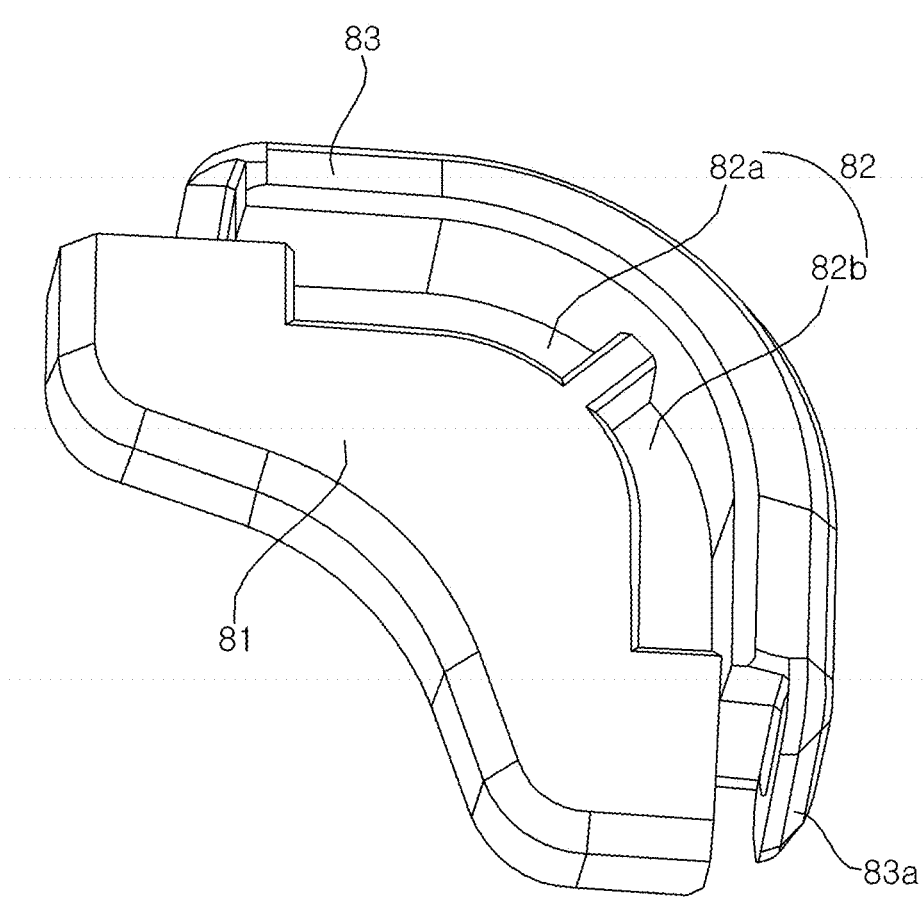
Figure 23:
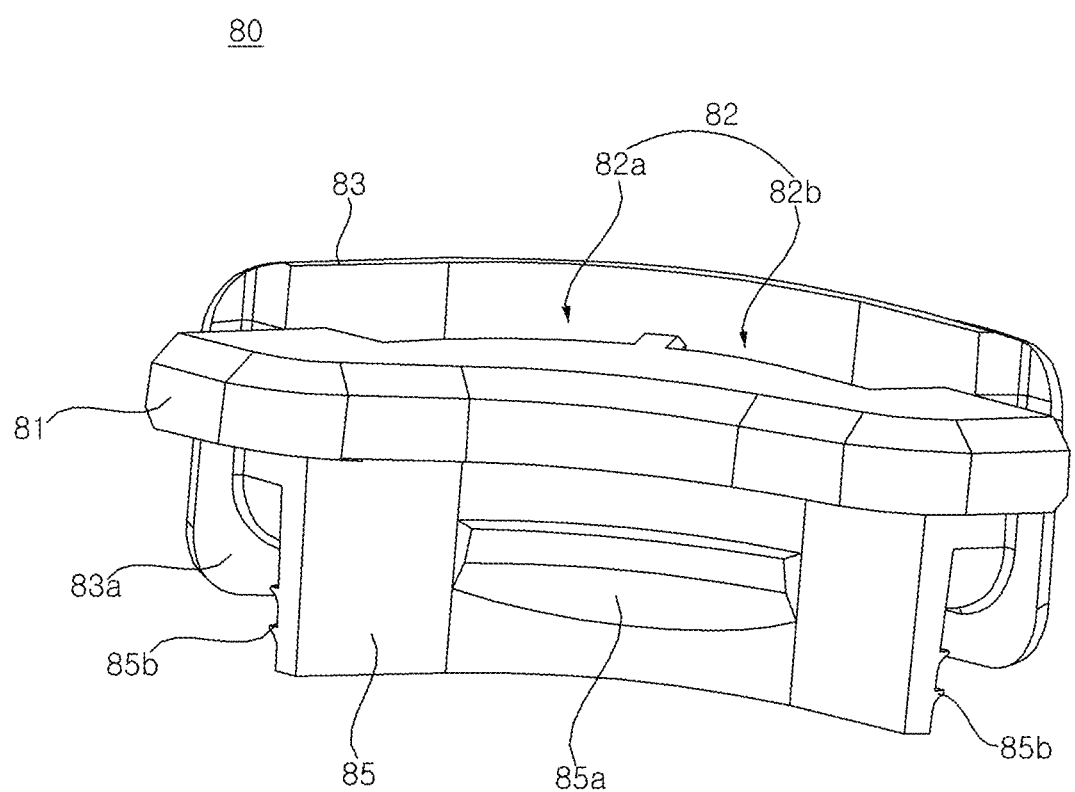
Figure 24:
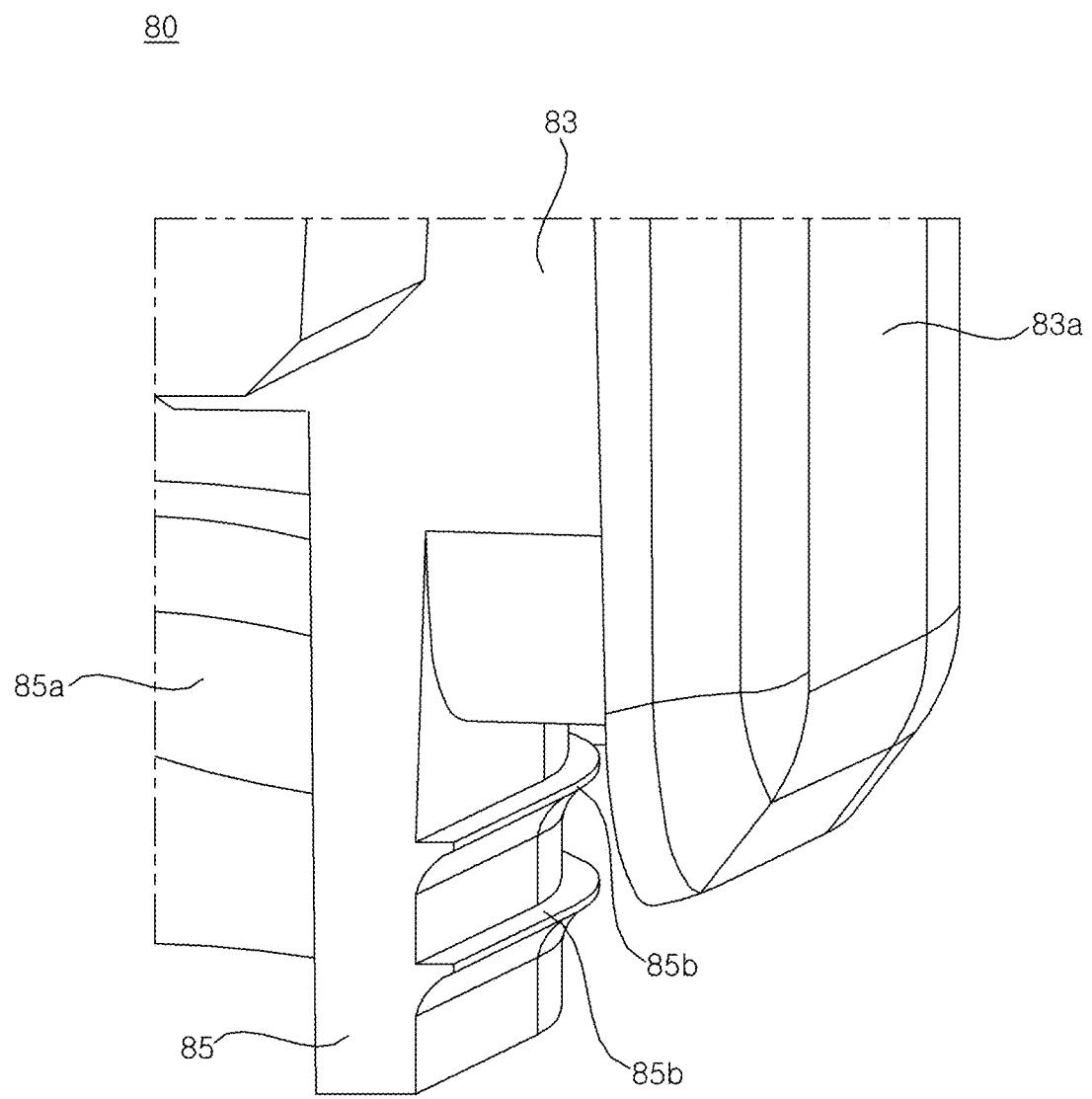

Referring to FIGS. 22 to 24, a bumper 80 may include a body 81 and a wall 83. The body 81 may be a first piece 81 that extends widely and has a constant thickness. The wall 83 may be a second piece 83 that extends in a direction intersecting an extension direction of the body 81. The wall 83 may be integrally formed with the body 81.

A trench 82 may be formed on an upper surface of the body 81, and may be adjacent to the wall 83. A plurality of trenches 82 may be provided. The plurality of trenches 82 may include a first trench 82a and a second trench 82b. The first trench 82a may extend along an inner surface of the wall 83 and may be adjacent to the second trench 82b. The second trench 82b may extend along the inner surface of the wall 83 and may be adjacent to the first trench 82a.

An apron 83a may be formed on an outside of the wall 83. The apron 83a may be formed larger than the wall 83 at the outside of the wall 83. Left and right ends and/or a lower end of the apron 83a may extend beyond the wall 83.

An insert 85 may extend downward of the body 81, and may face the wall 83 and/or the apron 83a. The insert 85 may be parallel to the apron 83a. The insert 85 may be disposed opposite the apron 83a with respect to the wall 83. A fixing rib 85a may protrude from an inner surface of the insert 85. A sealing rib 85b may protrude from an outer surface of the insert 85. A plurality of sealing ribs 85b may be provided, and the plurality of sealing ribs 85b may be arranged side by side at a distance from each other.

Figure 25:
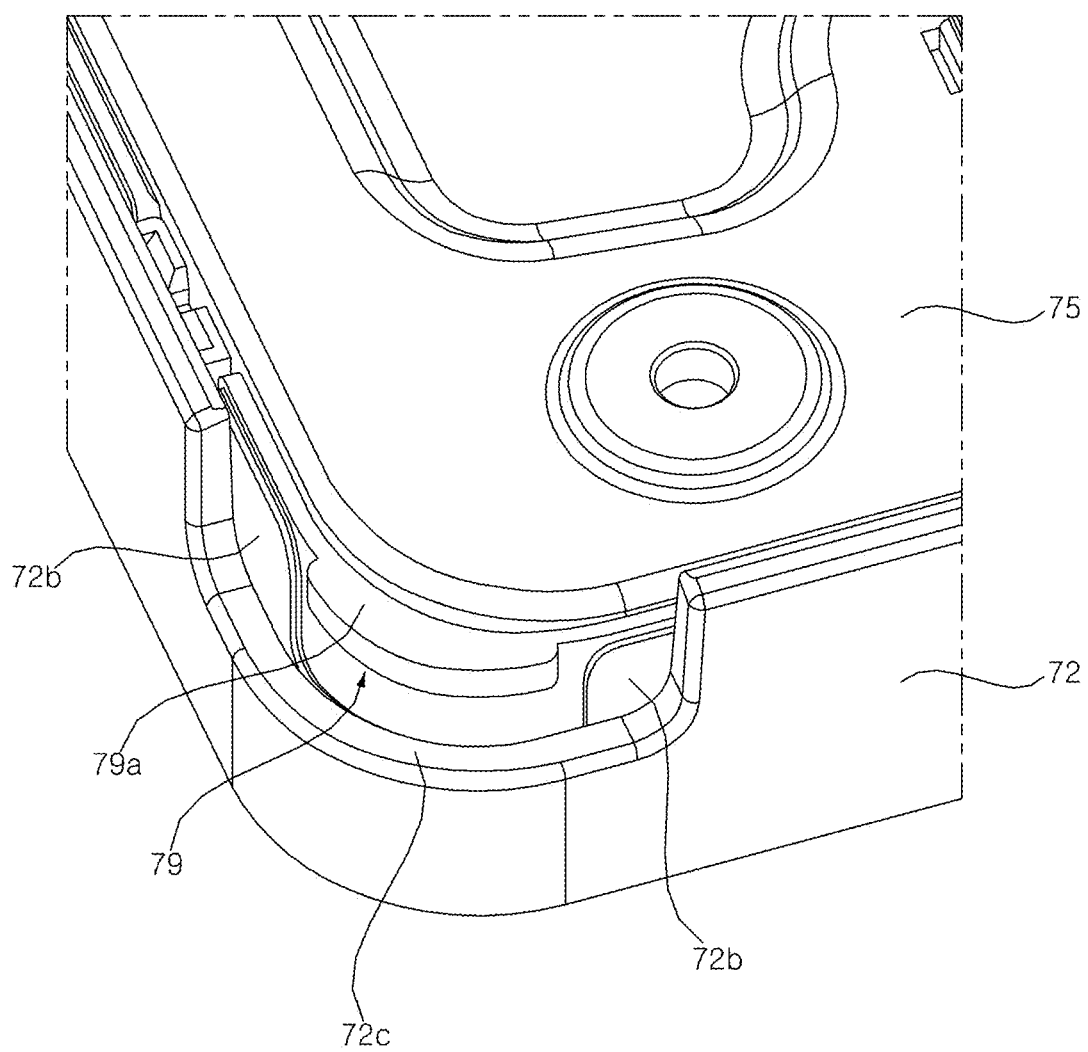
Figure 26:
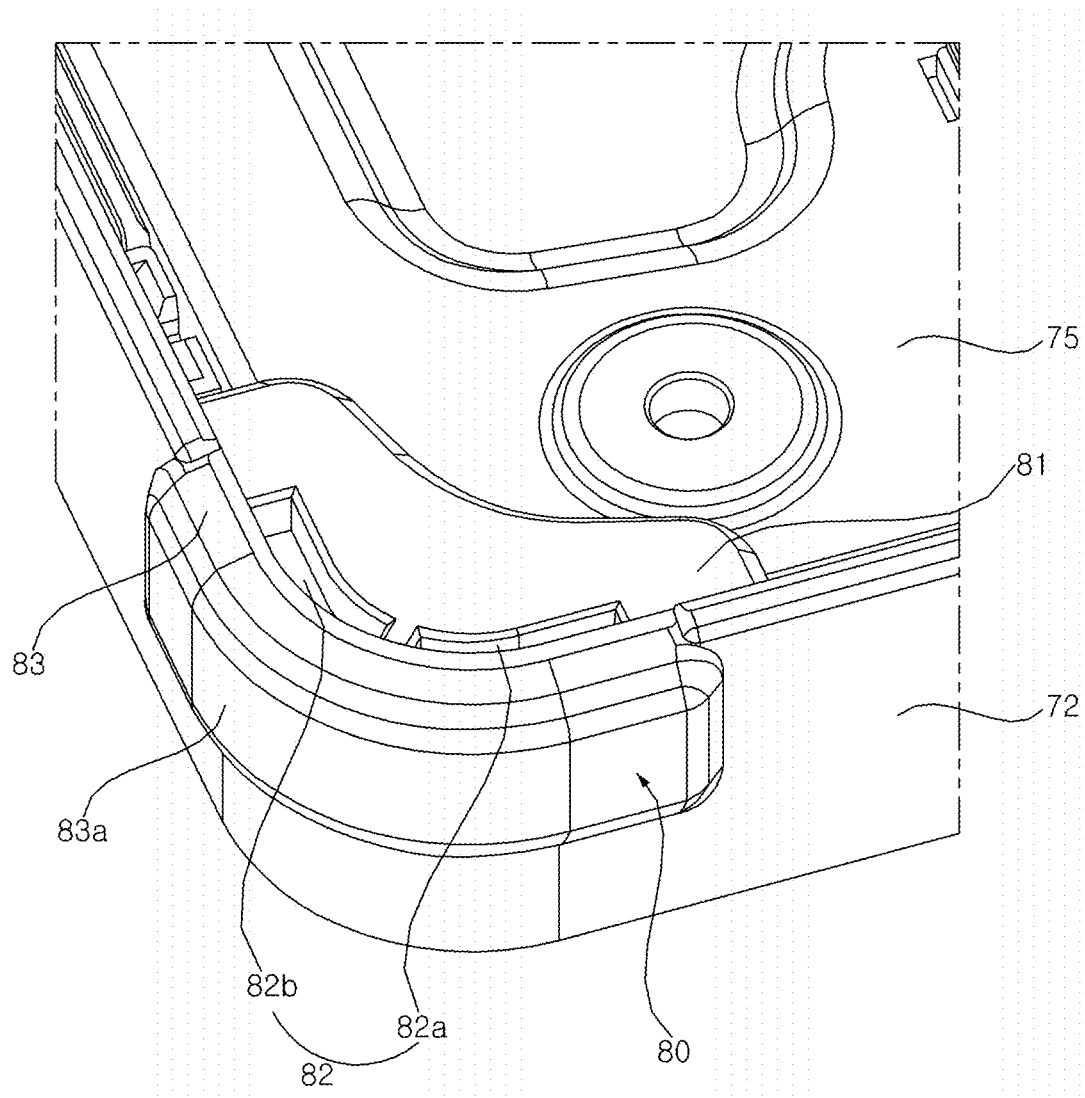
Figure 27:
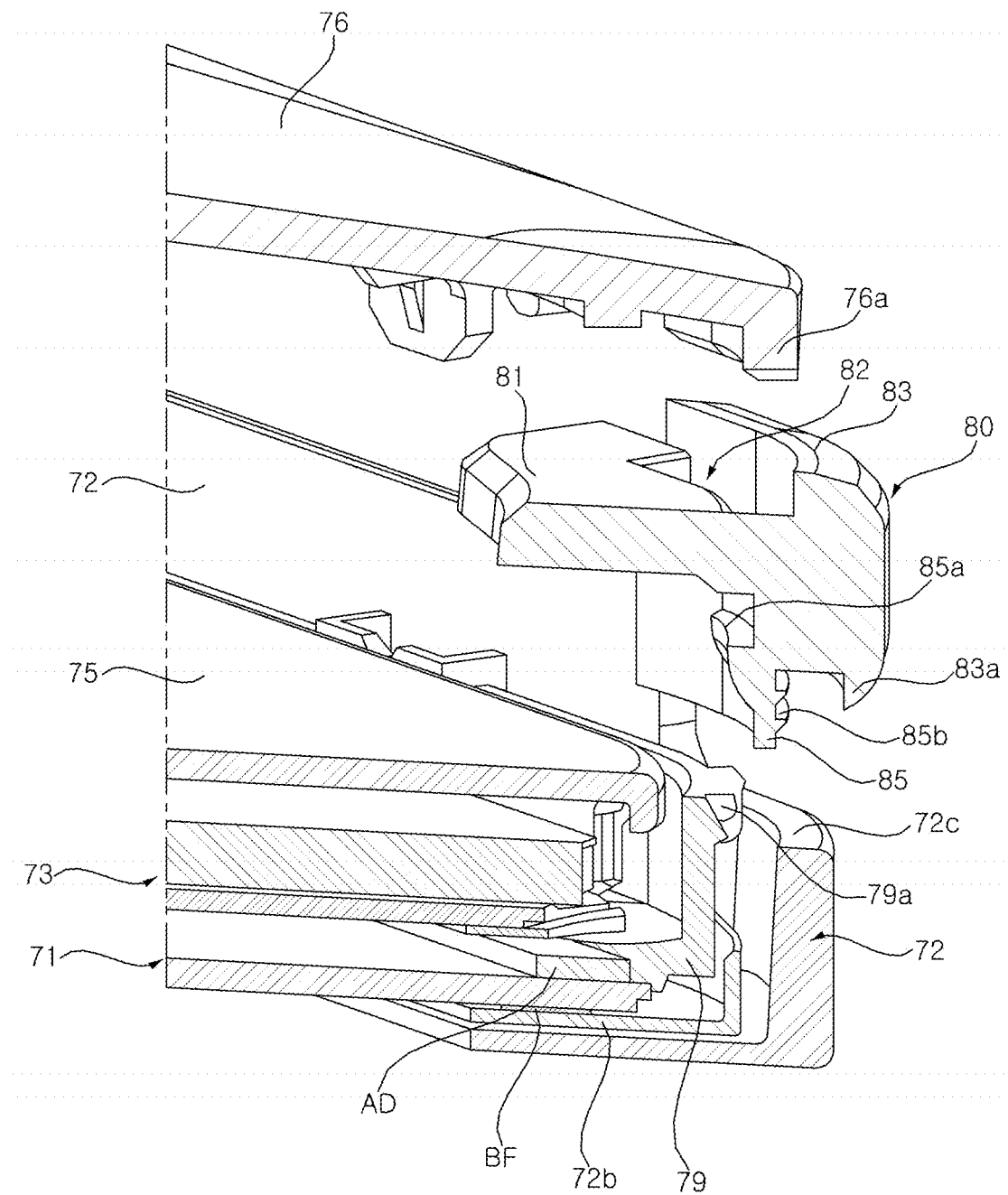

Referring to FIGS. 25 to 27, the bumper 80 may be coupled to the side cover 72 of the display 70 (see FIG. 1). The body 81 of the bumper 80 may be in contact with a rear surface of the frame 75 or may be supported by the rear surface of the frame 75. The wall 83 of the bumper 80 may be positioned on a cut-out part 72c of the side cover 72. The cut-out part 72c of the side cover 72 may be inserted between the insert 85 of the bumper 80 and the apron 83a of the wall 83. The depth of the cut-out part 72c may correspond to the height of the wall 83.

The back cover 76 may be coupled to the frame 75 and/or the side cover 72 while covering the rear surface of the frame 75. A coupling protrusion 76a may protrude from a front surface of the back cover 76 at a corner of the back cover 76. The coupling protrusion 76a may be inserted into the trench 82 of the bumper 80.

A guide panel 79 may be inserted between the frame 75 and the side cover 72, and may support the rear surface adjacent to an edge of the display panel 71. The guide panel 79 may have an engaging portion 79a. The engaging portion 79a may be formed in a protruding manner from an outer surface of the guide panel 79 at a corner of the guide panel 79. The bumper 80 may be inserted into the cut-out part 72c of the side cover 72, so that the fixing rib 85a of the bumper 80 may be fixed while being engaged with the engaging portion 79a of the guide panel 79.

Figure 28:
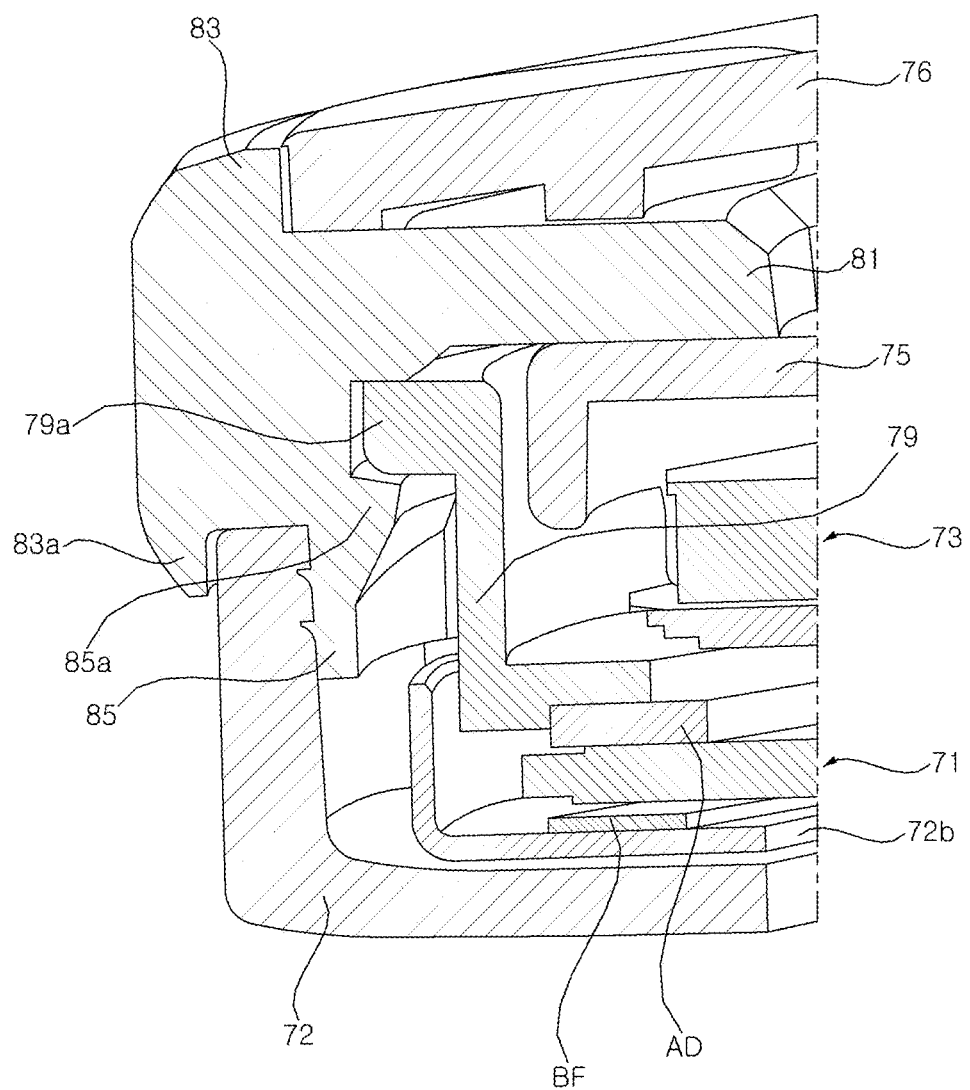
Figure 29:
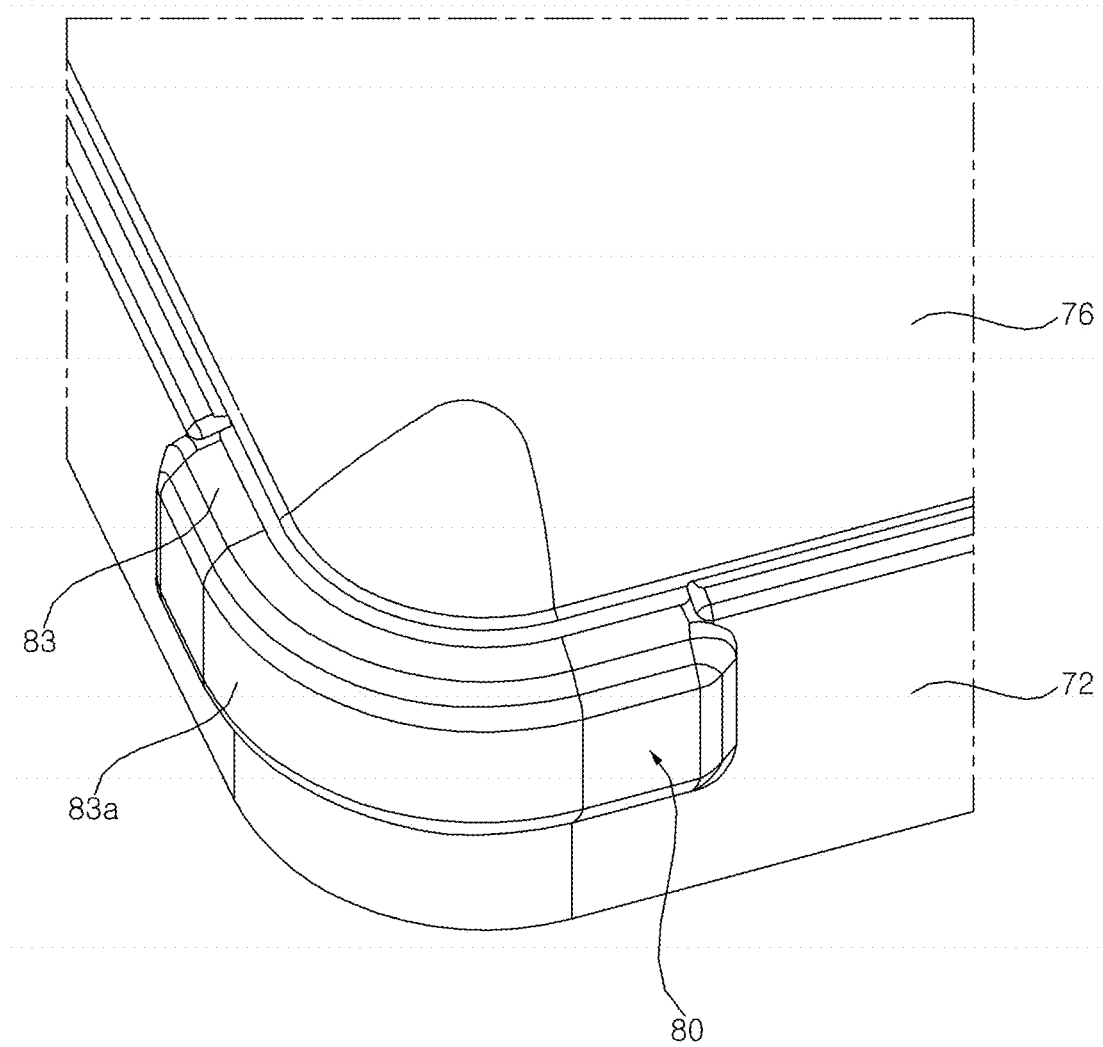

Referring to FIGS. 28 and 29, the optical layer 73 may be positioned between the frame 75 and the display panel 71. The guide panel 79 may be coupled to the frame 75, and may support the rear surface adjacent to an edge of the display panel 71. The display panel 71 may be fixed to the guide panel 79 by an adhesive member AD. An inner top 72b may cover the front side of the edge of the display panel 71, and may be coupled to the guide panel 79 between the guide panel 79 and the side cover 72. A buffer layer BF may be fixed inside the inner top 72b, and may face the front surface of the display panel 71. The buffer layer BF may form a gap with the front surface of the display panel 71.

The side cover 72 may cover the front surface adjacent to the edge of the display panel 71, and may cover the side surface of the guide panel 79 and/or the inner top 72b. The body 81 of the bumper 80 may be positioned between the frame 75 and the back cover 76, and the wall 83 of the bumper 80 may connect the side cover 72 and the back cover 76. The apron 83a of the bumper 80 may protrude further than an outer surface of the side cover 72.

Thus, the display 70 can be protected by absorbing impact that may be applied to the corner of the display 70 when the display 70 is stored in the base 10 (see FIG. 19).

Figure 30:
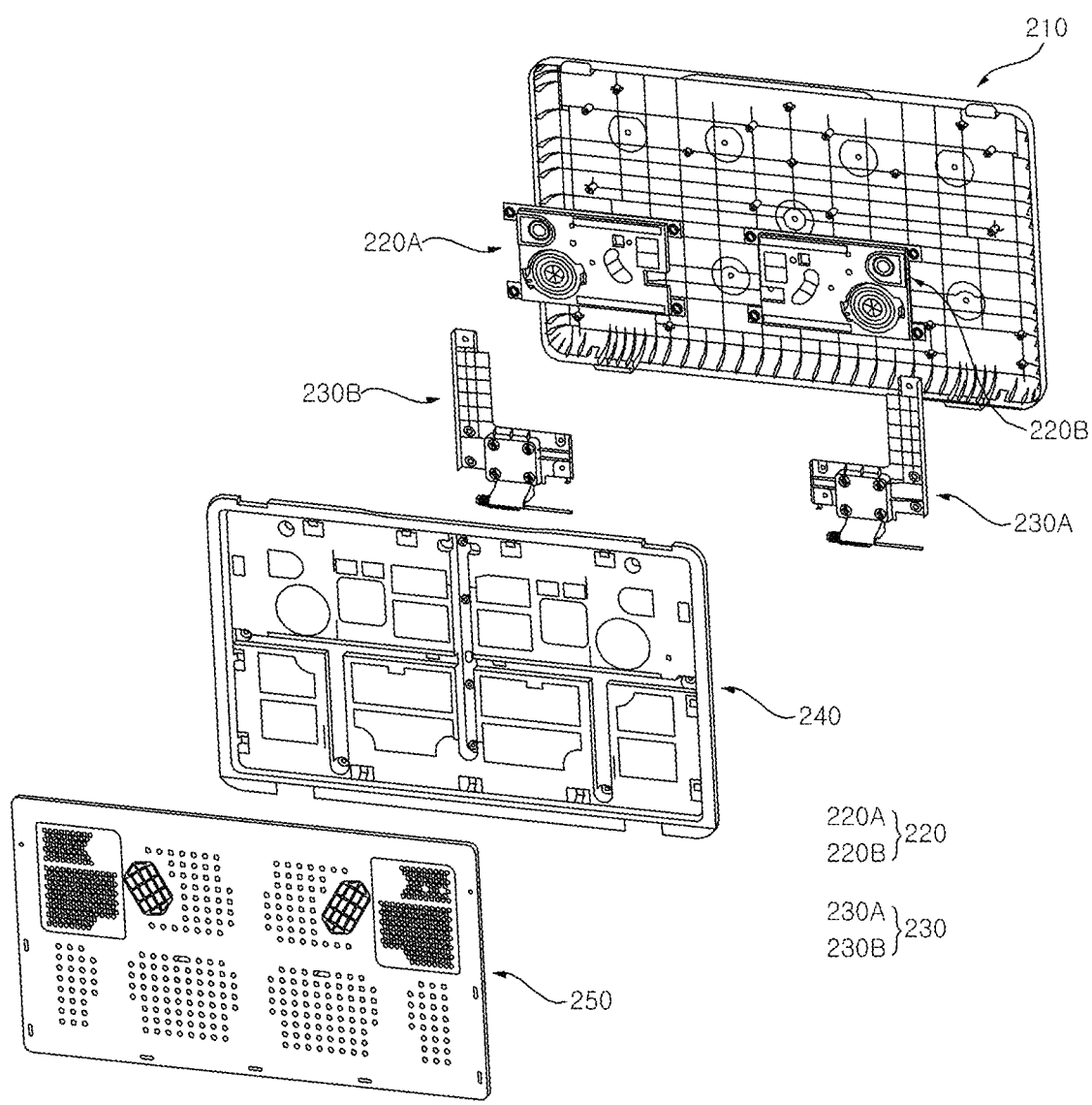

Referring to FIG. 30, the cover 20 may include an outer cover 210, a middle frame 240, and an inner cover 250. The outer cover 210 may have the shape of a tub with an accommodation space therein. The middle frame 240 may be coupled to an inside of the outer cover 210, and the inner cover 250 may be coupled to the middle frame 240. The middle frame 240 may be disposed between the outer cover 210 and the inner cover 250.

A speaker assembly 220 may be positioned between the middle frame 240 and the outer cover 210, and may be coupled or fixed to the outer cover 210. A hinge assembly 230 may be fixed to the outer cover 210. The hinge assembly 230 may be positioned between the middle frame 240 and the outer cover 210.

Figure 31:
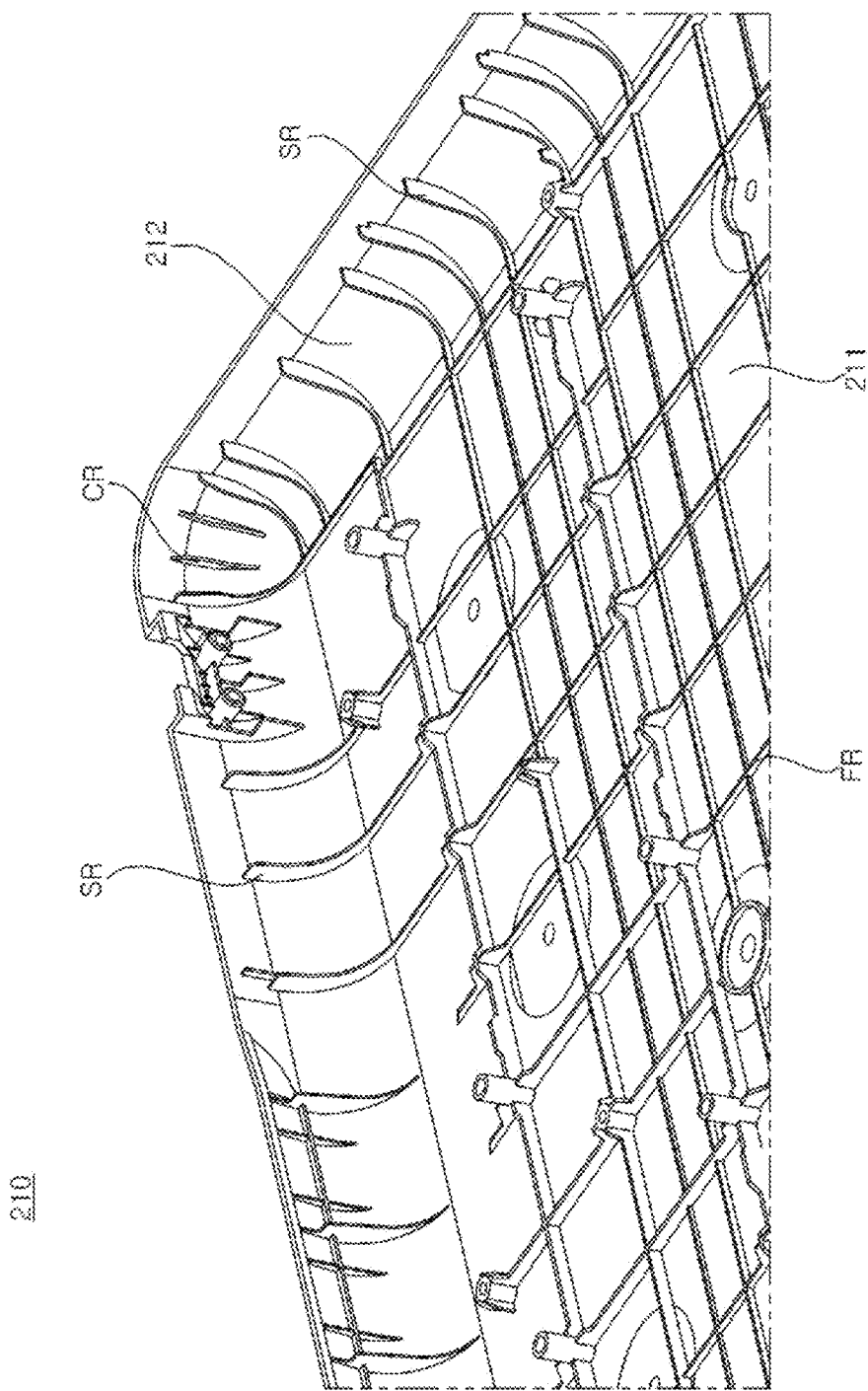

Referring to FIG. 31, the outer cover 210 may include a center part 211, a side part 212, and ribs FR, SR, and CR. The center part 211 may define a flat plate of the outer cover 210. The side part 212 may extend from the center part 211, and may define a wall or dam at an outer edge (or periphery) of the center part 211.

The ribs FR, SR, and CR may include a center rib FR, a side rib SR, and a corner rib CR. Center ribs FR may be formed on an inner side of the center part 211. The center ribs FR may intersect each other to form a matrix. Side ribs SR may be formed on an inner side of the side part 212. The side rib SR may be connected to the center rib FR. Corner ribs CR may be formed on an inner side of a corner defined by the side part 212.

Accordingly, the rigidity of the outer cover 210 can be increased. As a result, the outer cover 210 can be protected from damage caused by impact applied to the sides and/or the corners.

Figure 32:
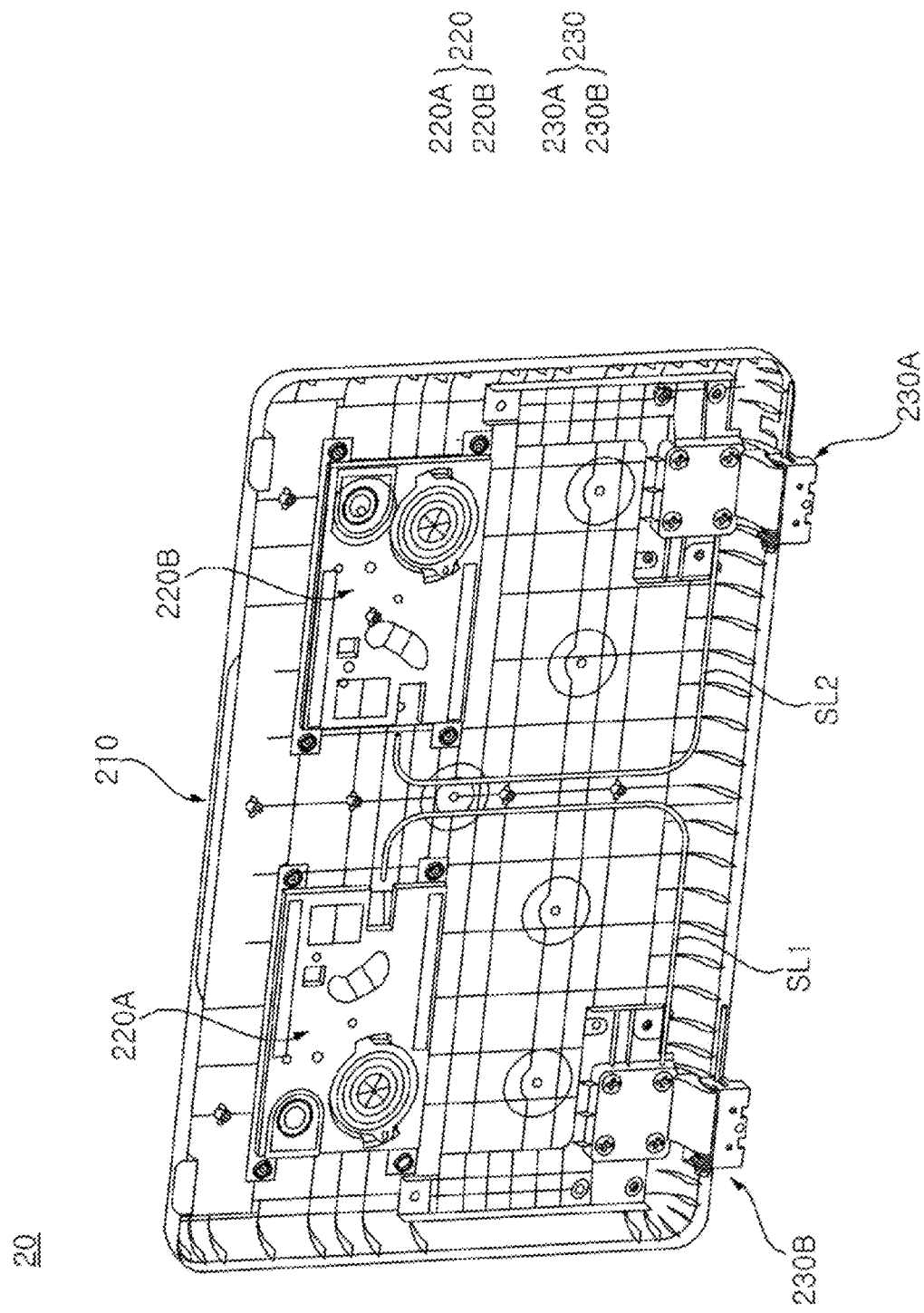

Referring to FIG. 32, the speaker assembly 220 may be fixed to the inside of the outer cover 210. A plurality of speaker assemblies 220 may be provided. The plurality of speaker assemblies 220 may include a first speaker assembly 220A and a second speaker assembly 220B. The first speaker assembly 220A may be a left-facing speaker, and the second speaker assembly 220B may be a right-facing speaker. The first speaker assembly 220A and the second speaker assembly 220B may provide stereo sound.

A speaker cable (SL1, SL2) may be provided in plurality. A first speaker cable SL1 may be connected to the first speaker assembly 220A. A second speaker cable SL2 may be connected to the second speaker assembly 220B. The speaker cable SL1, SL2 may provide power and audio signals to the speaker assembly 220. The speaker cable SL1, SL2 may be routed inside the outer case 210. The speaker cable SL1, SL2 may pass through the hinge assembly 230.

Figure 33:
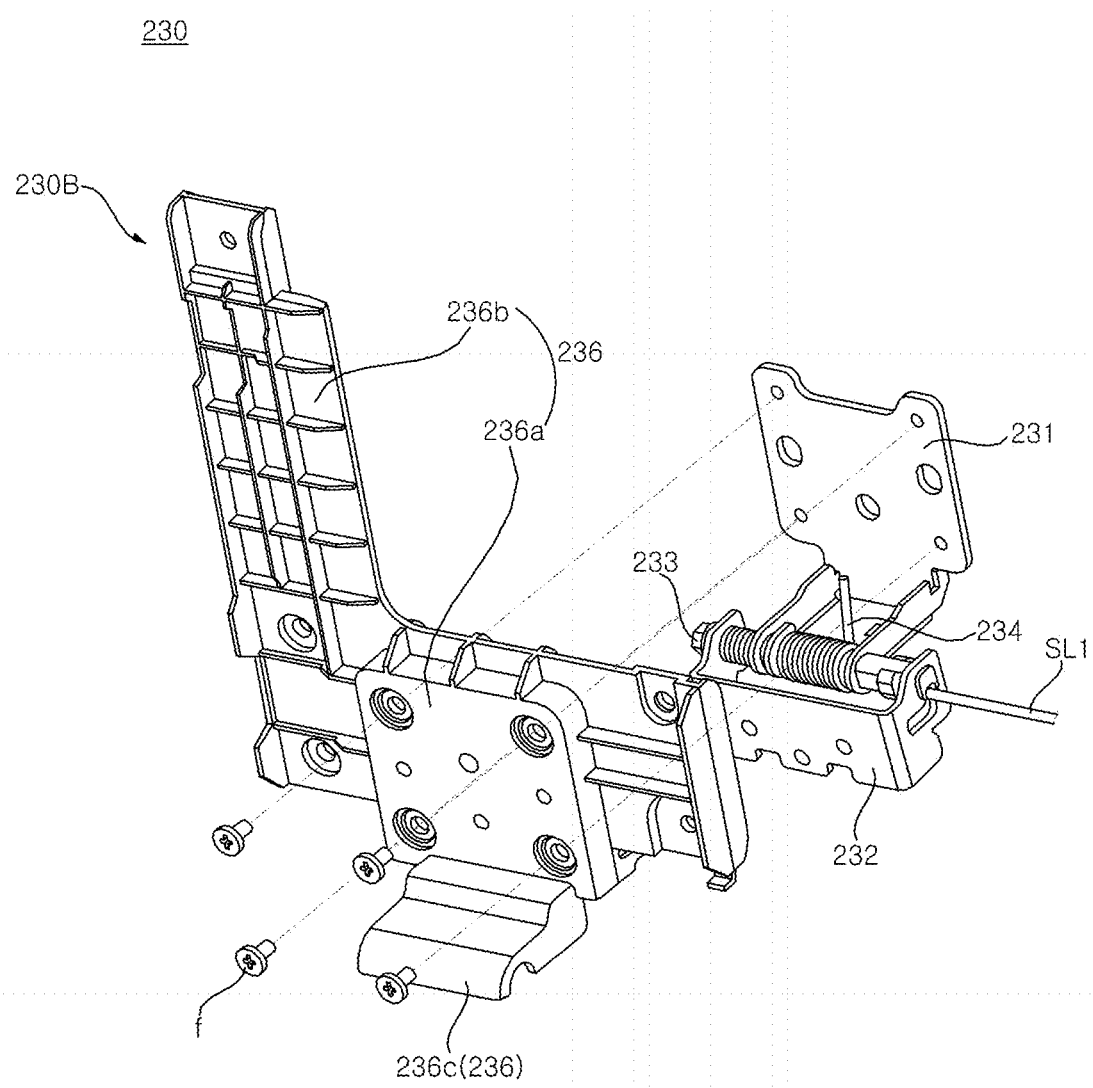
Figure 34:
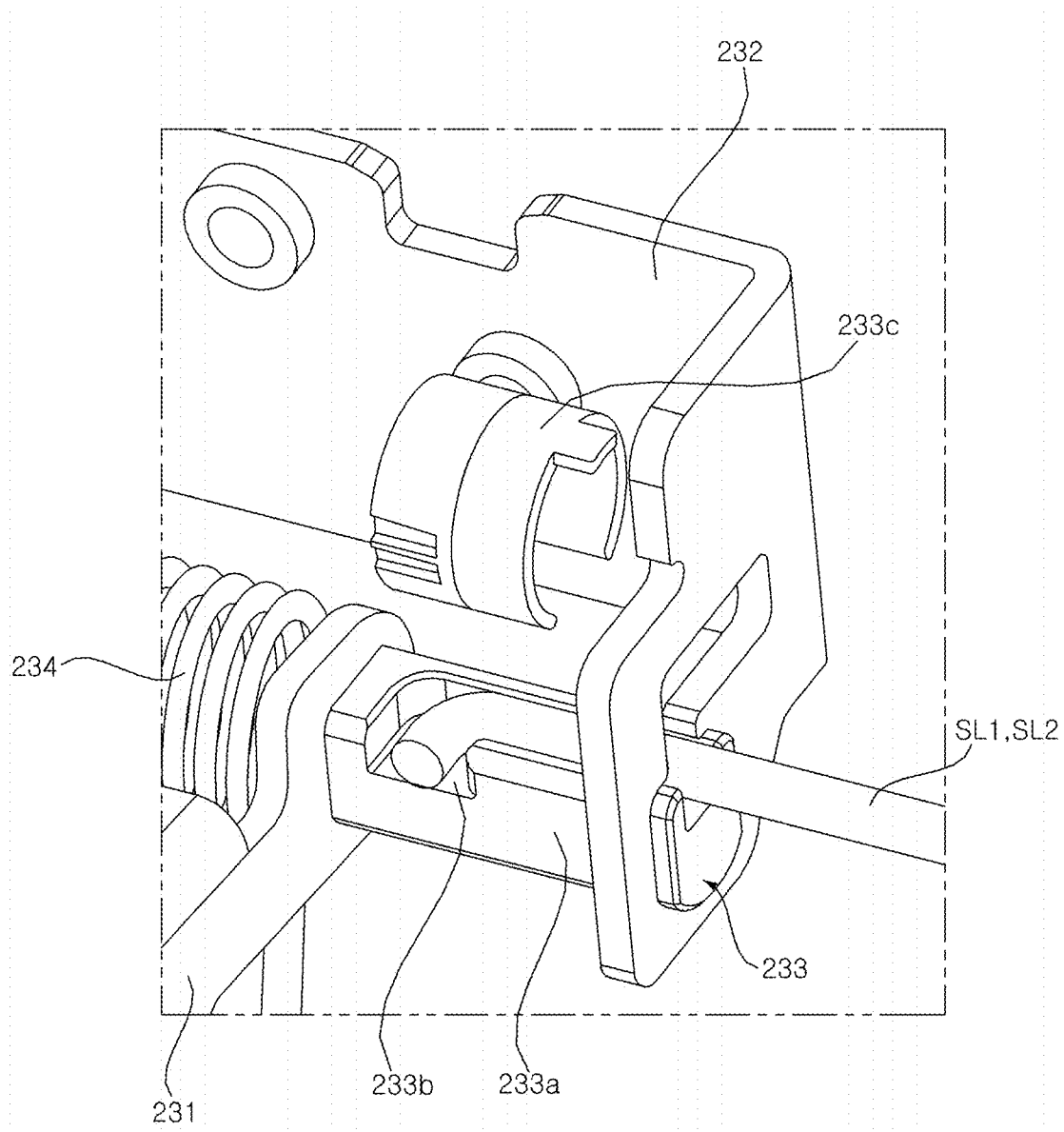

Referring to FIGS. 33 and 34, the hinge assembly 230 may include an upper bracket 231, a lower bracket 232, a hinge shaft 233, and a reinforcing member 236. The upper bracket 231 may have a curved plate shape. The upper bracket 231 and the lower bracket 232 may be connected by the hinge shaft 233. An elastic member 234 may be coupled to the hinge shaft 233. For example, the elastic member 234 may be a coil spring 234, and the hinge shaft 233 may be inserted into the coil spring 234. One end (or a first end) of the coil spring 234 may be supported by the lower bracket 232, and the other end (or a second end) of the coil spring 234 may be supported by the upper bracket 231.

The reinforcing member 236 may be referred to as a reinforcing bracket 236. The reinforcing member 236 may include a fixing part 236a and an extension part 236b. The fixing part 236a may be coupled or fixed to the upper bracket 231 by a fastening member f. The extension part 236b may extend from the fixing part 236a. The extension part 236b may have a generally L-shape. The extension part 236b may be fixed to the outer cover 210 (see FIG. 32). The reinforcing member 236 may further include a cover part 236c. The cover part 236c may extend from the fixing part 236a. The cover part 236c may cover the hinge shaft 233.

The hinge shaft 233 may include a shaft body 233a, a receiving groove 233b, and a cap 233c. The shaft body 233a may hingedly connect the upper bracket 231 to the lower bracket 232. The receiving groove 233b may be recessed inward from an outer surface of the shaft body 233a in an elongated manner. One end (or a first end) of the receiving groove 233b may be formed on a distal end of the shaft body 233a, and the other end (or a second end) of the receiving groove 233b may be formed on a side surface of the shaft body 233a. The receiving groove 233b may have a generally L-shape.

The speaker cable SL1, L2 may be routed in the receiving groove 233b. The speaker cable SL1, SL2 may be inserted into the one end of the receiving groove 233b so as to be routed to the other end of the receiving groove 233b. The cap 233c may be coupled to the shaft body 233a while covering the receiving groove 233b. The cap 233c may secure the speaker cable SL1, SL2 placed in the receiving groove 233b.

Figure 35:
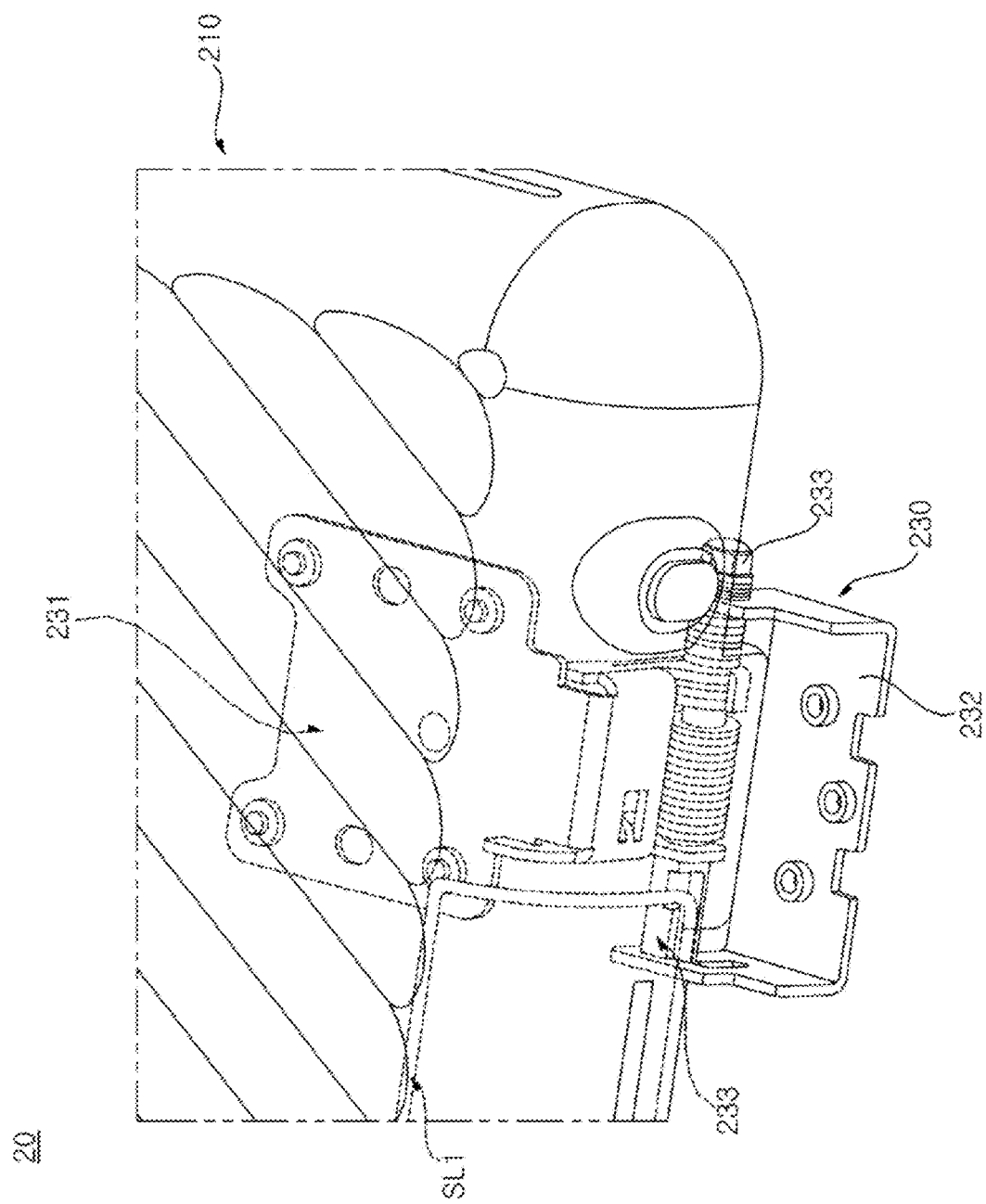
Figure 36:
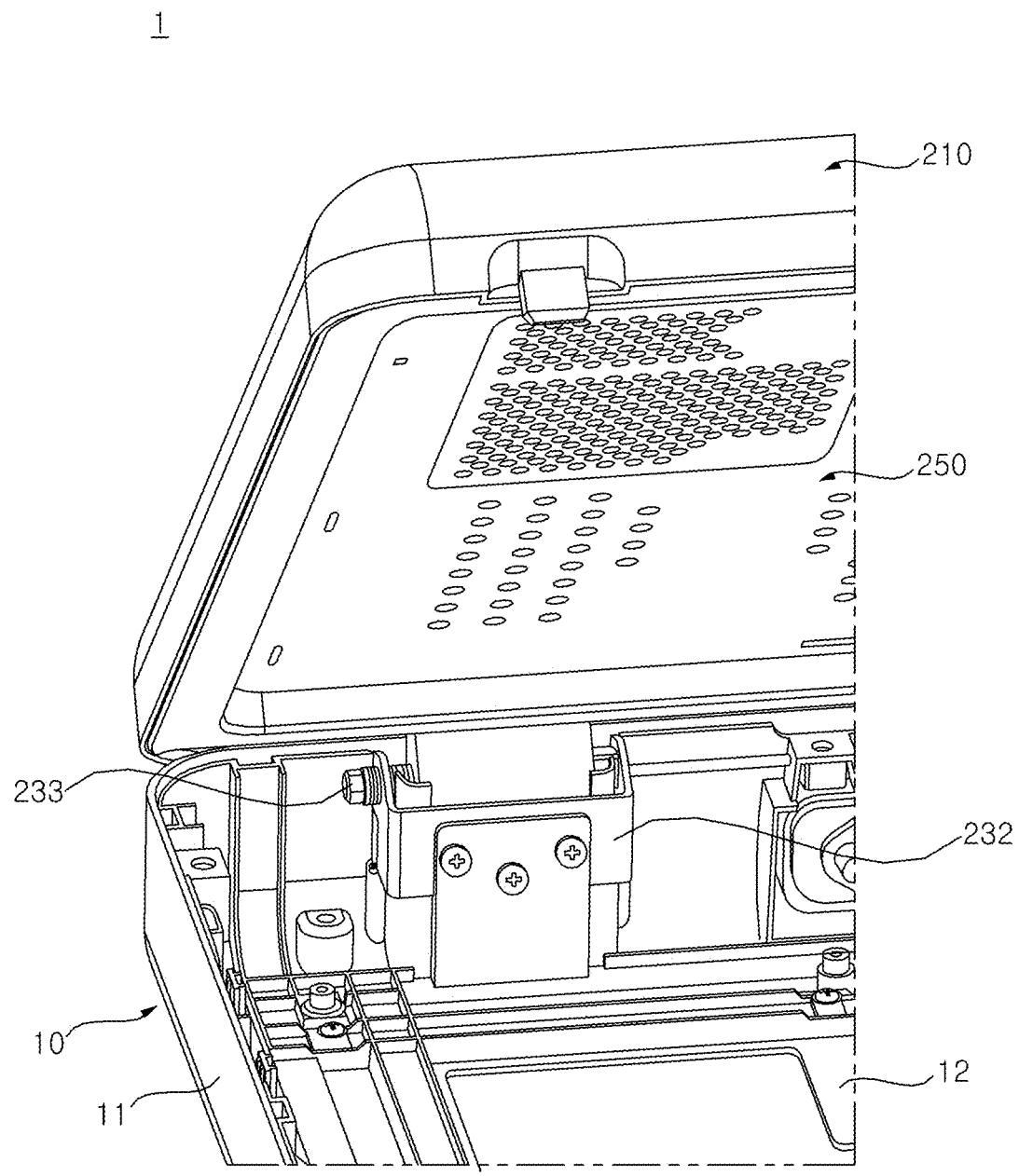

Referring to FIGS. 35 and 36, the upper bracket 231 may be fixed to an inner surface of the outer cover 210. The lower bracket 232 may be fixed to the frame 12 of the base 10.

The speaker cable SL1, SL2 (see FIG. 32) may be routed to be placed in the hinge shaft 233 of the hinge assembly 230 inside the outer cover 210. The speaker cable SL1, SL2 may be routed to the base 10 through the hinge shaft 233.

Figure 37:
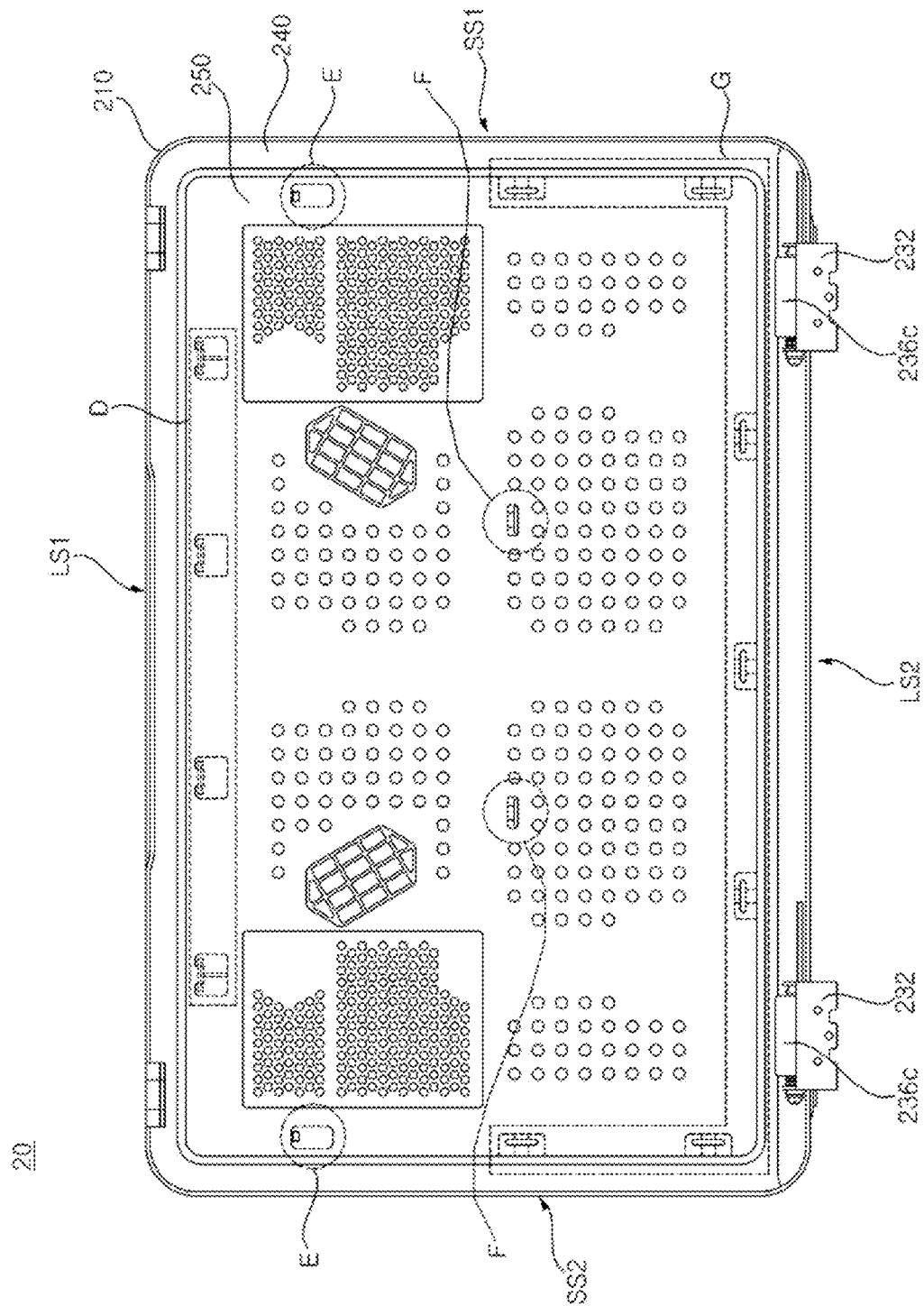

Referring to FIG. 37, the inner cover 250 may be coupled to the middle frame 240. The inner cover 250 may be detachably coupled or fixed to the middle frame 240. The inner cover 250 may be coupled to the middle frame 240 by a coupling set (D, E, F, G). A plurality of coupling sets D, E, F, and G may be provided.

A first coupling set D may be disposed along a first long side LS1 of the cover 20 while being adjacent to the first long side LS1. A second coupling set E may be disposed adjacent to a first short side SS1 and/or a second short side SS2 of the cover 20. For example, the second coupling set E may be positioned closer to the first long side LS1 than a second long side LS2 of the cover 20.

A third coupling set F may be disposed in a central region between the first long side LS1 and the second long side LS2 and/or between the first short side SS1 and the second short side SS2. A fourth coupling set G may be adjacent to the second long side LS2, and may be disposed along the second long side LS2. The fourth coupling set G may be disposed along the first short side SS1 and/or the second short side SS2.

Figure 38:
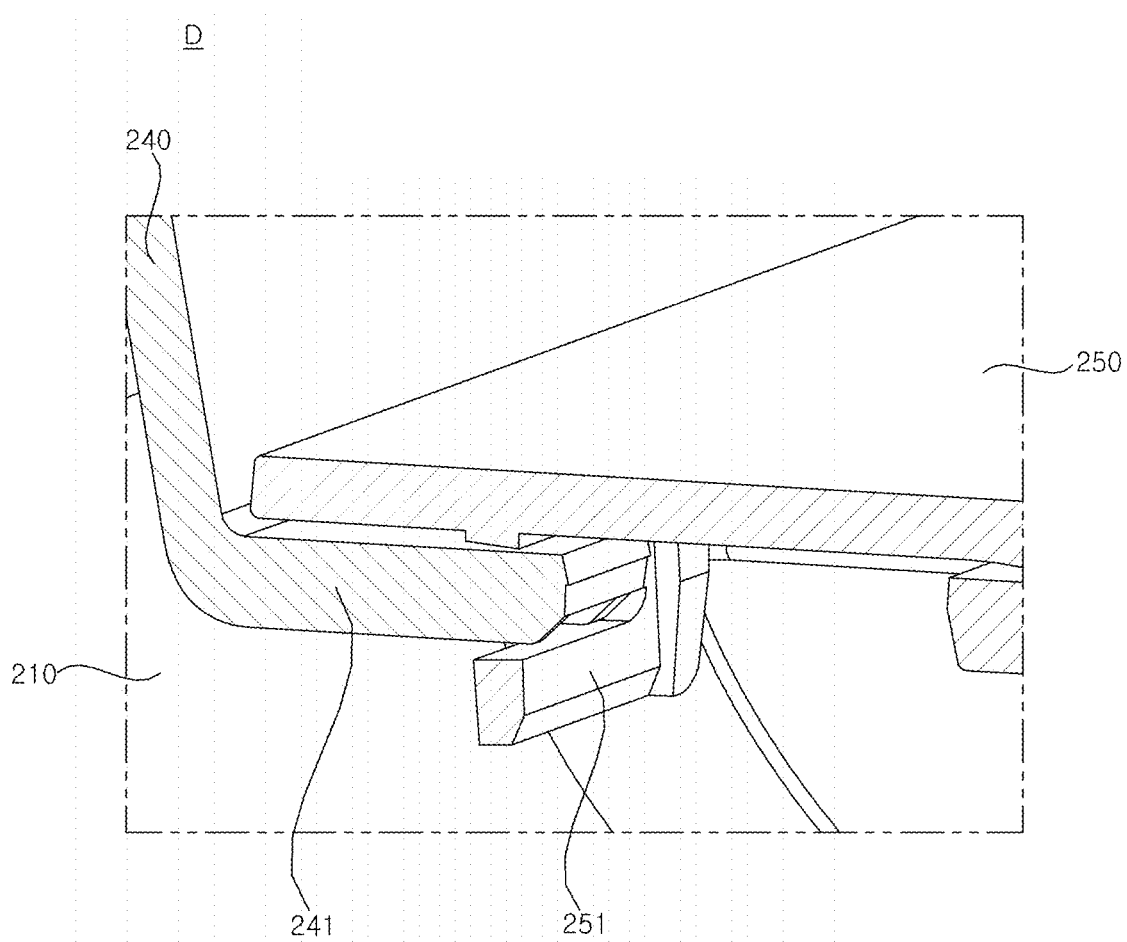

Referring to FIG. 38, the first coupling set D may include an insert tip 241 and a hold hole 251. The middle frame 240 may include the insert tip 241. The insert tip 241 may protrude and extend from the middle frame 240. The hold hole 251 may be formed on a lower surface of the inner cover 250. The hold hole 251 may have an elongated hole. The insert tip 241 may be inserted into the hold hole 251. The insert tip 241 may prevent the inner cover 250 from moving away from or being separated from the middle frame 240 when pulling the hold hole 251.

Figure 39:
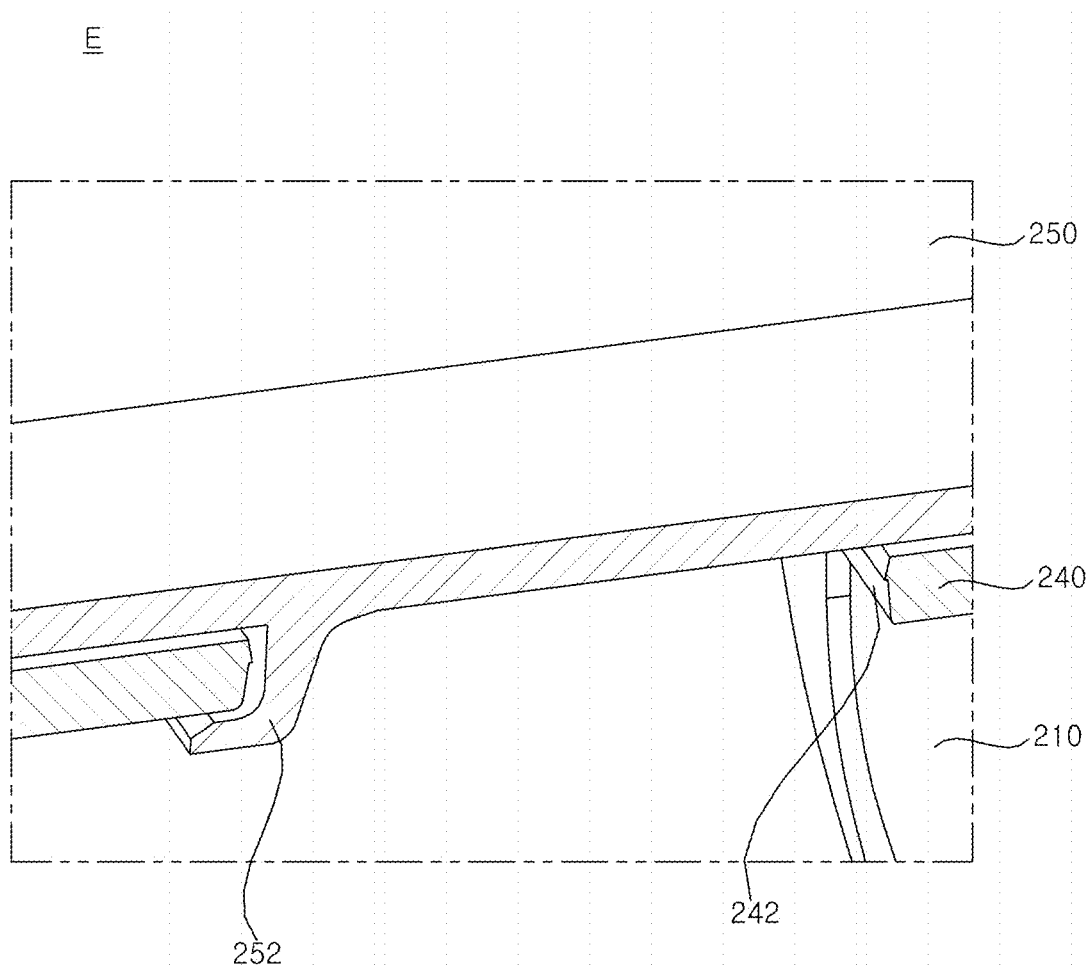

Referring to FIG. 39, the second coupling set E may include an insert hole 242 and a holder 252. The insert hole 242 may be formed in the middle frame 240. The holder 252 may protrude from an inner surface of the inner cover 250 and may then be bent. For example, the holder 252 may have a hook shape. The holder 252 may be inserted into the insert hole 242, and may hold one side of the insert hole 242. The holder 252 may prevent the inner cover 250 from moving away form or being separated from the middle frame 240 when pulling the insert hole 242.

Figure 40:
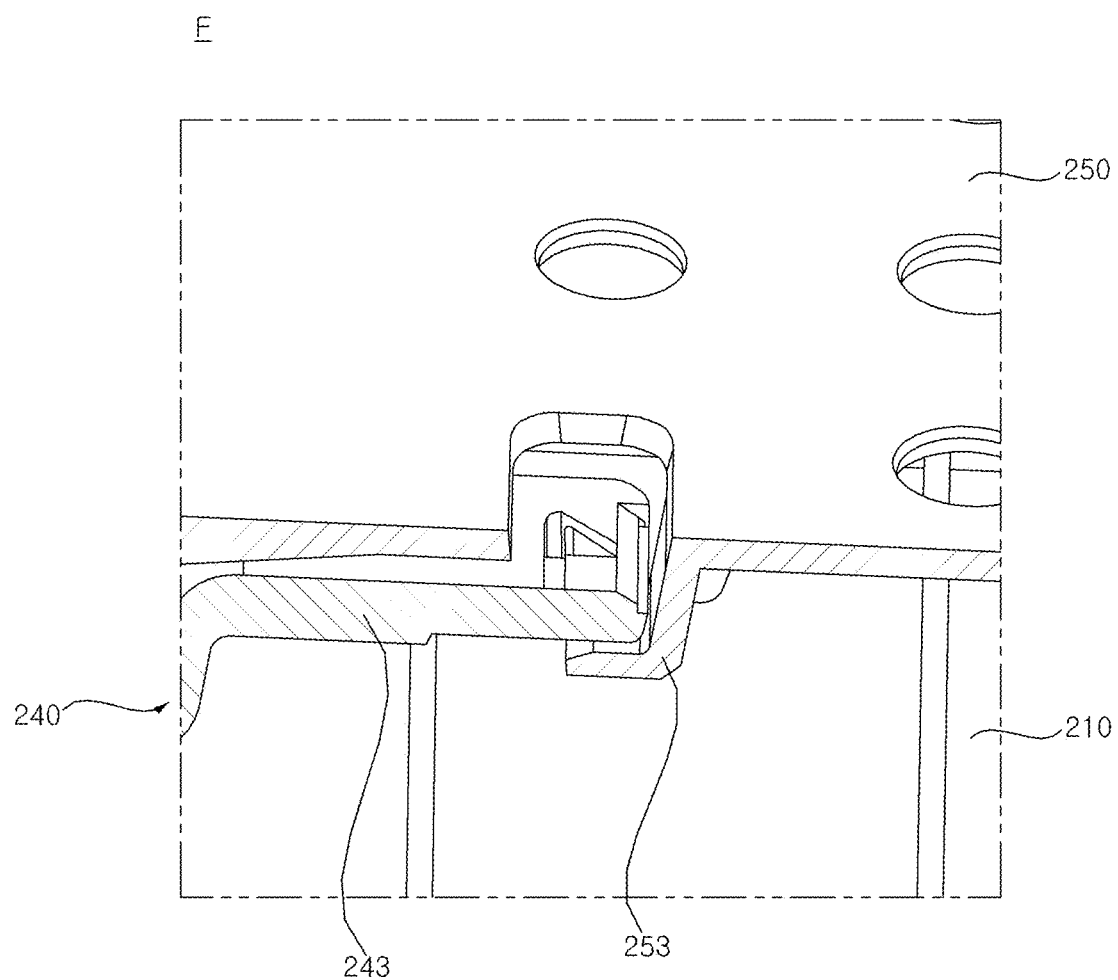

Referring to FIG. 40, the third coupling set F may include a holding tip 243 and a holding lever 253. The middle frame 240 may include the holding tip 243. The holding tip 243 may extend long from the middle frame 240. The inner cover 250 may include the holding lever 253. The holding lever 253 may protrude from an inner surface of the inner cover 250 and may then be bent. The holding tip 243 may be placed on the holding lever 253. The holding tip 243 may prevent the inner cover 250 from moving away from or being separated from the middle frame 240 when pulling the holding lever 253.

Figure 41:
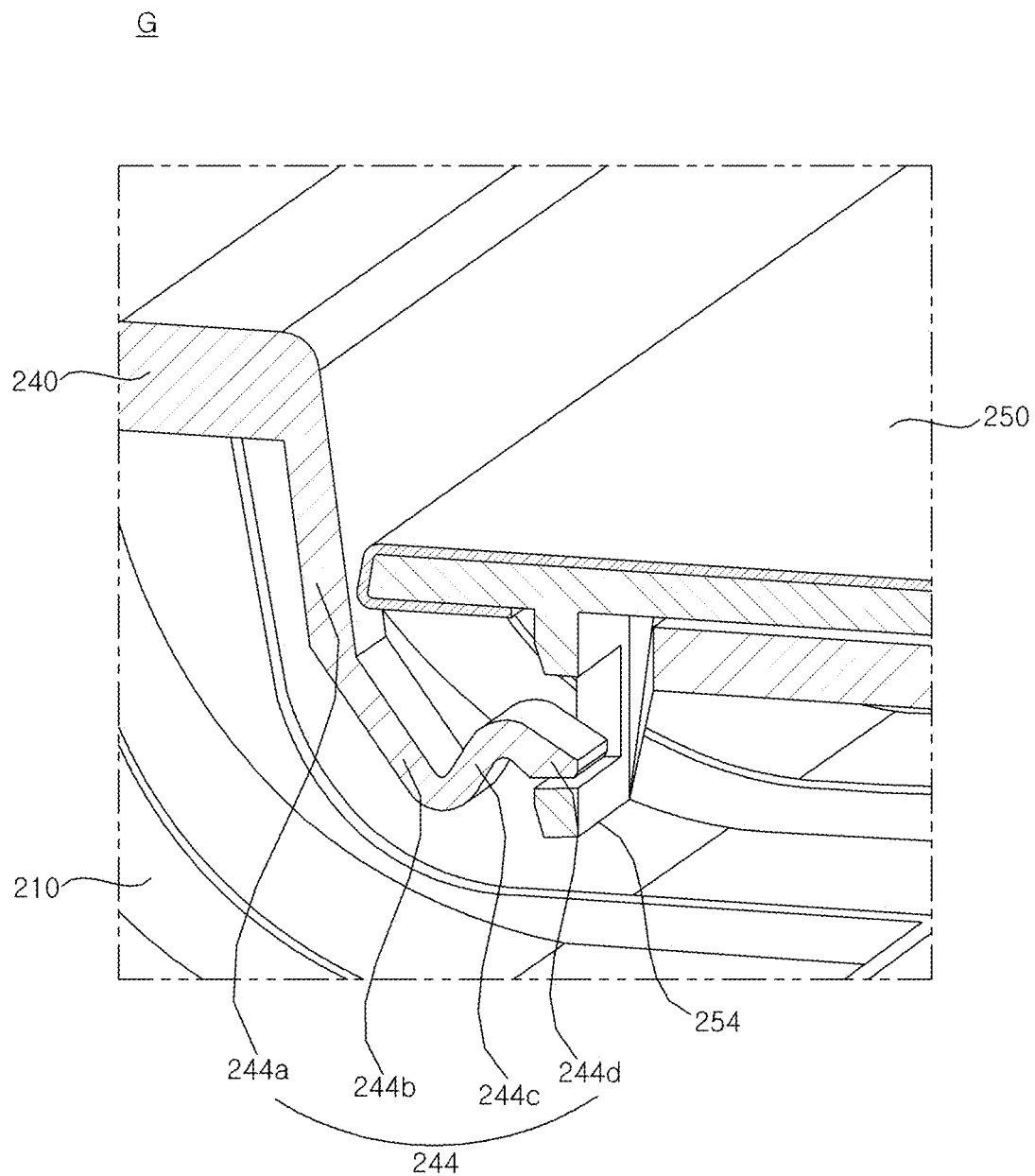

Referring to FIG. 41, the fourth coupling set G may include a moving lever 244 and a lever hole 254. The inner cover 250 may include the lever hole 254, and the moving lever 244 may extend from the middle frame 240. The lever hole 254 may protrude from an inner surface of the inner cover 250. The moving lever 244 may be inserted into the lever hole 254 of the inner cover 240. The moving lever 244 may include a first part 244a, a second part 244b, a third part 244c, and a fourth part 244d. The first part 244a may protrude and extend from the middle frame 240. The second part 244b may be bent and extend from the first part 244a to form a first angle. For example, the first angle may be an obtuse angle. The third part 244c may be bent and extend from the second part 244b to form a second angle. For example, the second angle may be an acute angle. The fourth part 244d may be bent and extend from the third part 244c to form a third angle. For example, the third angle may be greater than the second angle and less than the first angle. The fourth part 244d may be engaged into the lever hole 254. A user may insert a tool between the inner cover 250 and the middle frame 240 to push the first part 244a and/or the second part 244b, thereby removing the moving lever 244 from the lever hole 254.

Figure 42:
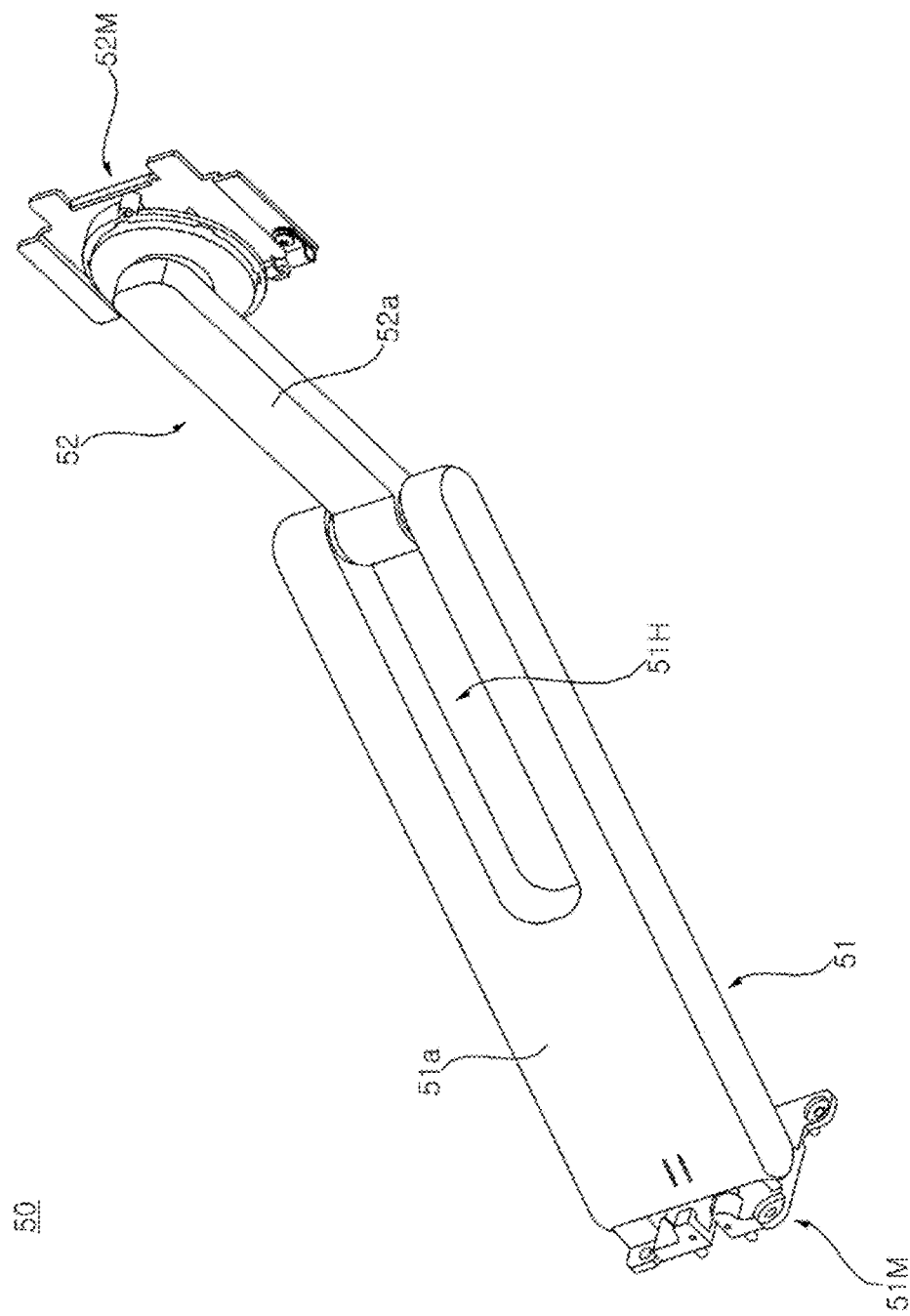

Referring to FIG. 42, the arm 50 may include an upper arm 52 and a lower arm 51. The upper arm 52 may be pivotally connected to the lower arm 51. One end (or a first end) of the upper arm 52 may be pivotally connected to the lower arm 51, and the other end (or a second end) of the upper arm 52 may be connected to a head mount 52M. The head mount 52M may rotate on the upper arm 52. One end (or a first end) of the lower arm 51 may be pivotally connected to the upper arm 52, and the other end (or a second end) of the lower arm 51 may be pivotally connected to a bottom mount 51M. For example, the length of the lower arm 51 may be greater than the length of the upper arm 52.

The lower arm 51 may include a storage groove 51H. An outer surface of the lower arm 51 may be recessed to define the storage groove 51H. When the upper arm 52 rotates by pivoting on the lower arm 51, the upper arm 52 may be inserted into the storage groove 51H. The length of the storage groove 51H may be greater than the length of the upper arm 52. The width of the storage groove 51H may be substantially the same as the width of the upper arm 52. When the upper arm 52 is inserted into the storage groove 51H, a clearance may be formed between the upper arm 52 and the storage groove 51H.

Figure 43:
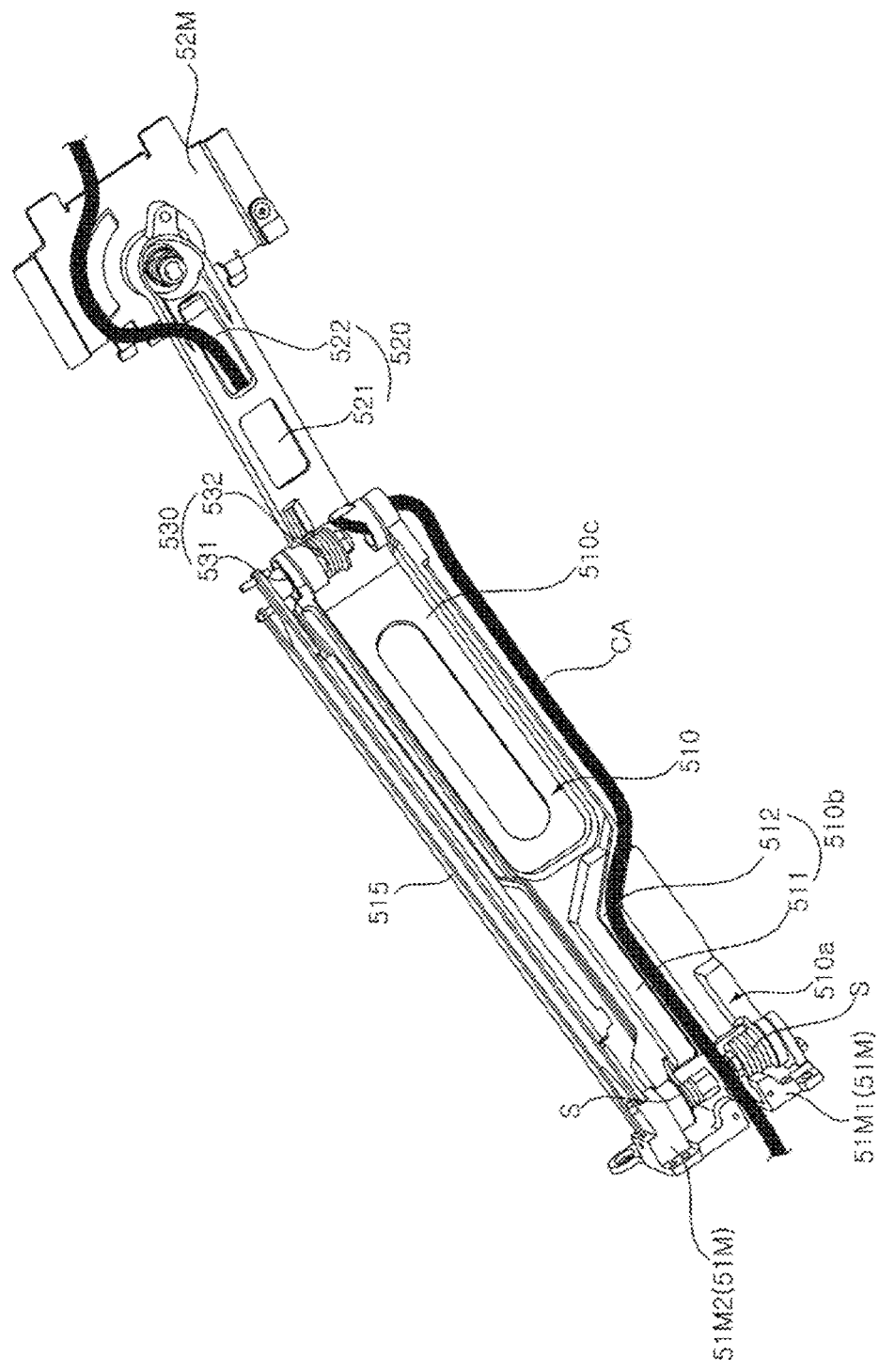
Figure 44:
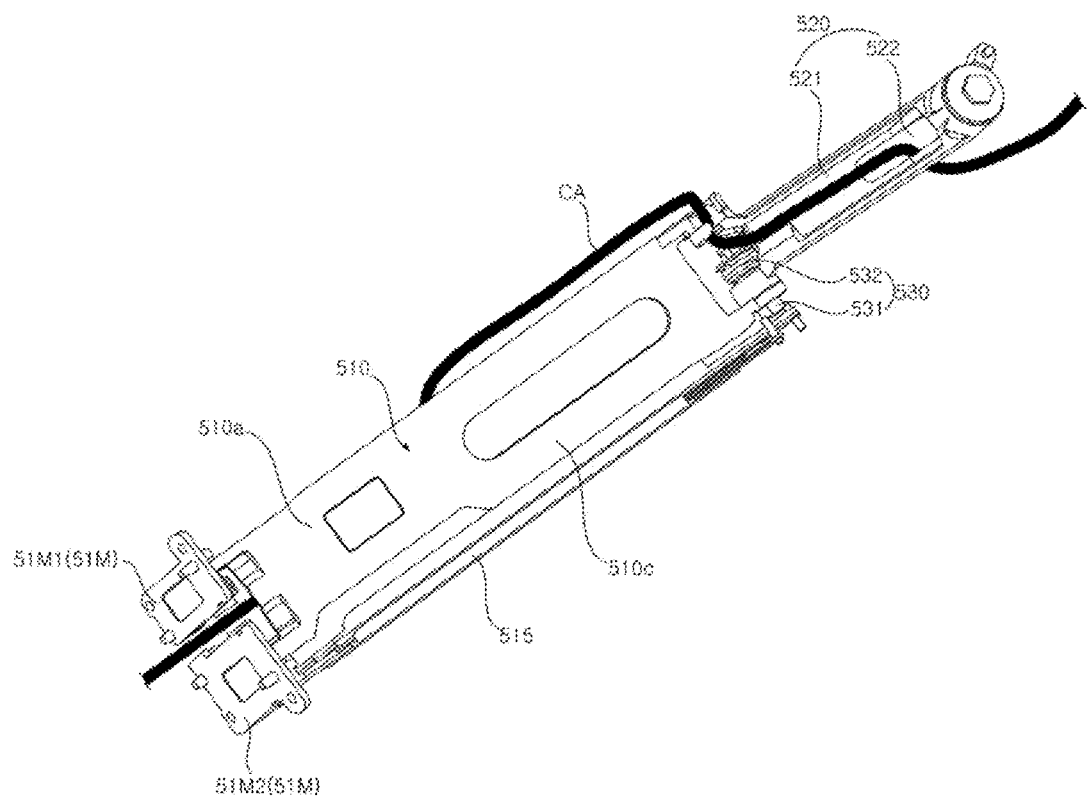

Referring to FIGS. 43 and 44, the lower arm 51 (see FIG. 42) may include an inner frame 510 and an outer cover 51a (see FIG. 42). The inner frame 510 may be referred to as a first inner frame 510 or a lower inner frame 510, and the outer cover 51a may be referred to as a first outer cover 51a or a lower outer cover 51a.

The inner frame 510 may include a lower part 510a and an upper part 510c. The lower part 510a may be pivotally connected to the bottom mount 51M. The upper part 510c may extend from the lower part 510a. The upper part 510c may be connected to the upper arm 52 by a hinge assembly 530. The hinge assembly 530 may be referred to as an arm hinge 530. The upper part 510c may have a portion that is open or recessed inward, and the storage groove 51H (see FIG. 42) of the outer cover 51a (see FIG. 42) may be disposed at the recessed portion inside the upper part 510c.

The lower part 510a may include a wiring groove 510b. The wiring groove 510b may be formed on one surface of the lower part 510a. The wiring groove 510b may be referred to as a wiring portion 510b or a cable groove 510b. The wiring groove 510b may include a first trench 511 and a second trench 512. The first trench 511 may form a step descending from an outer surface of the lower part 510a. The second trench 512 may form a step descending from the first trench 511. The wiring groove 510b may extend from a lower end of the lower part 510a while being bent to a lateral side of the lower part 510a.

The upper arm 52 (see FIG. 42) may include an inner frame 520 and an outer cover 52a (see FIG. 42). The inner frame 520 may be referred to as a second inner frame 520 or an upper inner frame 520, and the outer cover 52a may be referred to as a second outer cover 52a or an upper outer cover 52a.

The inner frame 520 may have a beam shape or a rod shape. The inner frame 520 may include a rod body 521 and an opening 522. The rod body 521 may be elongated, and the opening 522 may be formed through the rod body 521. One end (or a first end) of the rod body 521 may be pivotally connected to the upper part 510c by the arm hinge 530. The head mount 52M may be rotatably coupled to the other end (or a second end) of the rod body 521.

The arm hinge 530 and the bottom mount 51M may be connected by a link 515. The bottom mount 51M may include a first piece 51M1 and a second piece 51M2. The first piece 51M1 may be hinge-connected to the first inner frame 510, and the second piece 51M2 may also be hinge-connected to the first inner frame 510. The first piece 51M1 and/or the second piece 51M2 may be hinge-connected to the first inner frame 510 together with an elastic member S.

A cable CA may pass between the first piece 51M1 and the second piece 51M2 of the bottom mount 51M to be placed in the wiring groove 510b of the first inner frame 510. The cable CA may be disposed in the first trench 511 and/or the second trench 512 of the wiring groove 510b. The cable CA may pass through the wiring groove 510b to be inserted into or penetrate through a connecting portion between the first inner frame 510 and the second inner frame 520 while being adjacent to the arm hinge 530. The cable CA that extends to the second inner frame 520 may extend to the head mount 52M through the opening 522 while covering the rod body 521.

Figure 45:
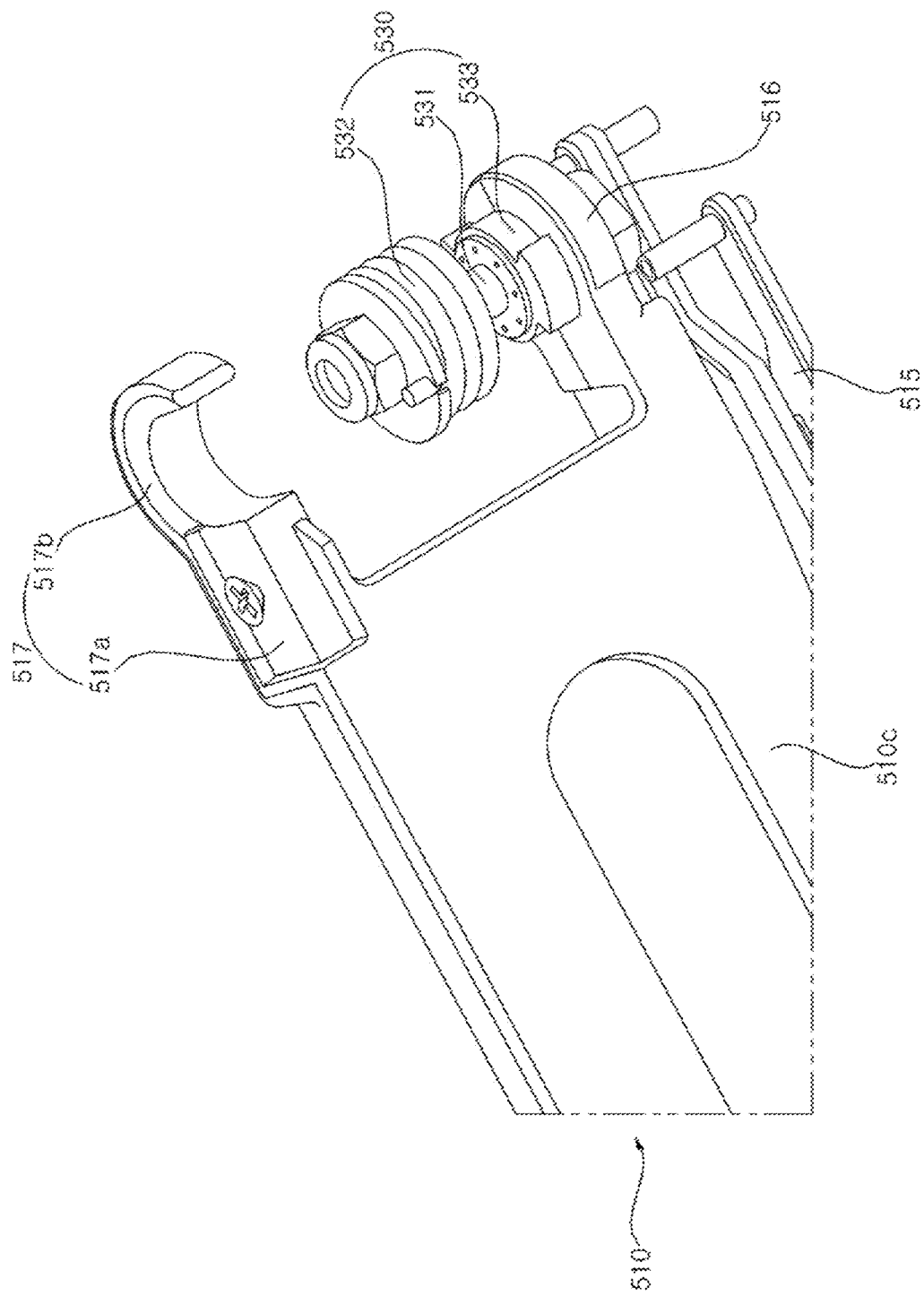
Figure 46:
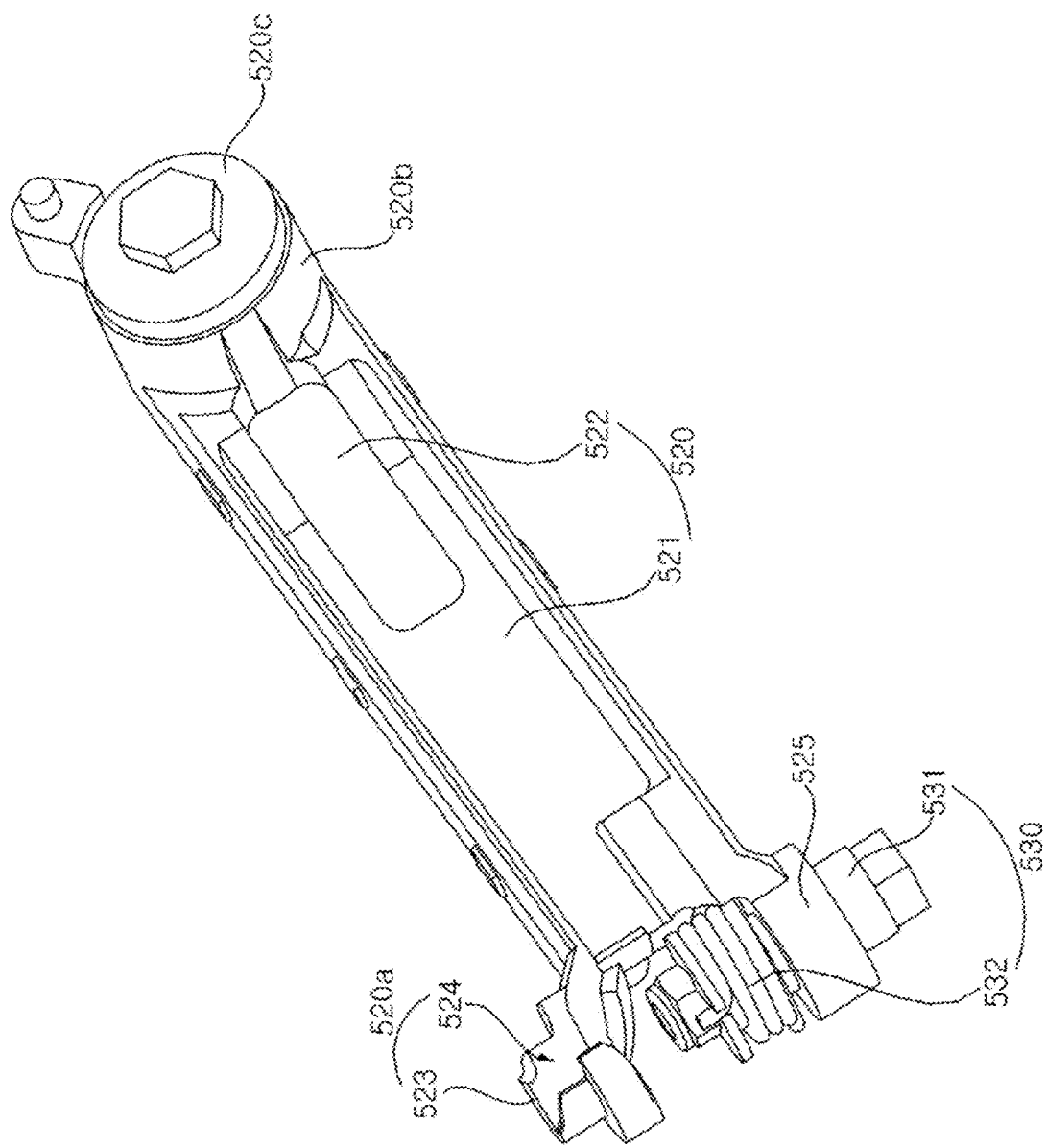

Referring to FIGS. 45 and 46, the first inner frame 510 may include a first connecting portion 516 and a second connecting portion 517. The first connecting portion 516 may be formed at an end of the upper part 510c of the first inner frame 510. For example, the first connecting portion 516 may have an annular shape or a ring shape. The second connecting portion 517 may be formed at an end of the upper part 510c of the first inner frame 510, and may face or be opposite the first connecting portion 516. For example, the second connecting portion 517 may have an annular shape. A portion or part of the second connecting portion 517 may be open.

The arm hinge 530 may include a hinge shaft 531, a hinge cam 533, and an elastic member 532. The hinge shaft 531 may be fixed to the first connecting portion 516. The hinge cam 533 may rotate on the hinge shaft 531. The elastic member 532 may provide an elastic force to the rotation of the hinge cam 533.

The second inner frame 520 may include a first connecting portion 525 and a second connecting portion 520a. The first connecting portion 525 may be formed at an end of the rod body 521. For example, the first connecting portion 525 may have an annular or ring shape. The second connecting portion 520a may be formed at an end of the rod body 521, and may face or be opposite the first connecting portion 525. For example, the second connecting portion 520a may have an annular shape. The second connecting portion 520a may have an open ring shape. A portion or part of the second connecting portion 520a may be open. The second connecting portion 520a may include a circle or circular part 523 and an open part 524. The circular part 523 may be fixed to an end of the rod body 521 of the second inner frame 520, and the open part 524 may be an open portion that is connected to the circular part 523.

The arm hinge 530 may be coupled to the second inner frame 520. The hinge cam 533 of the arm hinge 530 may be fixed to the second inner frame 520 so as to rotate together with the second inner frame 520. Accordingly, when the second inner frame 520 pivots with respect to the first inner frame 510, the arm hinge 530 may provide an elastic force to a pivoting movement of the second inner frame 520.

Figure 47:
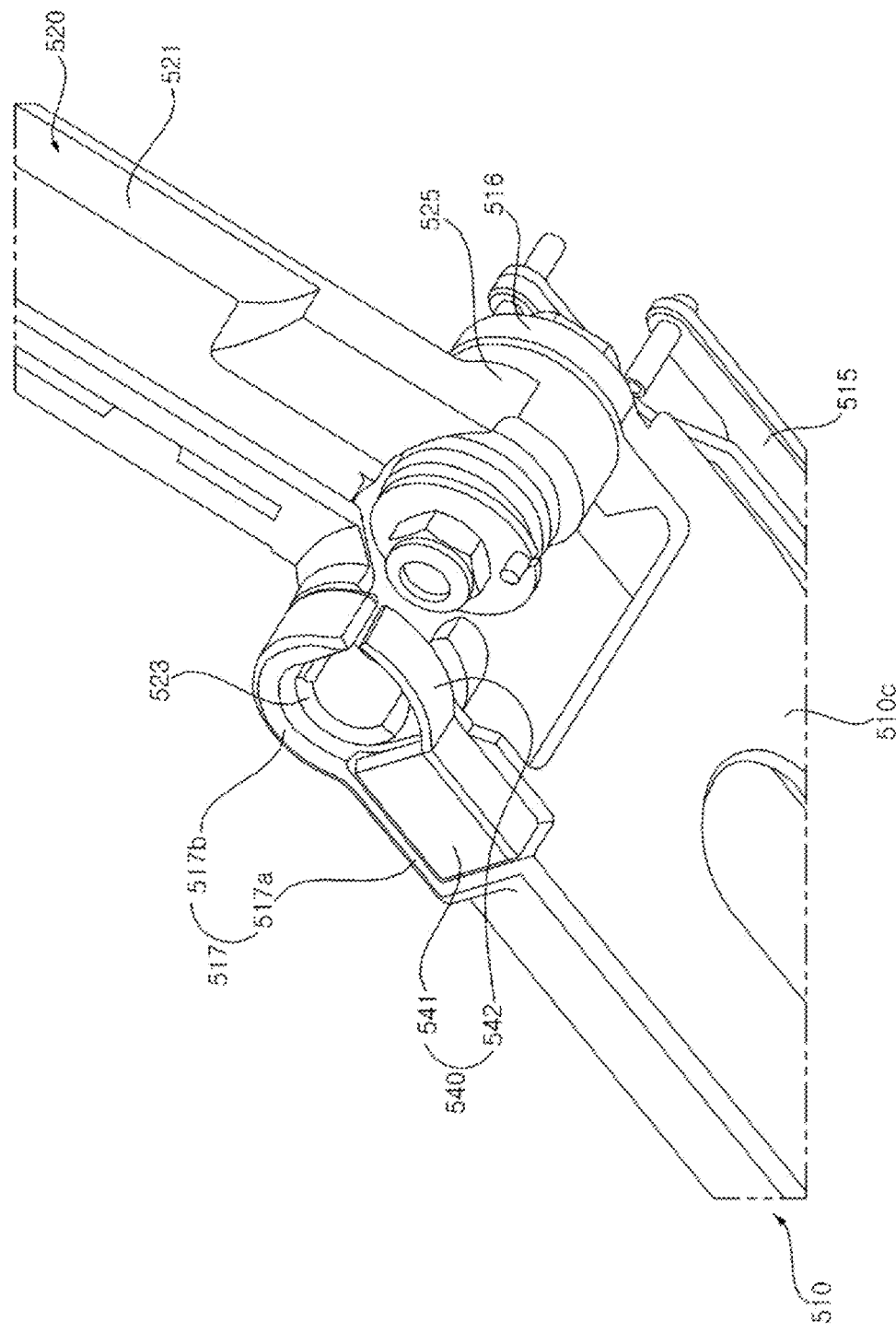
Figure 48:
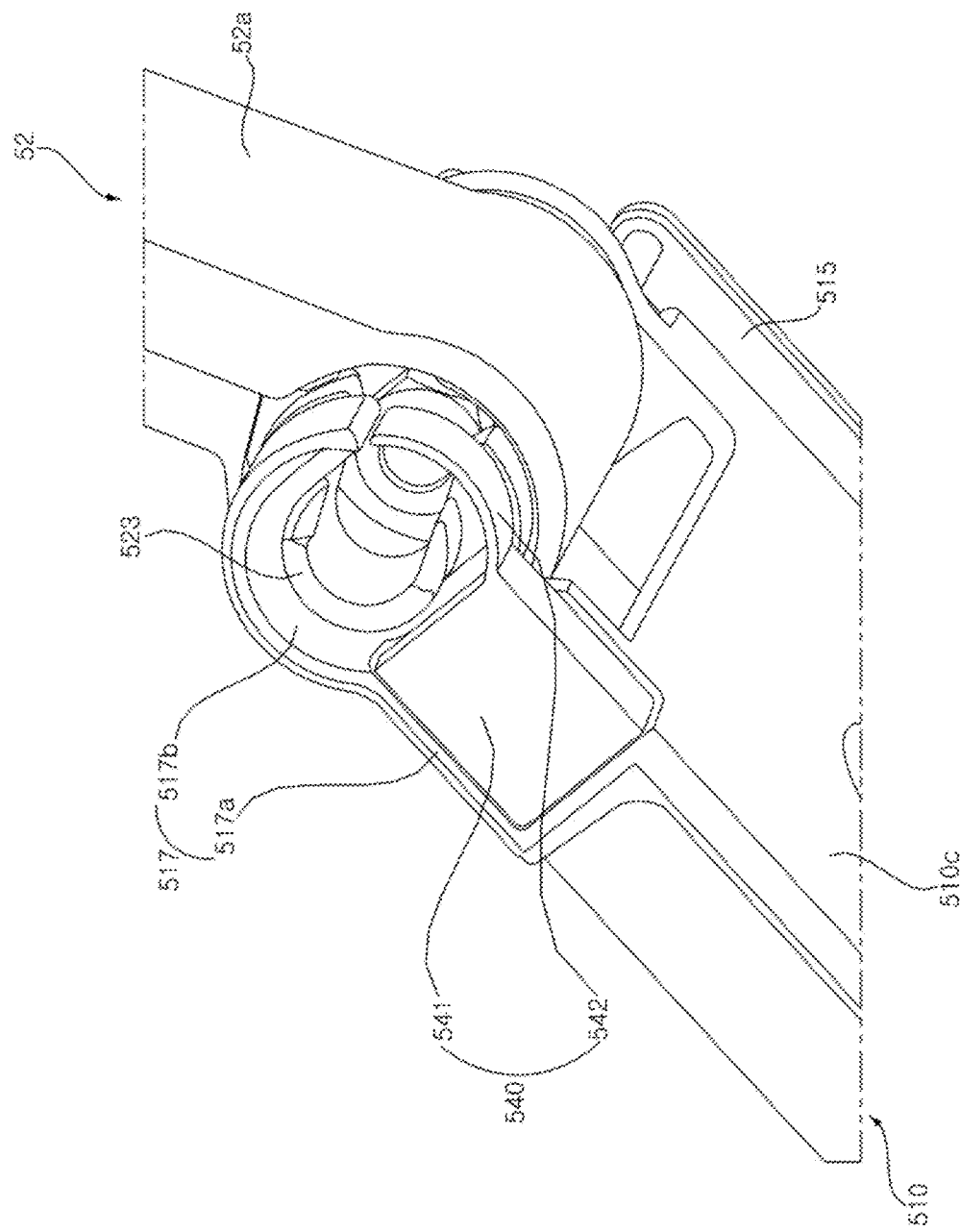

Referring to FIGS. 47 and 48, a cable holder 540 may be coupled to the second connecting portion 517 of the first inner frame 510. The second connecting portion 517 may include a holder mount 517a and a finger 517b. The holder mount 517a may be formed at an end of the upper part 510c of the first inner frame 510. The finger 517b may extend from the holder mount 517a in a curved manner. For example, the finger 517b may have a fan shape. The finger 517b may be an open ring.

The cable holder 540 may include a mounting block 541 and a holder tip 542. The mounting block 541 may be coupled or fixed to the holder mount 517a. The holder tip 542 may extend from the mounting block 541 in a curved or bent manner. The holder tip 542 may be connected to the finger 517b. For example, the holder tip 542 and the finger 517b may generally form a circle. The circle defined by the holder tip 542 and the finger 517b may be aligned with the circular part 523 of the upper arm 52. The cable CA (see FIG. 43) may be inserted into the circle, which is defined by the holder tip 542 and the finger 517b, and the circular part 523 of the upper arm 52 via the open part 524, so as to be routed from the lower arm 51 to the upper arm 52.

Figure 49:
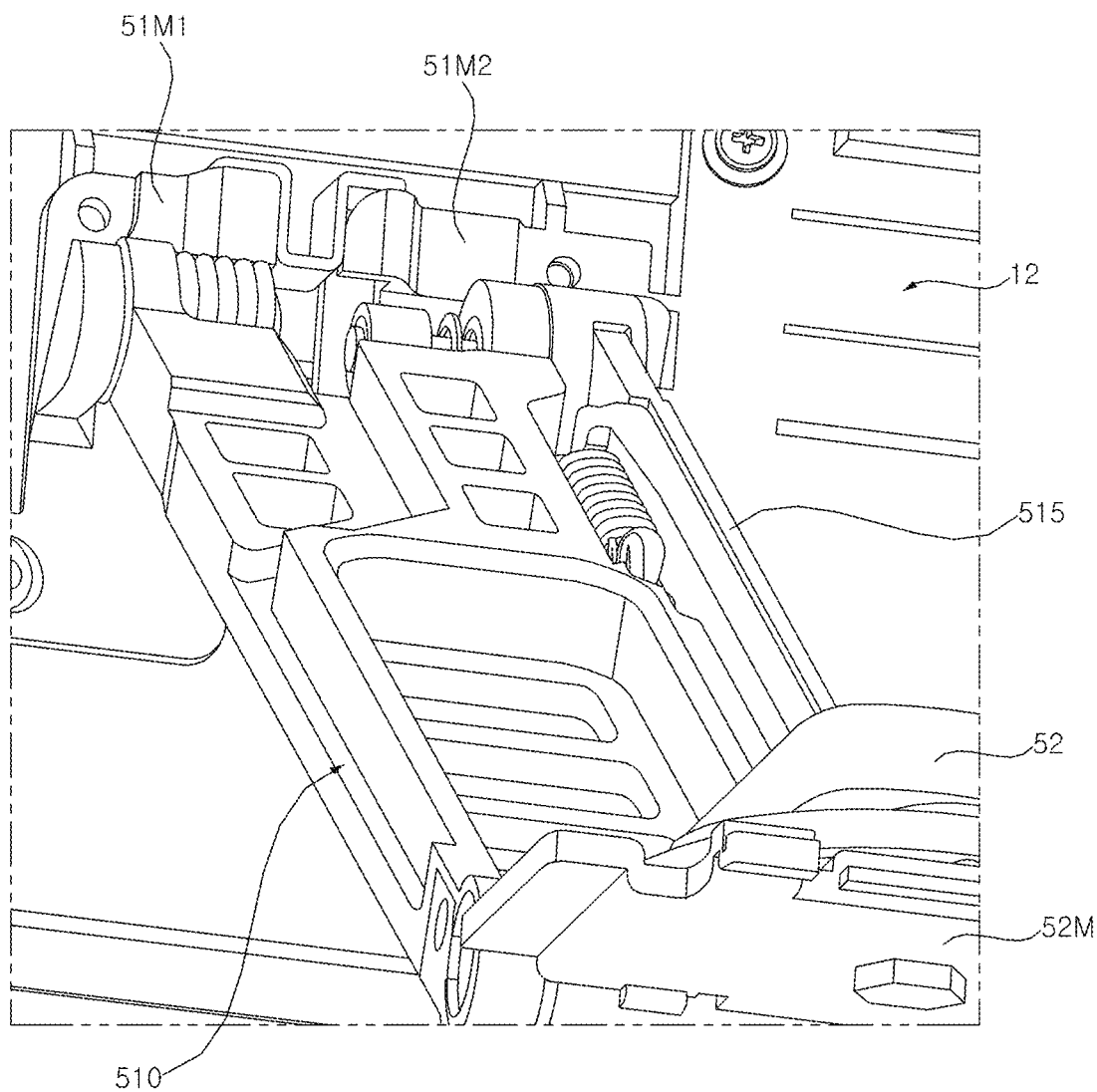
Figure 50:
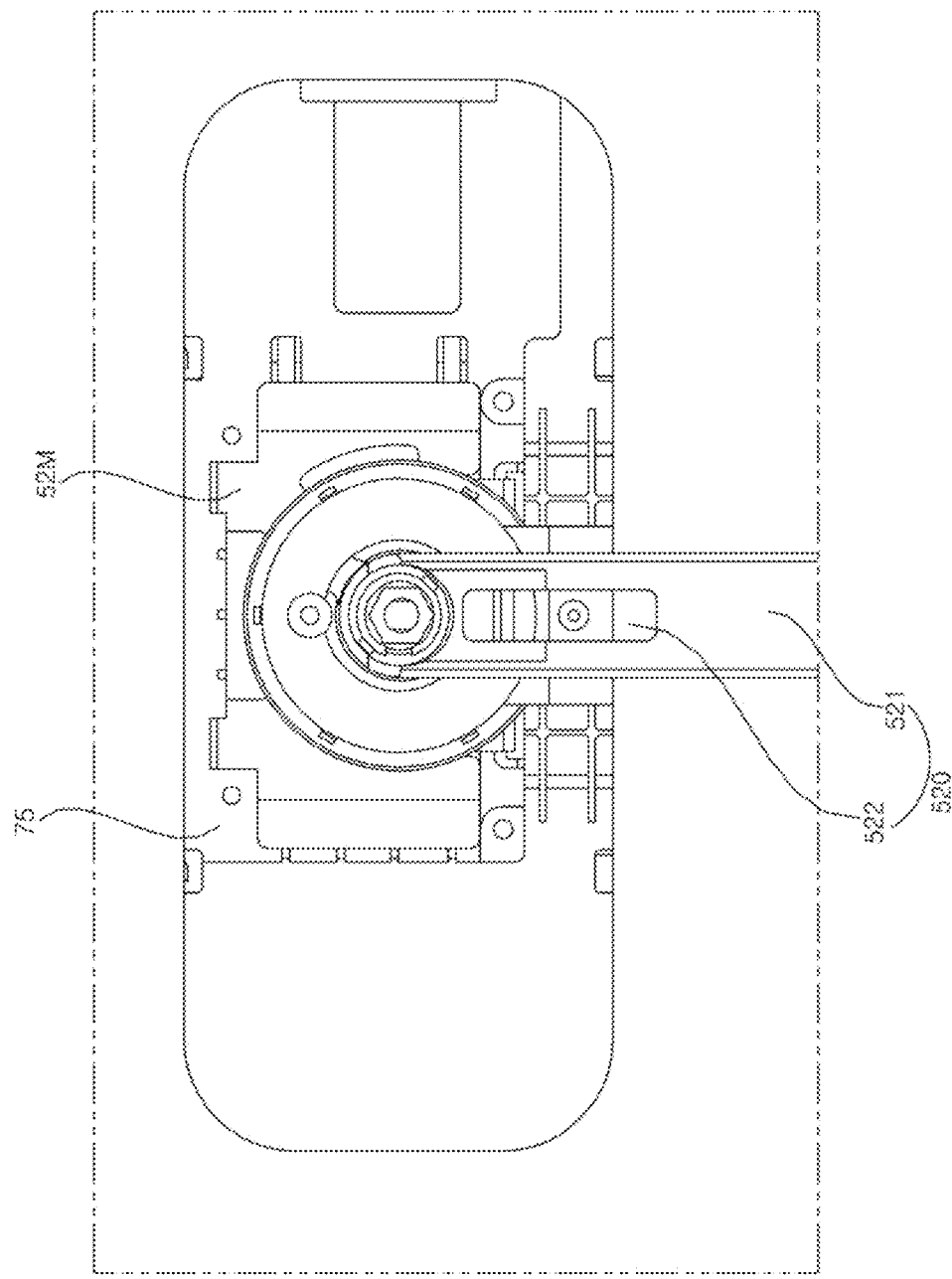

Referring to FIGS. 49 and 50, the bottom mount 51M1, 51M2 of the first inner frame 510 may be coupled or fixed to the frame 12 of the base 10. The first inner frame 510 may be pivoted with respect to the frame 12. The head mount 52M may be coupled or fixed to the frame 75 of the display 70.

Further referring to FIG. 19 and FIG. 42, the arm 50 may allow the display 70 to be stored in the base 10 or stand upright from the base 10. In addition, the display 70 may rotate with respect to the upper arm 52.

Figure 51:
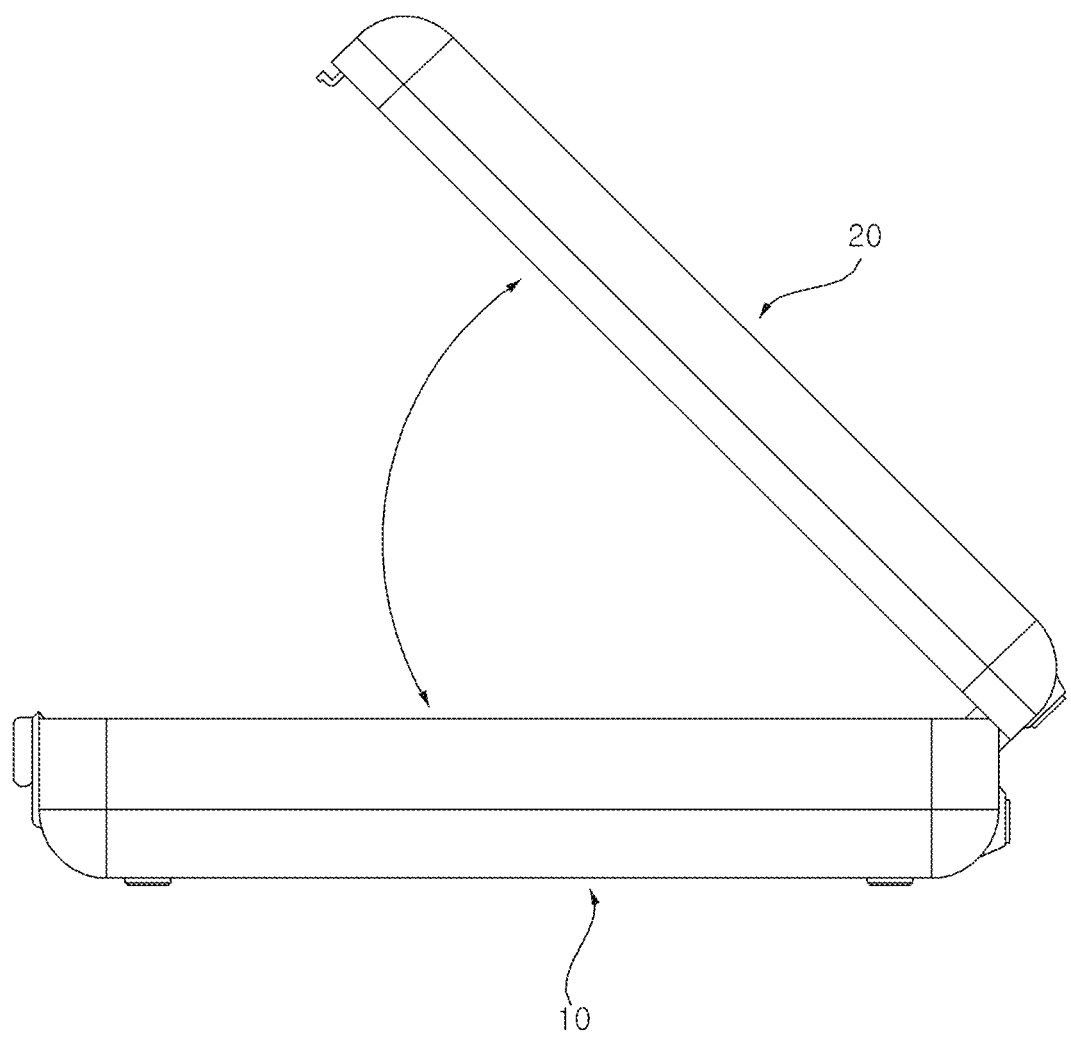
Figure 52:
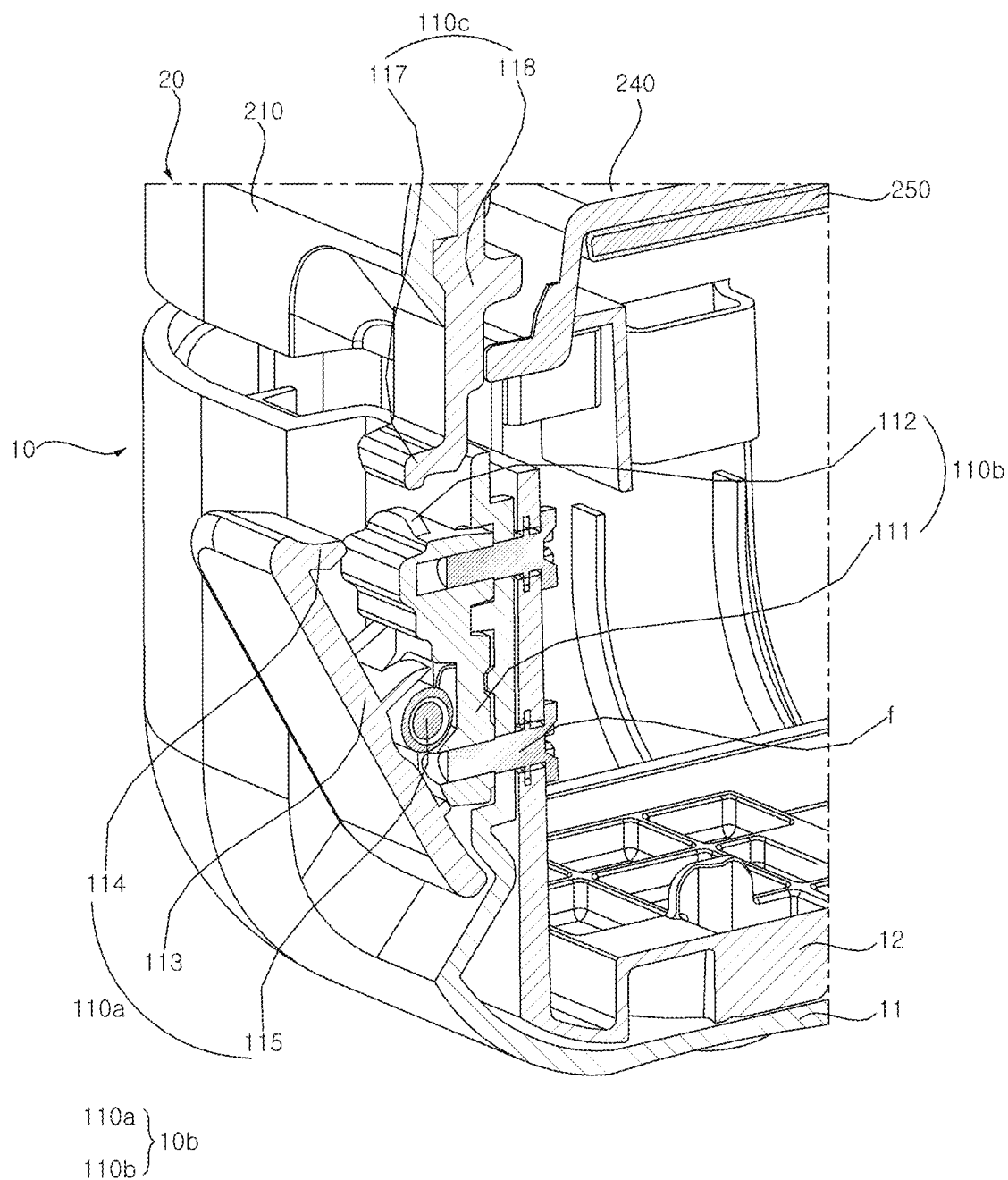
Figure 53:
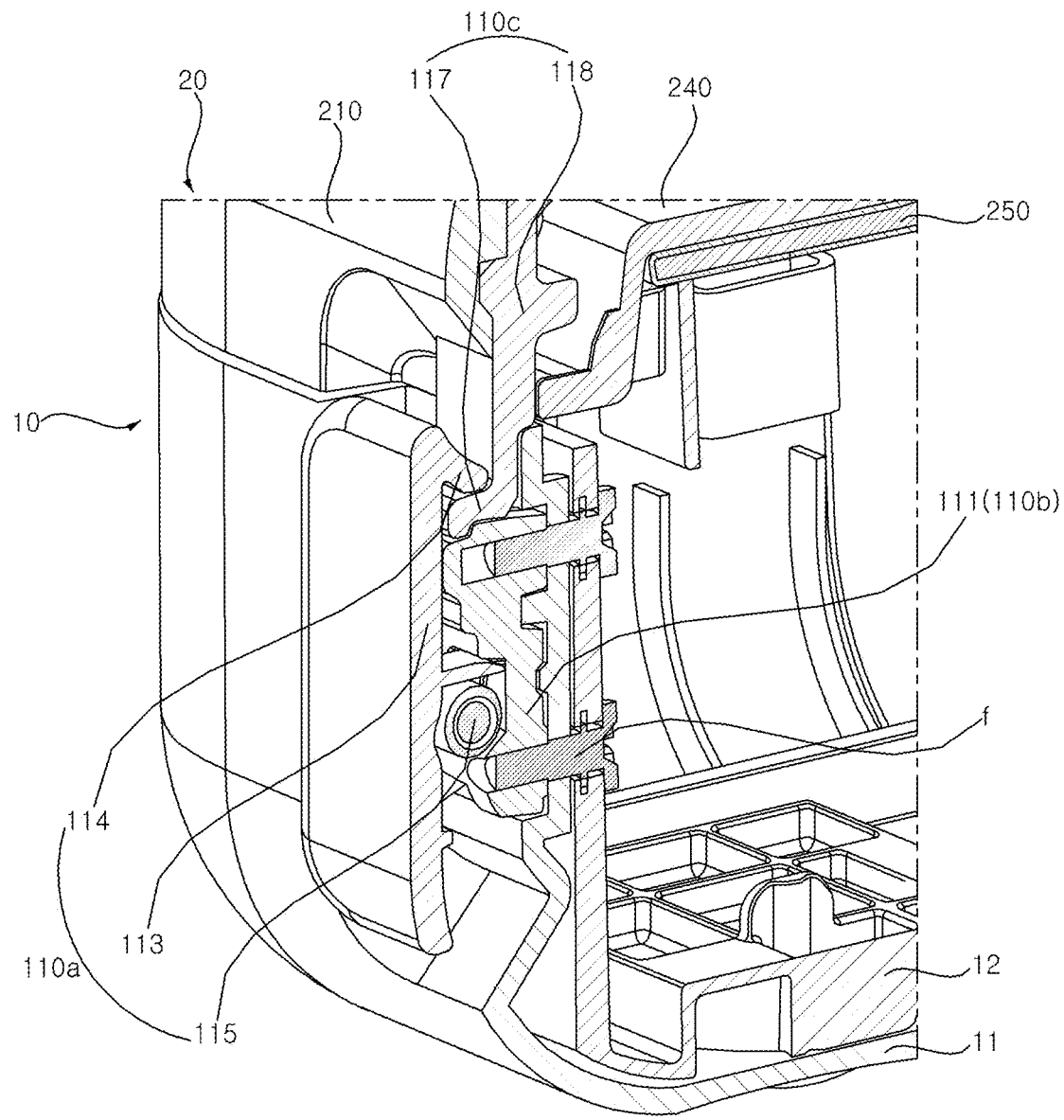

Referring to FIGS. 51 to 53, the locking unit 10a, 10b may include a lower body 110b, an upper body 110c, and a lock lever 110a. The lower body 110b may be coupled to an outer surface of the bottom 11 of the base 10. The lower body 110b may be coupled or fixed to the frame 12 by a fastening member f. The upper body 110c may be positioned between the outer cover 210 and the middle frame 240 of the cover 20, and may be coupled or fixed to the outer cover 210. The upper body 110c may extend long from the cover 20 toward the base 10.

The lower body 110b may include a fixing portion 111 that is in contact with the outer surface of the bottom 11 of the base 10 and is fixed to the frame 12, and a lower rib 112 that protrudes from a top surface of the fixing portion 111 and faces the upper body 110c.

The upper body 110c may include a fixing portion 118 that is fixed to the outer cover 210 of the cover 20, and an upper hook 117 that extends long from the fixing portion 118 to be bent toward the lock lever 110a and is engaged with the lower rib 112.

The lock lever 110a may include a lever body 113, a locking hook 114, and a pivot shaft 115. The lever body 113 may be elongated, and may be configured to seesaw, pivot, or tilt with respect to the lower body 110b. The pivot shaft 115 may connect the lever body 113 of the lock lever 110a to the lower body 110b. The lock lever 110a may perform a pivoting, tilting, or seesaw movement about the pivot shaft 115 with respect to the lower body 110b. The locking hook 114 may be formed at an upper end of the lever body 113, and may be bent from the lever body 113 toward the lower body 110b and/or the upper body 110c.

When the cover 20 is closed while covering the base 10, the upper hook 117 of the upper body 110c may be brought into contact with or be engaged with the lower rib 112 of the lower body 110b. As the lock lever 110a rotates about the pivot shaft 115, the locking hook 114 may be caught on the upper hook 117 of the upper body 110c. Accordingly, the cover 20 may be fixed to the base 10.

Figure 54:
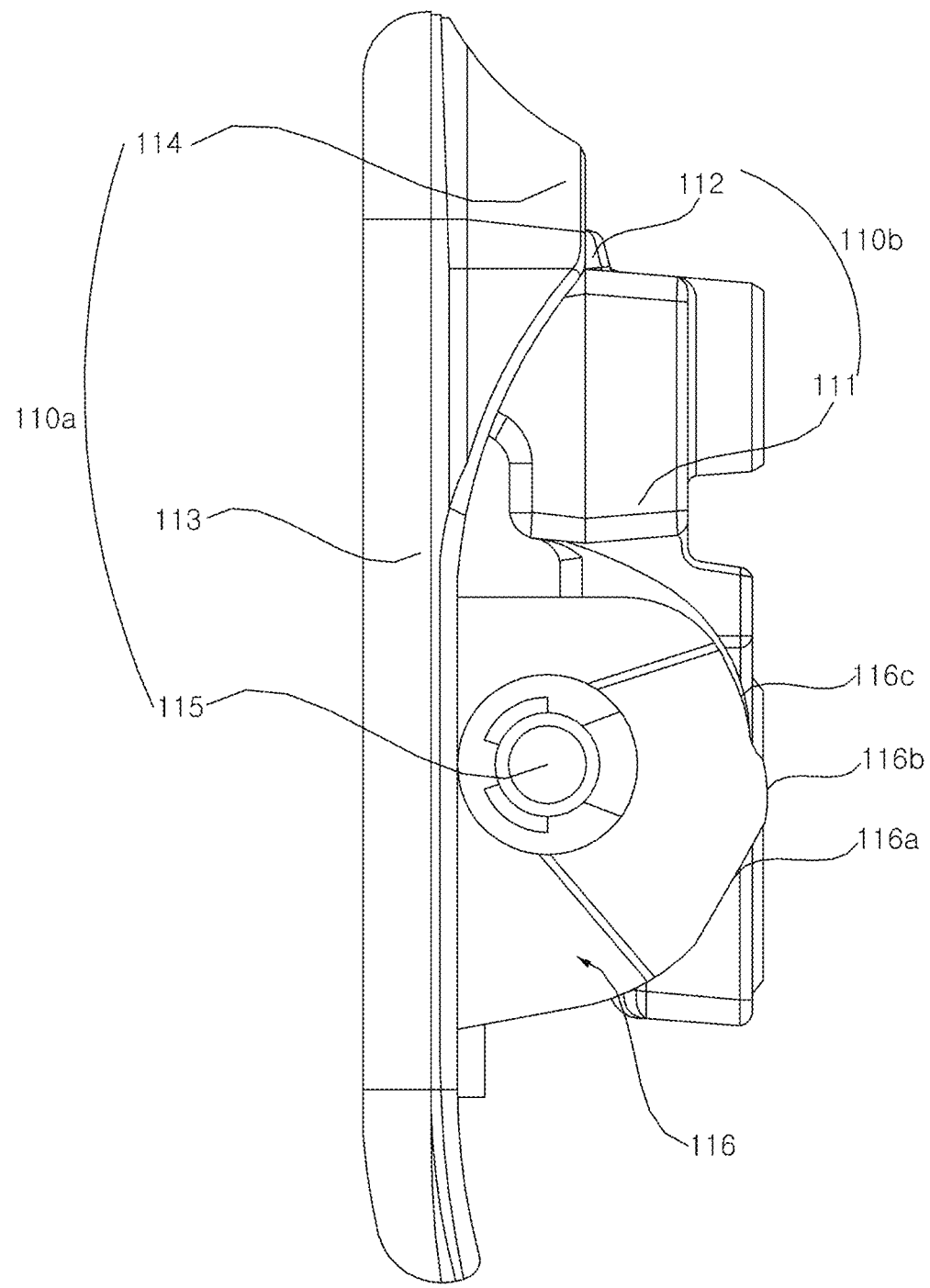
Figure 55:
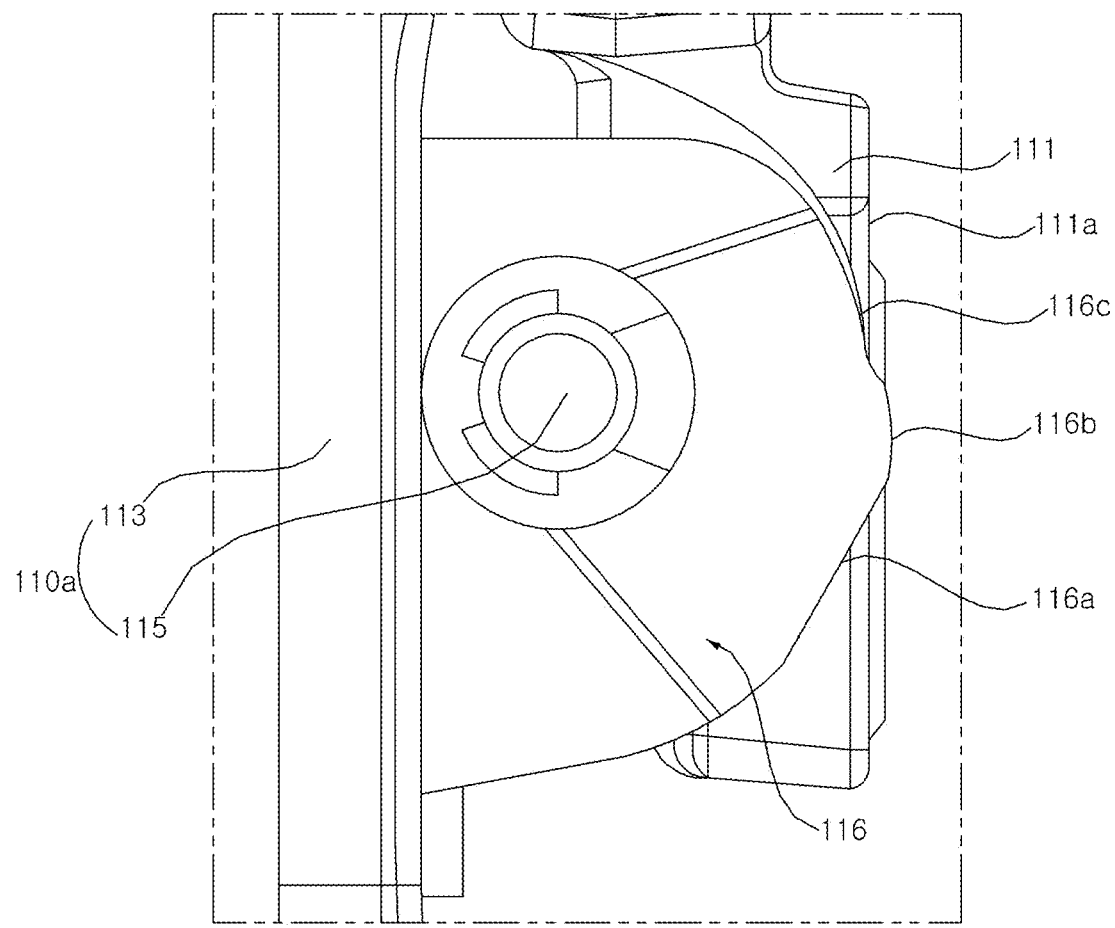

Referring to FIGS. 54 and 55, the lock lever 110a may include a cam 116. The cam 116 may be provided on the lever body 113 around the pivot shaft 115. The cam 116 may include a first part 116a, a second part 116b, and a third part 116c. The first part 116a may define a linear surface. The second part 116b may extend from the first part 116a and may define a curved surface. The third part 116c may extend from the second part 116b and may define a curved surface that forms an inflection point with the second part 116b. The second part 116b may protrude outward relative to the first part 116a and/or the third part 116c.

The fixing portion 111 of the lower body 110b may define a linear surface 111a. As the lever body 113 rotates, the cam 116 may protrude to an outside of the linear surface 111a of the lower body 110b. When the lever body 113 rotates counterclockwise with respect to the pivot shaft 115, the first part 116a of the cam 116 may be aligned with the linear surface 111a of the fixing portion 111 of the lower body 110b. When the lever body 113 rotates clockwise with respect to the pivot shaft 115, the second part 116b of the cam 116 may protrude outward relative to the linear surface 111a of the fixing portion 111 of the lower body 110b. The second part 116b of the cam 116 may be in close contact with an outer surface of the bottom 11 of the base 10 (see FIG. 53). Accordingly, in a state where the upper body 110c and the lower body 110b are engaged with each other, the lock lever 110a may be fixed without rotating, pivoting, or tilting with respect to the lower body 110b.

Figure 56:
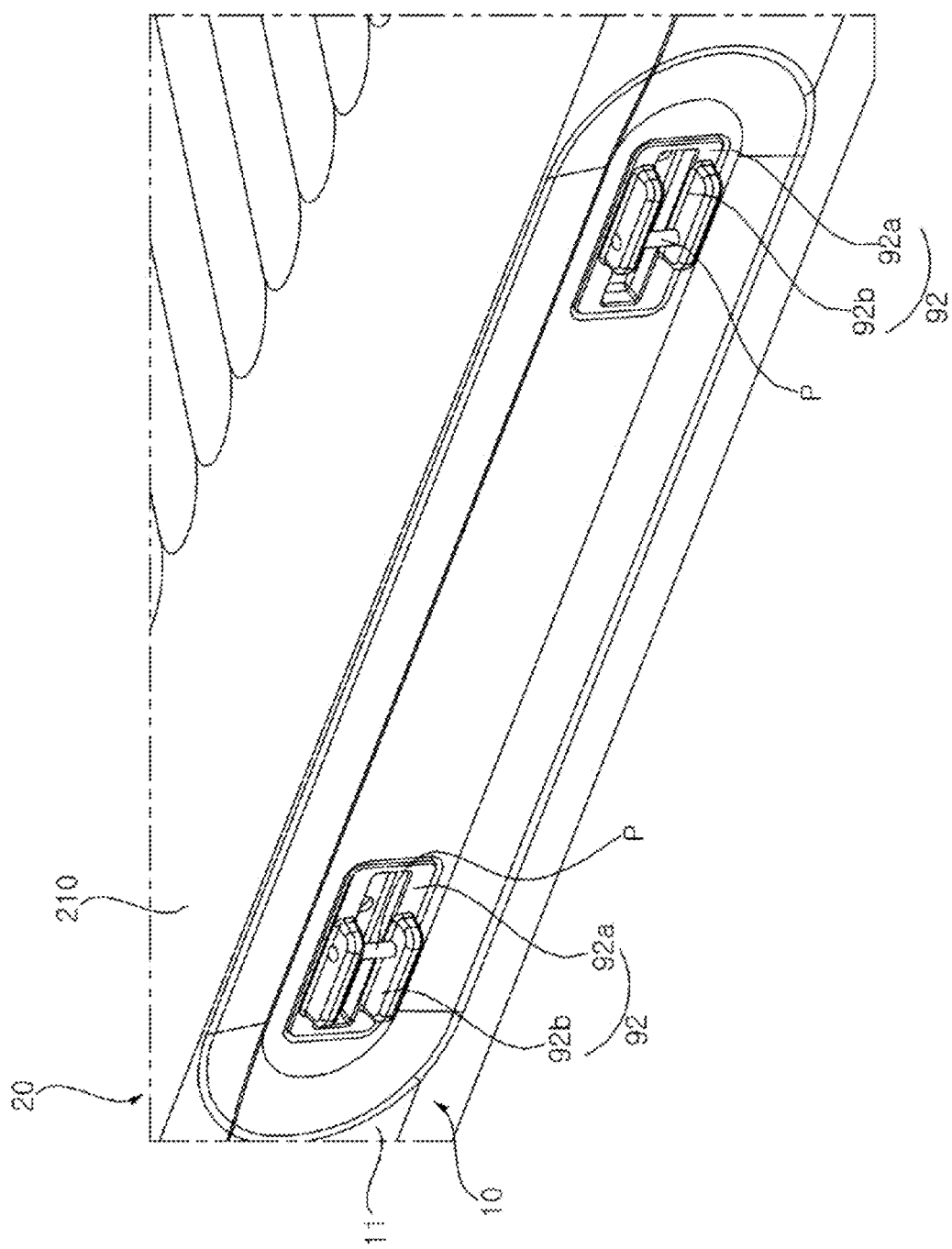
Figure 57:
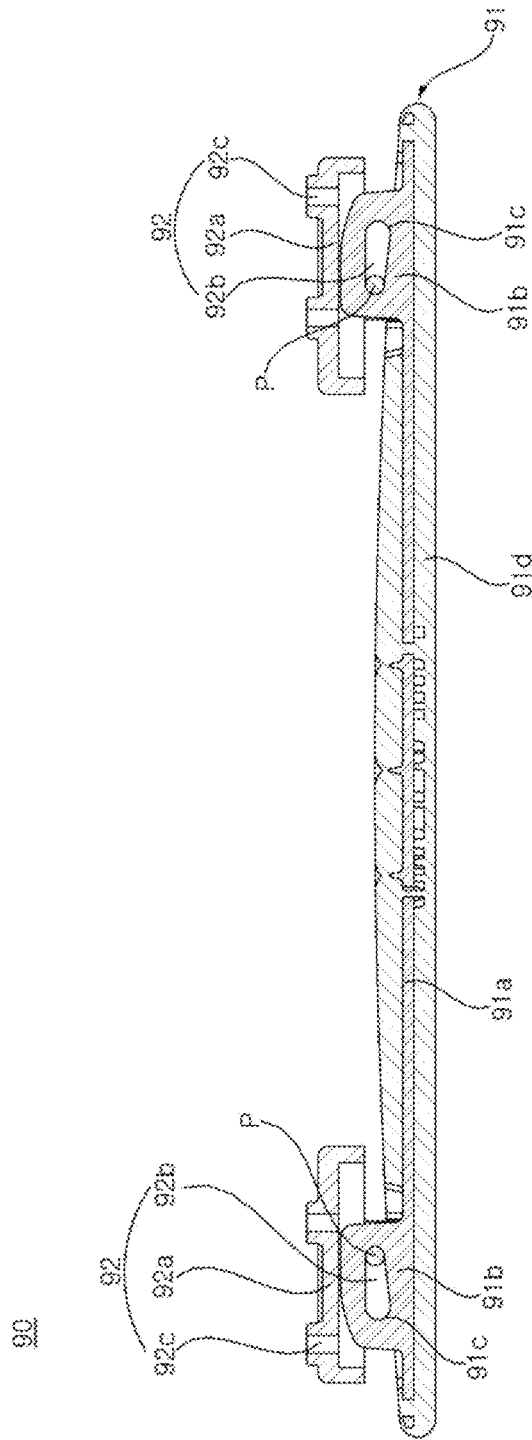
Figure 58:
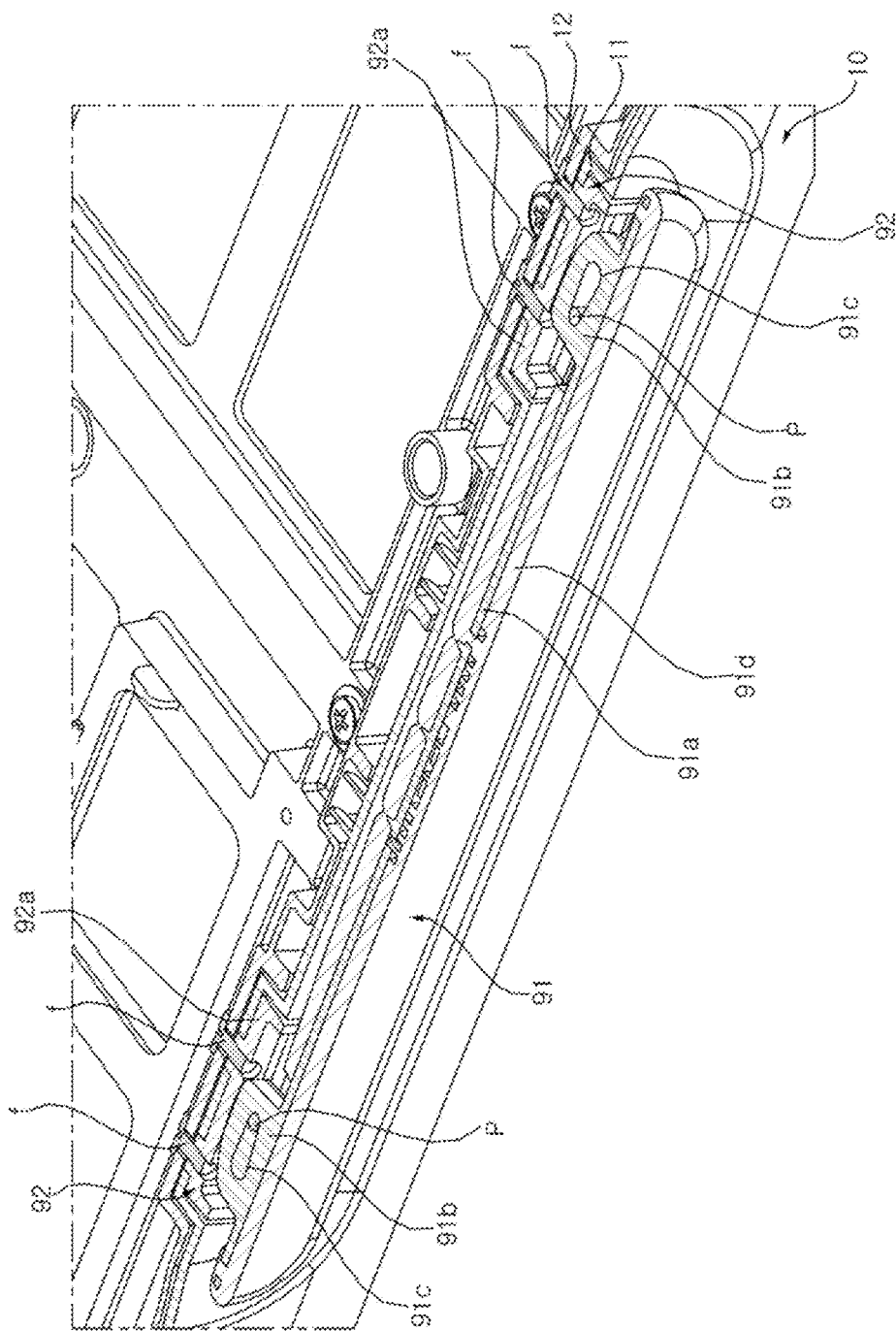

Referring to FIGS. 56 to 58, a handle unit 90 may be mounted to the base 10 or the cover 20. The handle unit 90 may be referred to as a handle assembly 90 or a handle set 90. The handle unit 90 may include a fixing segment 92 and a handle 91.

The fixing segment 92 may include a mount body 92a, a pin mount 92b, and a pin P. The mount body 92a may be positioned on an outer surface of the bottom 11 of the base 10, and may be fixed to the frame 12 by a fastening member f. A plurality of pin mounts 92b may protrude outward of the mount body 92a in parallel manner. The pin P may be positioned by passing through the pair of pin mounts 92b.

The handle 91 may include a core (91a, 91b, 91c) and a skin 91d. The core (91a, 91b, 91c) may include a strap 91a, a strap end 91b, and a pin hole 91c. The strap 91a may be elongated and may consist of a plurality of parts. The plurality of parts may be isolated from each other. A plurality of strap ends 91b may be provided, and the plurality of strap ends 91b may be formed at opposite ends of the strap 91a. The strap end 91b may protrude from the strap 91a toward the fixing segment 92. The pin hole 91c may be formed through the strap end 91b. The pin hole 91c may be elongated. The skin 91d may cover an outer surface of the core (91a, 91b, 91c). For example, the core (91a, 91b, 91c) and the skin 91d may be integrally formed by heterogeneous injection molding. For example, the core (91a, 91b, 91c) may have a higher tensile strength than the skin 91d. The handle 91 may be coupled to the fixing segment 92. The pin P of the fixing segment 92 may be inserted into the pin hole 91c of the handle 91.

Referring to FIGS. 1 to 58, there is provided a display device including: a display module including a display panel; an arm having an upper arm that is coupled to a rear of the display module and a lower arm that is hinge-connected to the upper arm; a bottom case to which the lower arm is pivotally connected; and a top case hinge-connected to the bottom case.

The lower arm may include: a lower inner frame that is hinge-connected to the bottom case; and a lower outer cover that covers the lower inner frame and defines an outer appearance of the lower arm. The upper arm may include: an upper inner frame that is hinge-connected to the lower inner frame; and an upper outer cover that covers the upper inner frame and defines an outer appearance of the upper arm. The lower outer cover may include a storage groove formed as an outer surface of the lower outer cover is recessed and in which the upper arm is received when folded.

The bottom case may include: an outer shell that defines an accommodation space and defines an outer appearance of the bottom case; and a frame that is disposed in the accommodation space and coupled to an inside of the outer shell. The arm may further include a bottom mount that is coupled to the frame of the bottom case.

The lower inner frame may include: a lower part that is pivotally connected to the bottom mount; and an upper part that extends from the lower part and is hinge-connected to the upper inner frame. The lower part may include a wiring groove that is recessed inward in an elongated manner. The wiring groove may extend from the bottom mount toward the upper part in a manner of being bent and extending to a lateral side of the lower part while being adjacent to the upper part.

The lower inner frame may include: a lower part that is pivotally connected to the bottom mount; an upper part that extends from the lower part and is hinge-connected to the upper inner frame. The upper part may include: a first connecting portion that is hinge-connected to the upper inner frame; and a second connecting portion that is disposed opposite the first connecting portion with respect to the hinge, the second connecting portion being spaced apart from the hinge. The second connecting portion may include: a holder mount; and a finger that is bent and extends from one side of the holder mount.

A cable holder that is coupled to the second connecting portion may be further provided. The cable holder may include: a mounting block that is coupled to the holder mount; and a holder tip that is bent and extends from one side of the mounting block, the holder tip defining a circle together with the finger.

A cable routed in the arm may be further provided. The cable may extend from the bottom mount, and may be placed in the wiring groove.

A cable routed in the arm may be further provided. The cable may extend long to be placed in the wiring groove, and may be inserted into the circle defined by the holder tip and the finger.

The upper inner frame may include: a rod body that is elongated; an opening that is formed through a portion of the rod body; a first connecting portion that is hinged-connected to the first connecting portion of the lower inner frame; and a second connecting portion that is disposed opposite the first connecting portion, the second connecting portion having at least a portion of a cylinder shape to be inserted into a circle of the lower inner frame. The cable may be inserted into the second connecting portion, and may extend so as to be inserted into the opening of the rod body.

The cable may be electrically connected to the display panel.

The bottom mount may include: a first piece that is hinge-connected to a first side of the lower inner frame and fixed to the bottom case; and a second piece that is hinge-connected to a second side of the lower inner frame and fixed to the frame of the bottom case. The first piece may be spaced apart from the second piece.

A cable routed in the arm may be further provided. The cable may pass between the first piece and the second piece of the bottom mount.

The display module may be configured to be stored in the bottom case or stand upright from the bottom case when the arm performs a pivoting movement.

An arm hinge may be further provided to connect the first connecting portion of the lower inner frame and the first connecting portion of the upper inner frame. The arm hinge may include: a hinge shaft that is connected to the first connecting portion of the lower inner frame; a hinge cam that is configured to rotate on the hinge shaft and fixed to the first connecting portion of the upper inner frame; and an elastic member that is configured to provide an elastic force to the hinge cam with respect to the hinge shaft.

A link may be further provided to connect the arm hinge and the bottom mount.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the disclosure should be determined by reasonable interpretation of the appended claims, and all changes coming within the equivalency range of the disclosure are intended to be embraced in the scope of the disclosure.

What is claimed is:

1. A display device comprising:
    a bottom case;
    a top case hingedly coupled to the bottom case and including a speaker;
    a display module including a display panel; and
    an arm coupling the display module to the bottom case, wherein the arm comprises:
    a lower arm hingedly coupled to the bottom case;
    an upper arm coupled to a rear of the display module; and
    an arm hinge coupling the lower arm and the upper arm,
    wherein the lower arm comprises:
    a lower first connecting portion to which the arm hinge is coupled; and
    a lower second connecting portion facing the lower first connecting portion and spaced apart from the arm hinge,
    wherein the upper arm comprises:
    an upper first connecting portion coupled to the arm hinge; and
    an upper second connecting portion corresponding to the lower second connecting portion of the lower arm,
    wherein the upper second connecting portion of the upper arm comprises a circular part having an open portion and configured to rotate with respect to the lower second connecting portion of the lower arm,
    wherein a cable electrically connected to the display panel extends along the lower arm and the upper arm, and
    wherein the open portion of the circular part of the upper second connection portion is configured to accommodate the cable extending between the lower arm and the upper arm.

2. The display device of claim 1, wherein the lower arm includes a lower inner frame comprising a first side hingedly coupled to the bottom case and a second side provided with the lower first connecting portion and the lower second connecting portion of the lower arm, and
    wherein the upper arm includes an upper inner frame comprising a first side coupled to the rear of the display module and a second side provided with the upper first connecting portion and the upper second connecting portion of the upper arm.

3. The display device of claim 2, wherein the bottom case comprises:
    an outer shell providing an outer surface of the bottom case; and
    a frame coupled to an inside of the outer shell,
    wherein the arm further comprises a bottom mount fixed to the frame, and
    wherein the first side of the lower inner frame of the lower arm is hingedly coupled to the bottom mount.

4. The display device of claim 2, wherein the arm hinge comprises:
a hinge shaft passing through the lower first connecting portion of the lower inner frame and the upper first connecting portion of the upper inner frame; and
a first elastic member wound around the hinge shaft,
wherein the first elastic member is disposed between an end of the hinge shaft and the upper first connecting portion of the upper inner frame, and
wherein the end of the hinge shaft is positioned between the upper second connecting portion and the first connecting portion of the upper inner frame.

5. The display device of claim 4, wherein the first elastic member includes a first end supported by the hinge shaft and a second end supported by the upper inner frame, such that the arm hinge provides an elastic force to the upper inner frame when the upper inner frame pivots with respect to the lower inner frame.

6. The display device of claim 5, wherein the first end of the first elastic member is positioned adjacent to the end of the hinge shaft.

7. The display device of claim 2, wherein the lower inner frame comprises:
a mounting block fixed to the lower second connecting portion of the lower inner frame; and
a holder tip protruding from the mounting block,
wherein the circular part of the upper second connecting portion rotates with respect to the holder tip.

8. The display device of claim 2, wherein the upper inner frame comprises an elongated opening extending along a longitudinal direction of the upper inner frame, and
wherein the cable is inserted through the opening.

9. The display device of claim 3, wherein the arm further comprises a link connecting the bottom mount and the arm hinge,
wherein the lower inner frame comprises:
a lower part hingedly coupled to the bottom mount; and
an upper part provided with the lower first connecting portion and the lower second connecting portion of the lower arm, and
wherein the cable extends along a first side of the lower inner frame to be opposite to the link that extends along a second side opposite the first side.

10. The display device of claim 9, wherein the cable extends along the first side of the lower inner frame and crosses over through the open portion of the circular part of the upper second connection portion to extend along a center of the upper inner frame.

11. The display device of claim 9, wherein the bottom mount comprises:
a first piece disposed to correspond to the second side of the lower inner frame; and
a second piece disposed to correspond to the first side of the lower inner frame,
wherein the first piece is spaced apart from the second piece, and
wherein the cable is disposed between the first piece and the second piece.

12. The display device of claim 11, wherein the lower inner frame further comprises a recessed wiring groove,
wherein the cable is disposed in the wiring groove between the first piece and the second piece of the bottom mount.

13. The display device of claim 3, wherein the bottom mount comprises:
a first piece disposed at a first side corresponding to the circular part of the upper inner frame; and
a second piece disposed at a second side opposite the first side and corresponding to the arm hinge, and
wherein the first piece and the second piece are separated from each other and each of the first piece and the second piece is fixed to the frame of the bottom case.

14. The display device of claim 13, wherein the first piece of the bottom mount is connected to the lower inner frame by a first hinge,
wherein the second piece of the bottom mount is connected to the lower inner frame by a second hinge, and
wherein the arm further comprises:
a second elastic member disposed at the first hinge; and
a third elastic member disposed at the second hinge.

15. The display device of claim 14, wherein the bottom mount comprises:
a pair of first protrusions protruding from a lower surface of the first piece and disposed opposite each other with respect to the first hinge or the second elastic member; and
a pair of second protrusions protruding from a lower surface of the second piece and disposed opposite each other with respect to the second hinge or the third elastic member.

16. The display device of claim 15, wherein a distance between a front one of the pair of first protrusions and a front one of the pair of second protrusions is greater than a distance between a rear one of the pair of first protrusions and a rear one of the pair of second protrusions.

17. The display device of claim 12, wherein the wiring groove extends between the first piece and the second piece of the bottom mount and curves to extend toward a side of the lower inner frame opposite to the link.

18. The display device of claim 1, wherein the display module is configured to be stored between the top case and the bottom case or be supported upright based on movement of the arm.

19. The display device of claim 2, further comprising:
a lower outer cover covering the lower inner frame and providing an outer appearance of the lower arm; and
an upper outer cover covering the upper inner frame and providing an outer appearance of the upper arm,
wherein the lower outer cover includes a recessed storage groove configured such that the upper arm is accommodated in the storage groove when the upper arm is pivoted with respect to the lower arm.

20. The display device of claim 3, wherein the bottom case further comprises a top plate coupled to the outer shell and covering the frame,
wherein the top plate comprises:
a seating part forming a lower display receiving space configured to receive the display module; and
an arm accommodating portion defined by an opening at the seating part configured to receive the arm when the display device is closed.

21. The display device of claim 20, wherein the top case comprises:
a top outer cover;
a middle frame coupled to an inside of the top outer cover; and
an inner cover covering the middle frame and covering the middle frame, and
wherein the middle frame and the inner cover are configured to define an upper display receiving space configured to receive the display module when the display device is closed.

22. A display device comprising:
a bottom case;

a top case hingedly coupled to the bottom case and including a speaker;
a display module including a display panel;
a cable electrically connected to the display panel; and
an arm coupling the display module to the bottom case, wherein the arm comprises:
an upper arm coupled to a rear of the display module;
a lower arm coupled to the bottom case; and
arm hinge means for coupling the lower arm and the upper arm to allow pivoting movement between the lower arm and the upper arm while securing the cable extending between the lower arm and the upper arm through an open portion of a circular part of the arm hinge means.

* * * * *